US012592734B2

(12) United States Patent
Khoudiakov et al.

(10) Patent No.: US 12,592,734 B2
(45) Date of Patent: Mar. 31, 2026

(54) LOW NOISE BLOCK-DOWNCONVERTER SYSTEM WITH LOCAL OSCILLATOR MODULE

(71) Applicant: Orbital Research Ltd., Burnaby (CA)

(72) Inventors: Serguei Khoudiakov, Hope (CA); Alexei Gouterman, Richmond (CA); Mehdi Rezvani Abkenari, Coquitlam (CA)

(73) Assignee: Orbital Research Ltd., Burnaby (CA)

( * ) Notice: Subject to any disclaimer, the term of this patent is extended or adjusted under 35 U.S.C. 154(b) by 47 days.

(21) Appl. No.: 18/705,931

(22) PCT Filed: Nov. 2, 2022

(86) PCT No.: PCT/CA2022/051624
§ 371 (c)(1),
(2) Date: Apr. 29, 2024

(87) PCT Pub. No.: WO2023/077226
PCT Pub. Date: May 11, 2023

(65) Prior Publication Data
US 2025/0007552 A1 Jan. 2, 2025

Related U.S. Application Data

(60) Provisional application No. 63/274,933, filed on Nov. 2, 2021.

(51) Int. Cl.
*H04B 1/18* (2006.01)
*H03L 7/099* (2006.01)
(52) U.S. Cl.
CPC .............. *H04B 1/18* (2013.01); *H03L 7/099* (2013.01)

(58) Field of Classification Search
CPC ... H04B 1/18; H03L 7/099; H03L 7/23; H02J 50/20; H02J 50/001; H03D 7/00
See application file for complete search history.

(56) References Cited

U.S. PATENT DOCUMENTS 5,448,255 A * 9/1995 Hulett .................... H01Q 1/247
333/204
5,507,025 A * 4/1996 Rodeffer .................. H04N 7/20
455/200.1
(Continued)

FOREIGN PATENT DOCUMENTS

AU 2021359855 A1 * 6/2023 ......... H04B 7/18517
AU 2021359855 A9 * 5/2024 ......... H04B 7/18517
(Continued)

OTHER PUBLICATIONS

C. Vaucher and D. Kasperkovitz, "A wide band tuning system for fully integrated satellite receivers," Proceedings of the 23rd European Solid-State Circuits Conference, Southampton, UK, 1997, pp. 56-59. (Year: 1997).*
(Continued)

*Primary Examiner* — Berhanu Tadese
(74) *Attorney, Agent, or Firm* — Nexus Law Group LLP; Nicholas Toth; Otto Zsigmond

(57) ABSTRACT

A low noise block-downconverter system (LNB system) includes a local oscillator module having first and second phase locked loop circuitry (PLL circuitry) for downconverting an electrical signal to generate a downconverted signal. The first PLL circuitry receives a low-frequency reference signal that is used with an intermediate-frequency oscillator to generate an intermediate-frequency signal. The second PLL circuitry receives and uses the intermediate-frequency signal in conjunction with a high-frequency oscillator, separate from the intermediate-frequency oscillator, to generate a high-frequency signal. The high-frequency signal
(Continued)

is used to downconvert the electrical signal. The signal dynamic range of the first PLL circuitry is higher than the signal dynamic range of the second PLL circuitry, thus achieving improved overall dynamic range for the LNB system. The first PLL circuitry may be a first integrated circuit defining a low phase-noise amplifier. A second integrated circuit may include the second PLL circuitry and the high-frequency oscillator.

19 Claims, 32 Drawing Sheets

(56) References Cited

U.S. PATENT DOCUMENTS

| | | | | |
|---|---|---|---|---|
| 6,424,817 | B1 * | 7/2002 | Hadden | H04H 40/90 |
| | | | | 455/317 |
| 6,968,020 | B1 * | 11/2005 | Jayaraman | H04B 1/18 |
| | | | | 375/376 |
| 7,079,400 | B2 * | 7/2006 | Inamoto | H03F 3/19 |
| | | | | 333/185 |
| 7,082,169 | B2 * | 7/2006 | Rozenblit | H03C 5/00 |
| | | | | 375/302 |
| 7,091,759 | B2 * | 8/2006 | Sowlati | H03L 7/0893 |
| | | | | 327/156 |
| 7,138,839 | B2 * | 11/2006 | Zachan | H03L 7/093 |
| | | | | 331/16 |
| 7,256,629 | B2 * | 8/2007 | Zachan | H03L 7/093 |
| | | | | 327/147 |
| 7,319,850 | B2 * | 1/2008 | Motoyama | H04B 1/28 |
| | | | | 455/296 |
| 7,355,463 | B2 * | 4/2008 | Sowlati | H03L 7/0893 |
| | | | | 327/558 |
| 7,564,928 | B2 * | 7/2009 | Jayaraman | H04B 1/28 |
| | | | | 375/376 |
| 7,576,614 | B2 * | 8/2009 | Zachan | H03L 7/093 |
| | | | | 327/156 |
| 8,102,196 | B1 | 1/2012 | Zhang | |
| 8,351,796 | B2 * | 1/2013 | Wang | H04H 40/90 |
| | | | | 398/163 |
| 8,355,470 | B1 * | 1/2013 | Mason | H03D 3/009 |
| | | | | 369/13.31 |
| 8,725,104 | B2 * | 5/2014 | Ling | H03M 1/1205 |
| | | | | 455/189.1 |
| 8,818,319 | B2 * | 8/2014 | Alderton | H05K 1/0225 |
| | | | | 361/753 |
| 9,042,851 | B2 * | 5/2015 | Ling | H04N 7/20 |
| | | | | 455/189.1 |
| 9,571,885 | B2 * | 2/2017 | Ling | H04N 21/43615 |
| 9,859,926 | B2 * | 1/2018 | Shah | H04B 1/006 |
| 9,893,743 | B2 * | 2/2018 | Adamski | H04B 1/18 |
| 10,153,790 | B2 * | 12/2018 | Shah | H04L 7/033 |
| 10,244,283 | B2 * | 3/2019 | Ling | H04H 40/90 |
| 10,326,689 | B2 * | 6/2019 | Liu | H04W 28/0226 |
| 10,374,558 | B1 * | 8/2019 | Kuo | H03G 3/3042 |
| 10,439,575 | B1 * | 10/2019 | Kuo | H03F 3/265 |
| 10,541,742 | B1 * | 1/2020 | Andrade | H04B 1/006 |
| 11,923,962 | B2 * | 3/2024 | Blatt | H04B 7/19 |
| 12,132,512 | B2 * | 10/2024 | Huang | H01F 38/04 |
| 2003/0083034 | A1 * | 5/2003 | Motoyama | H03H 7/1766 |
| | | | | 455/296 |
| 2004/0017858 | A1 * | 1/2004 | Rozenblit | H03C 3/0966 |
| | | | | 375/295 |
| 2005/0258907 | A1 * | 11/2005 | Zachan | H03L 7/0898 |
| | | | | 331/16 |
| 2005/0264369 | A1 * | 12/2005 | Sowlati | H03L 7/0893 |
| | | | | 331/17 |
| 2006/0158235 | A1 * | 7/2006 | Zachan | H03L 7/093 |
| | | | | 327/156 |
| 2006/0208778 | A1 * | 9/2006 | Sowlati | H03L 7/0893 |
| | | | | 327/157 |
| 2007/0247200 | A1 * | 10/2007 | Zachan | H03L 7/187 |
| | | | | 327/156 |

| | | | | |
|---|---|---|---|---|
| 2011/0283330 | A1 * | 11/2011 | Wang | H04B 1/18 |
| | | | | 725/69 |
| 2013/0293322 | A1 * | 11/2013 | Alderton | H01P 3/121 |
| | | | | 361/752 |
| 2017/0302302 | A1 * | 10/2017 | Adamski | H04B 1/006 |
| 2022/0311508 | A1 * | 9/2022 | Kim | H04B 7/18528 |
| 2023/0283317 | A1 * | 9/2023 | Huang | H03D 7/1458 |
| | | | | 455/552.1 |
| 2023/0291466 | A1 * | 9/2023 | Blatt | H04B 7/19 |
| 2025/0007552 | A1 * | 1/2025 | Khoudiakov | H02J 50/001 |

FOREIGN PATENT DOCUMENTS

| | | | | | |
|---|---|---|---|---|---|
| BR | 112023007074 | B1 * | 8/2025 | | |
| CA | 3100605 | A1 * | 11/2019 | | H03F 3/265 |
| CA | 3100605 | C * | 5/2023 | | H03F 3/213 |
| CA | 3236663 | A1 * | 5/2023 | | H03L 7/23 |
| CN | 1220059 | A * | 6/1999 | | H03J 5/0281 |
| CN | 1361943 | A * | 7/2002 | | H04N 7/20 |
| CN | 1105417 | C * | 4/2003 | | H03J 5/0281 |
| CN | 1210866 | C * | 7/2005 | | H03J 5/0281 |
| CN | 2792022 | Y * | 6/2006 | | |
| CN | 101137020 | A * | 3/2008 | | H04N 21/42638 |
| CN | 102255659 | A * | 11/2011 | | |
| CN | 202221995 | U * | 5/2012 | | |
| CN | 202308251 | U * | 7/2012 | | |
| CN | 202455340 | U * | 9/2012 | | |
| CN | 103001585 | A * | 3/2013 | | H04H 40/90 |
| CN | 102625062 | B * | 10/2014 | | |
| EP | 0523770 | A1 * | 1/1993 | | H03D 9/0641 |
| EP | 0860965 | A2 | 8/1998 | | |
| EP | 0523770 | B1 * | 9/1999 | | H01Q 21/245 |
| EP | 3163776 | A1 * | 5/2017 | | H04H 40/90 |
| EP | 3236600 | A1 * | 10/2017 | | H04H 60/90 |
| EP | 4218158 | B1 * | 6/2025 | | H04B 7/19 |
| FR | 3018971 | A1 * | 9/2015 | | H03L 7/087 |
| GB | 2540002 | A | 1/2017 | | |
| JP | 2004159283 | A * | 6/2004 | | H04B 7/14 |
| JP | 2013258622 | A * | 12/2013 | | H03K 21/00 |
| KR | 20180107012 | A * | 10/2018 | | H02J 50/40 |
| KR | 20210011022 | A * | 1/2021 | | H03F 3/195 |
| KR | 20240152919 | A * | 10/2024 | | H03B 19/14 |
| TW | M261921 | U * | 4/2005 | | |
| TW | I407718 | B * | 9/2013 | | H04N 7/20 |
| TW | 201412051 | A * | 3/2014 | | H03K 21/00 |
| TW | I594596 | B * | 8/2017 | | H03K 21/00 |
| TW | 202007094 | A * | 2/2020 | | H04L 27/362 |
| WO | WO-9512953 | A1 * | 5/1995 | | H04B 1/26 |
| WO | WO-2005117264 | A2 * | 12/2005 | | H03L 7/099 |
| WO | WO-2019226694 | A1 * | 11/2019 | | H03F 3/265 |
| WO | WO-2022082026 | A1 * | 4/2022 | | H04B 7/19 |
| WO | WO-2022212255 | A1 * | 10/2022 | | H04B 7/18528 |
| WO | WO-2023077226 | A2 * | 5/2023 | | H03L 7/23 |
| WO | WO-2023166385 | A1 * | 9/2023 | | H04B 1/408 |

OTHER PUBLICATIONS

A. Maxim, M. Gheorghe and C. Turinici, "Notice of Violation of IEEE Publication Principles: 9.75/10.6GHz SiGe PLL for LNB Satellite Front-Ends Using Half-Rate Oscillators," 2006 Symposium on VLSI Circuits, 2006. Digest of Technical Papers., Honolulu, HI, USA, 2006, pp. 41-42, (Year: 2006).*

Voucher Cicero, Architecture for RF Frequency Synthesizers, Kluwer Academic Publishers, 2002-2003 (Year: 2002).*

Vaucher C et al.: "A wide band tuning system for fully integrated satellite receivers", Solid-State Circuits Conference, 1997. ESSCIRC '97. Proceedings of the 23rd European, IEEE, Sep. 16, 1997 (Sep. 16, 1997), pp. 56-59, XP032149981.

Johan D Van Der Tang et al.: "A Low-Phase-Noise Reference Oscillator with Integrated pMOS Varactors for Digital Satellite Receivers", IEEE Journal of Solid-State Circuits, IEEE, USA, vol. 35, No. 8, Aug. 1, 2000 (Aug. 1, 2000), XP011061313, ISSN: 0018-9200.

Friis H T: "Noise Figures of Radio Receivers", Jul. 31, 1944 (Jul. 31, 1944), pp. 419-422, XP093276049, Proceedings of the IRE ( vol. 32, Issue: 7, Jul. 1944) DOI: 10.1109/JRPROC.1944.

(56) References Cited

OTHER PUBLICATIONS

232049, Retrieved from the Internet: URL:https://ieeexplore.IEEE. org/stamp/stamp.jsp?tp=&arnumber=1695024.

Anonymous: "Friis formulas for noise—Wikipedia", Jan. 20, 2018 (Jan. 20, 2018), pp. 1-2, XP093276050, Retrieved from the Internet: URL:https://en.wikipedia.org/w/index.php?title=Friis_formulas_for_noise&oldid=821487487.

Ul Haq Zia et al.: "A novel dual PLL if block for on-board LEO satellite receivers", 2017 Fifth International Conference On Aerospace Science & Engineering (ICASE), IEEE, Nov. 14, 2017 (Nov. 14, 2017), pp. 1-5, XP033354158, DOI: 10.1109/ICASE.2017. 8374286 [retrieved on Jun. 6, 2018].

* cited by examiner

FILTER BANK

600

600

FILTER BANK

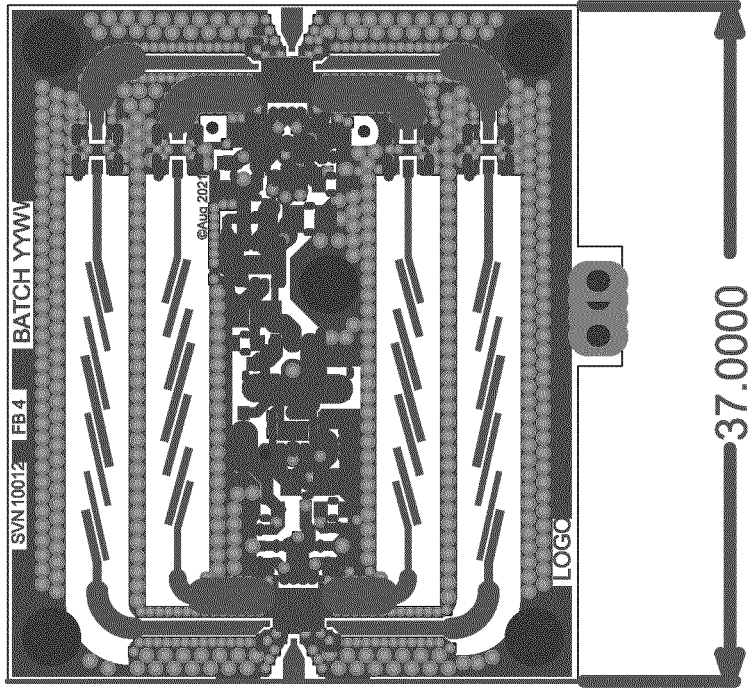
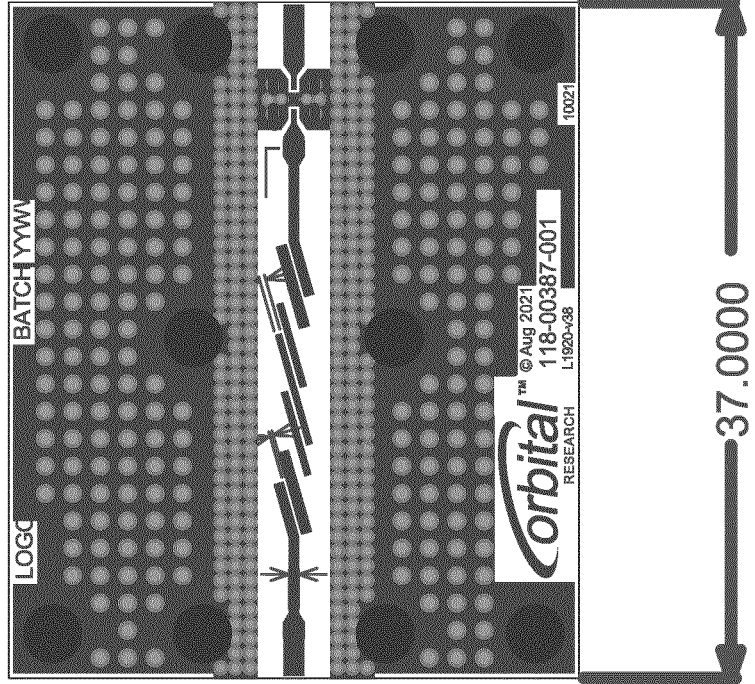
FIG. 9

1800

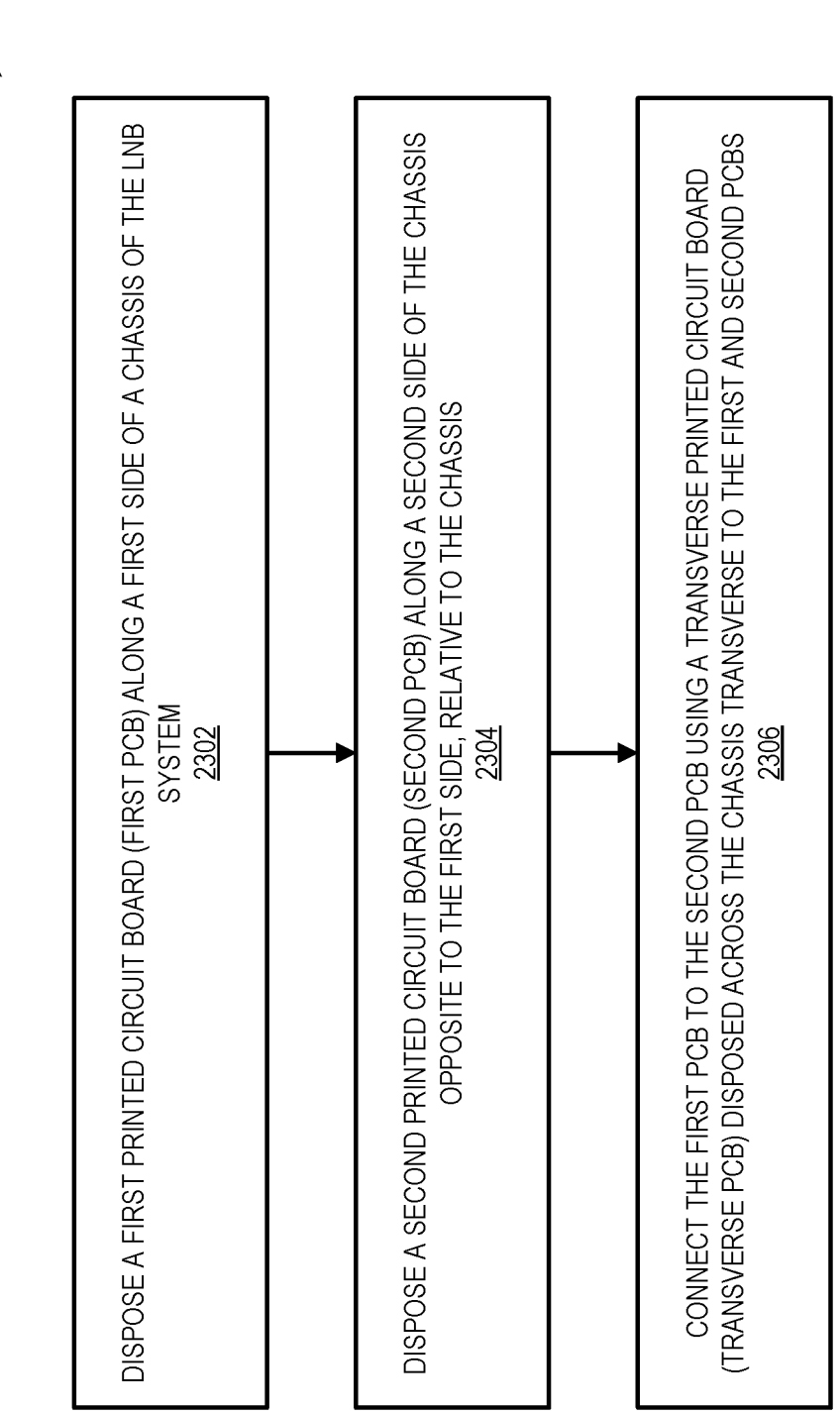

2300

DISPOSE A FIRST PRINTED CIRCUIT BOARD (FIRST PCB) ALONG A FIRST SIDE OF A CHASSIS OF THE LNB SYSTEM
2302

DISPOSE A SECOND PRINTED CIRCUIT BOARD (SECOND PCB) ALONG A SECOND SIDE OF THE CHASSIS OPPOSITE TO THE FIRST SIDE, RELATIVE TO THE CHASSIS
2304

CONNECT THE FIRST PCB TO THE SECOND PCB USING A TRANSVERSE PRINTED CIRCUIT BOARD (TRANSVERSE PCB) DISPOSED ACROSS THE CHASSIS TRANSVERSE TO THE FIRST AND SECOND PCBS
2306

FIG. 23

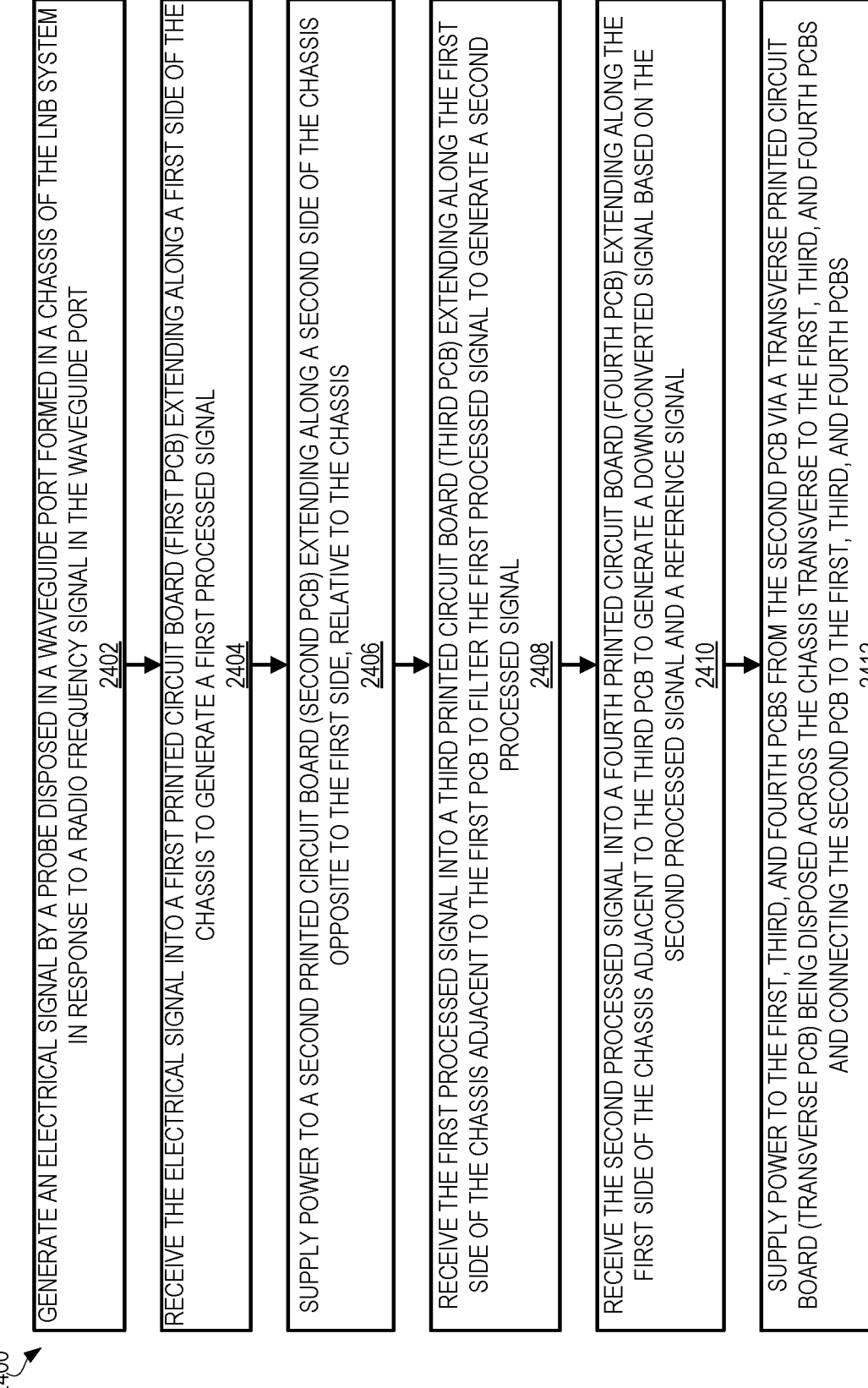

2400

GENERATE AN ELECTRICAL SIGNAL BY A PROBE DISPOSED IN A WAVEGUIDE PORT FORMED IN A CHASSIS OF THE LNB SYSTEM IN RESPONSE TO A RADIO FREQUENCY SIGNAL IN THE WAVEGUIDE PORT
2402

RECEIVE THE ELECTRICAL SIGNAL INTO A FIRST PRINTED CIRCUIT BOARD (FIRST PCB) EXTENDING ALONG A FIRST SIDE OF THE CHASSIS TO GENERATE A FIRST PROCESSED SIGNAL
2404

SUPPLY POWER TO A SECOND PRINTED CIRCUIT BOARD (SECOND PCB) EXTENDING ALONG A SECOND SIDE OF THE CHASSIS OPPOSITE TO THE FIRST SIDE, RELATIVE TO THE CHASSIS
2406

RECEIVE THE FIRST PROCESSED SIGNAL INTO A THIRD PRINTED CIRCUIT BOARD (THIRD PCB) EXTENDING ALONG THE FIRST SIDE OF THE CHASSIS ADJACENT TO THE FIRST PCB TO FILTER THE FIRST PROCESSED SIGNAL TO GENERATE A SECOND PROCESSED SIGNAL
2408

RECEIVE THE SECOND PROCESSED SIGNAL INTO A FOURTH PRINTED CIRCUIT BOARD (FOURTH PCB) EXTENDING ALONG THE FIRST SIDE OF THE CHASSIS ADJACENT TO THE THIRD PCB TO GENERATE A DOWNCONVERTED SIGNAL BASED ON THE SECOND PROCESSED SIGNAL AND A REFERENCE SIGNAL
2410

SUPPLY POWER TO THE FIRST, THIRD, AND FOURTH PCBS FROM THE SECOND PCB VIA A TRANSVERSE PRINTED CIRCUIT BOARD (TRANSVERSE PCB) BEING DISPOSED ACROSS THE CHASSIS TRANSVERSE TO THE FIRST, THIRD, AND FOURTH PCBS AND CONNECTING THE SECOND PCB TO THE FIRST, THIRD, AND FOURTH PCBS
2412

FIG. 24

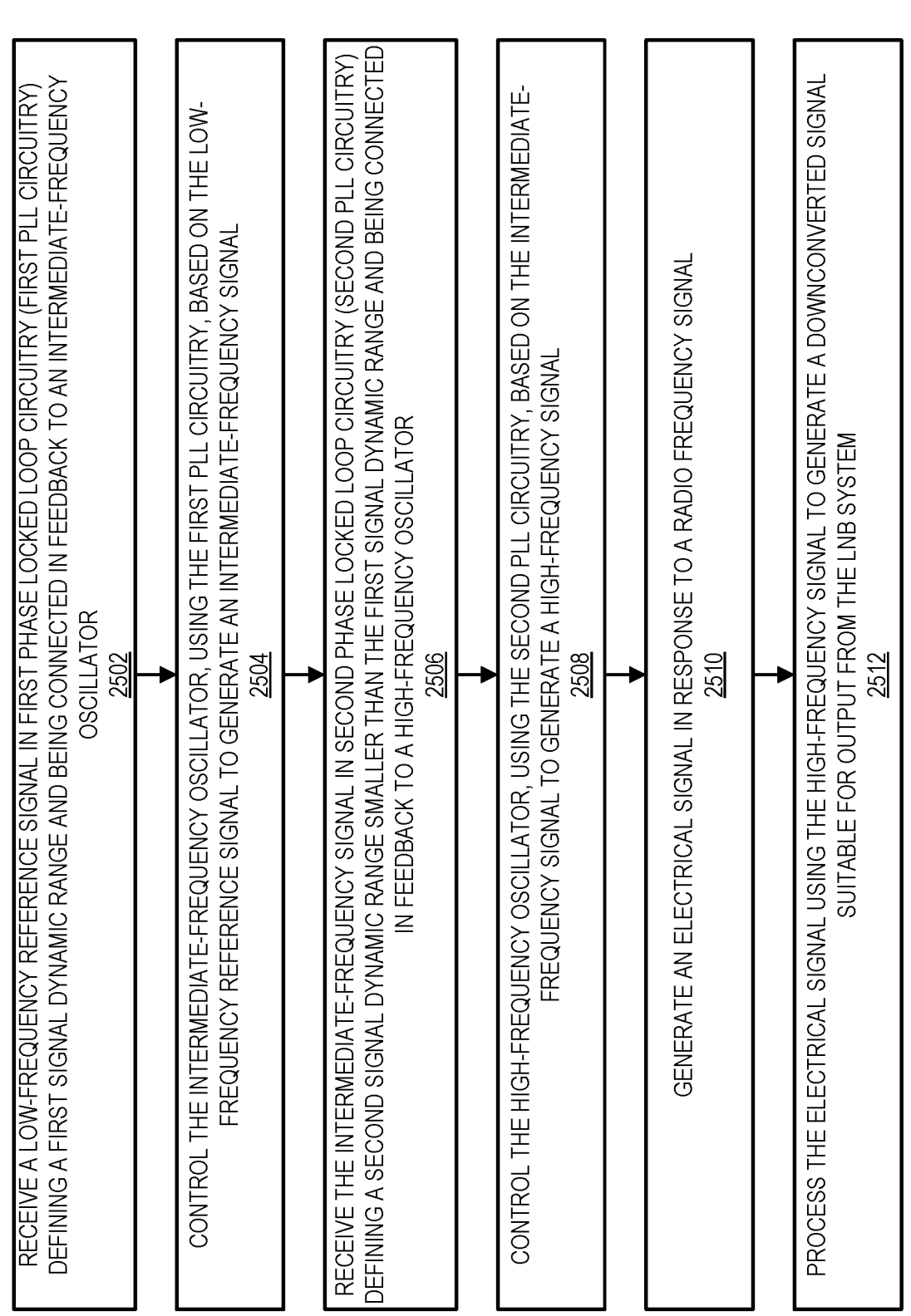

2500

RECEIVE A LOW-FREQUENCY REFERENCE SIGNAL IN FIRST PHASE LOCKED LOOP CIRCUITRY (FIRST PLL CIRCUITRY) DEFINING A FIRST SIGNAL DYNAMIC RANGE AND BEING CONNECTED IN FEEDBACK TO AN INTERMEDIATE-FREQUENCY OSCILLATOR
2502

CONTROL THE INTERMEDIATE-FREQUENCY OSCILLATOR, USING THE FIRST PLL CIRCUITRY, BASED ON THE LOW-FREQUENCY REFERENCE SIGNAL TO GENERATE AN INTERMEDIATE-FREQUENCY SIGNAL
2504

RECEIVE THE INTERMEDIATE-FREQUENCY SIGNAL IN SECOND PHASE LOCKED LOOP CIRCUITRY (SECOND PLL CIRCUITRY) DEFINING A SECOND SIGNAL DYNAMIC RANGE SMALLER THAN THE FIRST SIGNAL DYNAMIC RANGE AND BEING CONNECTED IN FEEDBACK TO A HIGH-FREQUENCY OSCILLATOR
2506

CONTROL THE HIGH-FREQUENCY OSCILLATOR, USING THE SECOND PLL CIRCUITRY, BASED ON THE INTERMEDIATE-FREQUENCY SIGNAL TO GENERATE A HIGH-FREQUENCY SIGNAL
2508

GENERATE AN ELECTRICAL SIGNAL IN RESPONSE TO A RADIO FREQUENCY SIGNAL
2510

PROCESS THE ELECTRICAL SIGNAL USING THE HIGH-FREQUENCY SIGNAL TO GENERATE A DOWNCONVERTED SIGNAL SUITABLE FOR OUTPUT FROM THE LNB SYSTEM
2512

FIG. 25

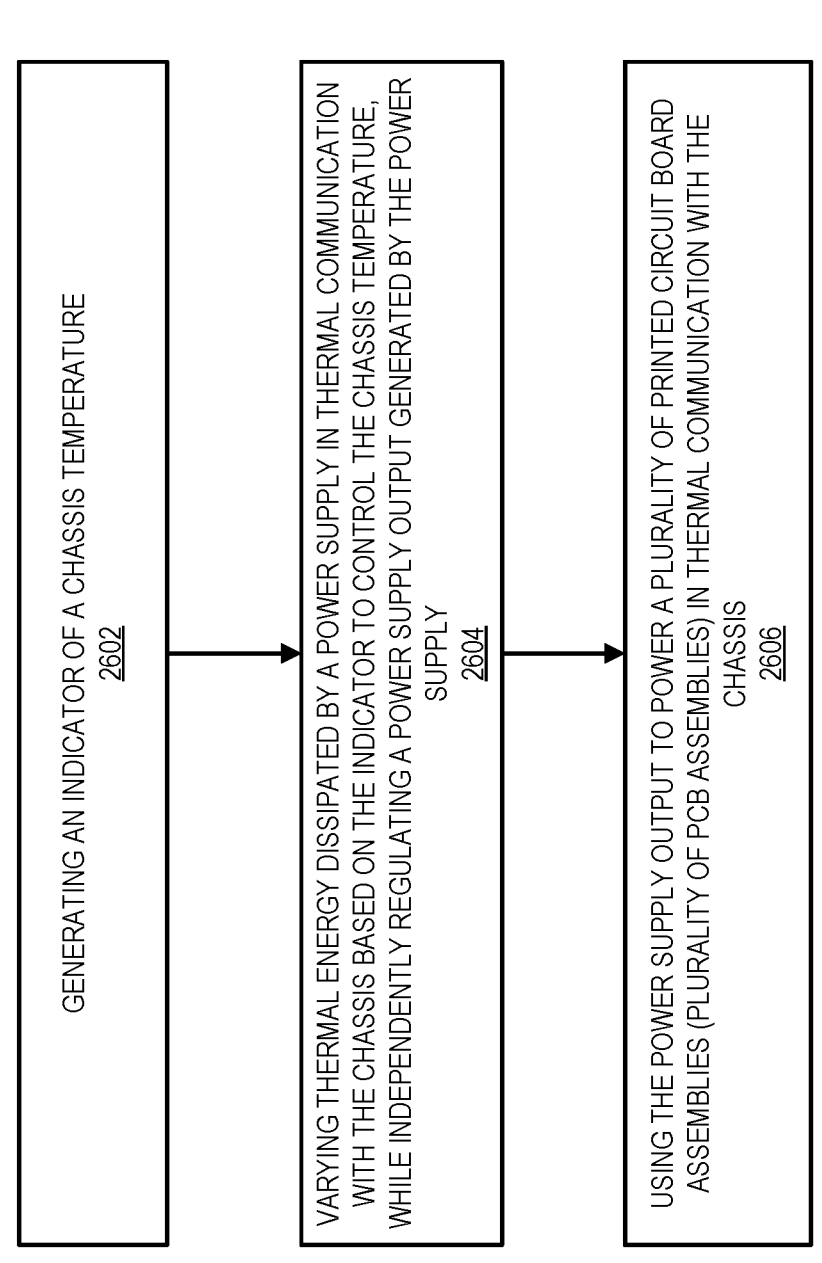

GENERATING AN INDICATOR OF A CHASSIS TEMPERATURE
2602

VARYING THERMAL ENERGY DISSIPATED BY A POWER SUPPLY IN THERMAL COMMUNICATION WITH THE CHASSIS BASED ON THE INDICATOR TO CONTROL THE CHASSIS TEMPERATURE, WHILE INDEPENDENTLY REGULATING A POWER SUPPLY OUTPUT GENERATED BY THE POWER SUPPLY
2604

USING THE POWER SUPPLY OUTPUT TO POWER A PLURALITY OF PRINTED CIRCUIT BOARD ASSEMBLIES (PLURALITY OF PCB ASSEMBLIES) IN THERMAL COMMUNICATION WITH THE CHASSIS
2606

FIG. 26

LOW NOISE BLOCK-DOWNCONVERTER SYSTEM WITH LOCAL OSCILLATOR MODULE

CROSS-REFERENCE TO RELATED APPLICATIONS

This application claims the benefit of U.S. Provisional Application No. 63/274,933 filed on 2 Nov. 2021.

TECHNICAL FIELD

The disclosure relates generally to downconverters for electromagnetic signals, and in particular, downconverters for high frequency satellite communications.

BACKGROUND

Satellite downconverters need to be able to amplify and down-convert a high frequency radio signal having relatively low amplitude. Doing so without corrupting or distorting the signal requires low noise operation. Noise arising from thermal fluctuations, ambient temperatures, resonances in power electronics, and the power supply, all have a detrimental effect on performance of downconverters.

Satellite communications may be carried out over a wide variety of radio frequencies, ranging from 4 GHz to 40 GHz. Existing approaches generally require separate downconverters for the various frequency ranges because of variations in signal strength and the varied demands for noise control that are dependent on the frequency. Each of these separate downconverters may be costly and may require its own specialized equipment and start up time.

The large range of possible signal strengths may also lead to overload conditions as antenna feed systems may not respond sufficiently fast to changes in signal strength.

SUMMARY

In an aspect, the disclosure describes a low noise block-downconverter system (LNB system). The low noise block-downconverter system also includes a chassis forming a waveguide port, and defining a first side and a second side opposite to the first side; a probe disposed in the waveguide port and configured to generate an electrical signal in response to a radio frequency signal in the waveguide port; a plurality of printed circuit board assemblies (plurality of PCB assemblies) surrounding the chassis for processing the electrical signal, including a first printed circuit board (first PCB) extending along the first side of the chassis and operatively connected to the probe, a second printed circuit board (second PCB) extending along the second side of the chassis, and a transverse printed circuit board (transverse PCB) extending across the chassis transverse to the first and second PCBs to connect the first PCB to the second PCB.

In an aspect, the disclosure describes a method of manufacturing a low noise block-downconverter system (LNB system). The method also includes disposing a first printed circuit board (first PCB) along a first side of a chassis of the LNB system; disposing a second printed circuit board (second PCB) along a second side of the chassis opposite to the first side, relative to the chassis; and connecting the first PCB to the second PCB using a transverse printed circuit board (transverse PCB) disposed across the chassis transverse to the first and second PCBs.

In an aspect, the disclosure describes a method of operating a low noise block-downconverter system (LNB system). The method also includes generating an electrical signal by a probe disposed in a waveguide port formed in a chassis of the LNB system in response to a radio frequency signal in the waveguide port; receiving the electrical signal into a first printed circuit board (first PCB) extending along a first side of the chassis to generate a first processed signal; supplying power to a second printed circuit board (second PCB) extending along a second side of the chassis opposite to the first side, relative to the chassis; receiving the first processed signal into a third printed circuit board (third PCB) extending along the first side of the chassis adjacent to the first PCB to filter the first processed signal to generate a second processed signal; receiving the second processed signal into a fourth printed circuit board (fourth PCB) extending along the first side of the chassis adjacent to the third PCB to generate a downconverted signal based on the second processed signal and a reference signal; and supplying power to the first, third, and fourth PCBs from the second PCB via a transverse printed circuit board (transverse PCB) being disposed across the chassis transverse to the first, third, and fourth PCBs and connecting the second PCB to the first, third, and fourth PCBs, the first, second, third, and fourth PCBs part forming a plurality of printed circuit board assemblies (plurality of PCB assemblies) surrounding the chassis and the waveguide port.

In an aspect, the disclosure describes a low noise block-downconverter system (LNB system). The low noise block-downconverter system also includes a local oscillator module configured to generate a high-frequency signal for downconversion, and including first phase locked loop circuitry (first PLL circuitry) configured to receive a low-frequency reference signal and connected in feedback to an intermediate-frequency oscillator so as to control the intermediate-frequency oscillator to generate an intermediate-frequency signal based on the low-frequency reference signal, second phase locked loop circuitry (second PLL circuitry) configured to receive the intermediate-frequency signal and connected in feedback to a high-frequency oscillator, separate from the intermediate-frequency oscillator, so as to control the high-frequency oscillator to generate the high-frequency signal based on the intermediate-frequency reference signal, a signal dynamic range of the first PLL circuitry being higher than the signal dynamic range of the second PLL circuitry. The low noise block-downconverter system also includes low noise processing circuitry configured to receive an electrical signal generated by a probe in response to a radio frequency signal, the low noise processing circuitry configured to process the electrical signal using the high-frequency signal to generate a downconverted signal suitable for output from the LNB system.

In an aspect, the disclosure describes a method of operating a low noise block-downconverter system (LNB system). The method also includes receiving a low-frequency reference signal in first phase locked loop circuitry (first PLL circuitry) defining a first signal dynamic range and being connected in feedback to an intermediate-frequency oscillator; controlling the intermediate-frequency oscillator, using the first PLL circuitry, based on the low-frequency reference signal to generate an intermediate-frequency signal; receiving the intermediate-frequency signal in second phase locked loop circuitry (second PLL circuitry) defining a second signal dynamic range smaller than the first signal dynamic range and being connected in feedback to a high-frequency oscillator; controlling the high-frequency oscillator, using the second PLL circuitry, based on the intermediate-frequency signal to generate a high-frequency signal; generating an electrical signal in response to a radio frequency signal; and processing the electrical signal using the high-frequency signal to generate a downconverted signal suitable for output from the LNB system.

In an aspect, the disclosure describes a printed circuit board assembly (PCB assembly) defining a local oscillator module for a low noise block-downconverter. The printed circuit board assembly also includes first phase locked loop circuitry (first PLL circuitry) configured to receive a low-frequency reference signal and connected in feedback to an intermediate-frequency oscillator so as to control the inter-mediate-frequency oscillator to generate an intermediate-frequency signal based on the low-frequency reference signal; and second phase locked loop circuitry (second PLL circuitry) configured to receive the intermediate-frequency signal and connected in feedback to a high-frequency oscil-lator, separate from the intermediate-frequency oscillator, so as to control the high-frequency oscillator to generate the high-frequency signal based on the intermediate-frequency reference signal, a signal dynamic range of the first PLL circuitry being higher than the signal dynamic range of the second PLL circuitry, the high-frequency signal being suit-able for use in low noise processing circuitry of the LNB system to demodulate an electrical signal indicative of a radio frequency signal to generate a downconverted signal.

In an aspect, the disclosure describes a low noise block-downconverter system (LNB system) defining a chassis. The low noise block-downconverter system also includes a printed circuit board assembly (PCB assembly) secured to the chassis; a temperature sensor positioned to generate an indicator of chassis temperature; a power supply connected to the PCB assembly to generate a power supply output that powers the PCB assembly, the power supply being in thermal communication with the chassis; and circuitry con-nected to the temperature sensor and the power supply, the circuitry being configured to control the power supply based on the indicator to vary thermal energy dissipated by the power supply to control the chassis temperature while regulating the power supply output.

The above shortcomings may be addressed by providing, in accordance with one aspect of the invention, an apparatus for downconverting the carrier frequency of a modulated signal. The apparatus includes: (a) a low-noise amplifier disposed on a first printed circuit board (PCB), (b) a filter disposed on a second PCB, (c) a block downconverter circuit disposed on a third PCB, and (d) an enclosure for housing the first, second, and third PCBs. The first PCB may be in electrical communication with the second PCB. The second PCB may be in electrical communication with the third PCB. The low-noise amplifier may be operable to receive the modulated signal. The low-noise amplifier may be operable to produce an amplified signal in response to the modulated signal. The filter may be operable to receive the amplified signal via an electrical connection between the first and second PCBs. The filter may be operable to produce a filtered signal in response to the amplified signal. The block downconverter circuit may be operable to receive the filtered signal via a second electrical connection between the second and third PCBs. The block downconverter circuit may be operable to produce an intermediate-frequency sig-nal in response to the filtered signal. The first PCB may have a first thickness. The second PCB may have a second thickness. The third PCB may have a third thickness. Two or more of the first, second, and third thicknesses may be different from each other. The first PCB may be made of a first material. The second PCB may be made of a second material. The third PCB may be made of a third material. Two or more of the first, second, and third materials may be different from each other.

In accordance with another aspect of the invention, there is provided an apparatus for downconverting the carrier frequency of a modulated signal. The apparatus includes: a selectable filter for producing a filtered signal in response to one of the modulated signals and an amplified signal pro-duced in response to the modulated signal; and (b) a block downconverter circuit for downconverting the filtered sig-nal. The selectable filter may comprise one or more select-able bandpass filters. The selectable filter may comprise one or more selectable attenuators. Each of the one or more selectable bandpass filters may be electrically connected in series with the one or more selectable attenuators, such that selecting one of the selectable bandpass filters selects a corresponding one of the one or more selectable attenuators.

In accordance with another aspect of the invention, there is provided an apparatus for downconverting the carrier frequency of a modulated signal. The apparatus includes a block downconverter circuit comprising: (a) mixer circuit operable to receive a radio-frequency (RF) signal, to receive a local-oscillator (LO) signal, and to produce an intermedi-ate-frequency (IF) signal in response to the RF and LO signals; (b) an attenuator operable to attenuate the IF signal to produce an attenuated signal; and (c) a power sensor operable to sense the electrical power of the attenuated signal, wherein the attenuator is operable to adjust attenu-ation of the IF signal in response to the electrical power. The apparatus may be operable to amplify the IF signal. The apparatus may be operable to amplify the attenuated signal prior to sensing the electrical power. The attenuator may be a digitally controlled attenuator. The power sensor may be operable to produce a digital representation of the electrical power. The apparatus may be operable to communicate the digital representation from the power sensor to the attenu-ator. The apparatus may include a micro-processor operable to receive the digital representation and to communicate a processed digital representation of the electrical power to the attenuator.

In accordance with another aspect of the invention, there is provided an apparatus for downconverting the carrier frequency of a modulated signal. The apparatus includes a power supply for supplying electrical power to components of the apparatus. The power supply may be operable to receive an input supply voltage. The power supply may be operable to produce an output voltage in response to the input supply voltage. The power supply may comprise a switching power supply. The apparatus may comprise a potentiometer for adjusting a switching frequency of the switching power supply. The apparatus may comprise a temperature sensor for sensing a temperature of the appa-ratus. The apparatus may comprise a temperature sensor for sensing an ambient temperature at the apparatus. The appa-ratus may comprise a chassis and the temperature sensor may be operable to sense a temperature of the chassis. The apparatus may be operable to communicate a digital com-mand for adjusting the voltage value of the input supply voltage. The apparatus may comprise a linear regulator for regulating the voltage value of the output voltage. The linear regulator may be operable to receive an output of the switching power supply and to produce the output voltage in response to the output. The linear regulator may be operable to produce the same output voltage in response to variations in the voltage value of the input supply voltage. The apparatus may be operable to communicate the digital command in response to the temperature so as to increase the voltage value of the input supply voltage in response to a low ambient temperature, such that heat produced by the linear regulator is increased in response to the low temperature, thereby heating the apparatus in response to the low temperature.

The apparatus may include a connector. The connector may comprise a body and a center pin projecting from the body. The center pin may be dimensioned for being attached to a printed circuit board (PCB) trace. The center pin may be attached to the PCB trace by soldering. The center pin may have a tip angle of 25 degrees. The center pin may have a tip angle in the range of 20 to 30 degrees. The center pin may have a length of 0.079 inches. The center pin may have a length in the range of 0.070 to 0.090 inches. The length may be an externally exposed projecting-portion length. The connector may be a SMA-type connector. The connector may be a N-type connector.

Embodiments can include combinations of the above features.

Further details of these and other aspects of the subject matter of this application will be apparent from the detailed description included below and the drawings.

DESCRIPTION OF THE DRAWINGS

Reference is now made to the accompanying drawings, in which:

FIG. 9 is a plan view of FBs with varying numbers of filter-attenuator pairs, in accordance with an embodiment:

FIG. 23 is a flowchart of a method of manufacturing an LNB system, in accordance with an embodiment:

FIG. 24 is a flowchart of a method of operating an LNB system, in accordance with an embodiment:

FIG. 25 is a flowchart of a method of operating an LNB system, in accordance with an embodiment; and FIG. 26 is a flowchart of a method of operating an LNB system, in accordance with an embodiment:

DETAILED DESCRIPTION

There is described an apparatus for downconverting the carrier frequency of a modulated signal. The apparatus includes a selectable filter for producing a filtered signal in response to one of the modulated signal and an amplified signal produced in response to the modulated signal; and (b) a block downconverter circuit for downconverting the filtered signal. Auto-level control, ripple control, heating and cooling, and other features may be provided.

Aspects of various embodiments are described in relation to the figures.

Figure 1:
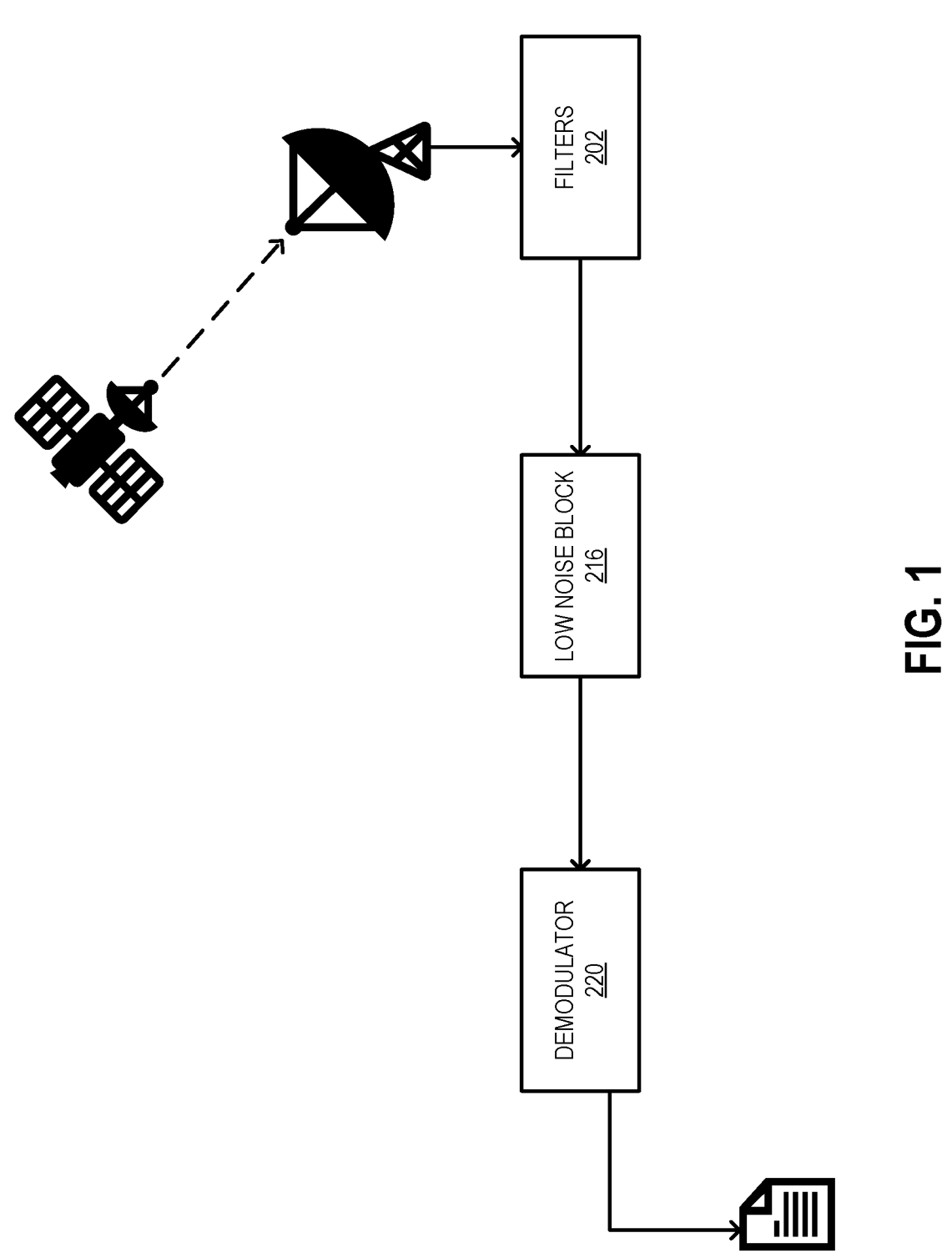
FIG. 1 is a schematic of a receiving system receiving satellite communications from a satellite, in accordance with an embodiment.

FIG. 1 is a schematic of a receiving system receiving satellite communications from a satellite, in accordance with an embodiment.

The communications may comprise electromagnetic signals, e.g. high frequency electromagnetic waves. For example, an L-band may substantially between 1-2 GHZ, S-band between 2-4 GHz, C-band between 4-8 GHZ, X-band between 8-12 GHz, Ku-band between 12-18 GHz, 18-26 between 18-26 GHz, and Ka-band between 26-40 GHz.

The electromagnetic signals received may have relatively low amplitude (weak signals), e.g. in some cases the signals received may be −50 dB.

The signals may be modulated signals, e.g. QPSK or n-QAM modulation, carrying information.

The receiving system may comprise an antenna feed system for receiving the signals. The signals may be filtered, e.g. band-pass filtered, to remove waves with frequencies not relevant for communications or reception. For example, in some embodiments, the filters may filter out frequencies that are not designated from satellite communication. In some embodiments, the filters may filter out frequencies less than 500 MHz and greater than 50 GHz. In some embodiments, the filters may filter out frequencies less than 4 GHz and greater than 40 GHz, i.e. all frequencies lower than C-band frequencies and higher than Ka-band frequencies.

In some embodiments, the antenna feed system may be configured to be used with a variety of different downstream components that may further select waves of frequencies within those band-passed by the filters.

The filtered signals may then be processed in a low noise block-downconverter system (LNB system) to increase their amplitude (increase energy) and shift them into a different frequency band to facilitate downstream handling of the signal. For example, a satellite signal comprising waves with frequencies in the C-band, X-band, Ku-band, and/or Ka-band ranges may be transformed or shifted to waves with frequencies in the L-band range or lower, or even in the S-band range (microwaves).

The LNB system is configured to supply amplification and step down of frequency without causing unacceptably high distortion. For example, without noise-mitigating features in the LNB system, amplification of the signal may amplify noise to such a degree so as to cause effective signal corruption.

In various embodiments, the signals may be supplied to the filters and the LNB system via waveguides (isolators), e.g. to reduce attenuation and noise.

The transformed signals may then be transmitted downstream for further processing, e.g. to a demodulator to demodulate the signal to extract information. In some embodiments, the transformed signal (or the information derived therefrom) may be communicated to a network, e.g. for transmission elsewhere. For example, such a network may be a star network, mesh network, or loopback network.

Figure 2A:
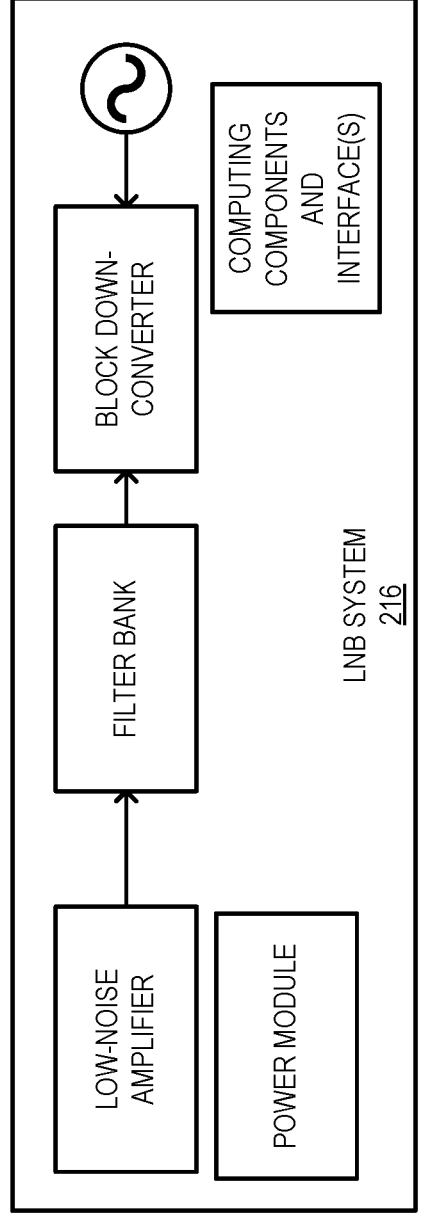
FIG. 2A is a schematic block diagram of a low noise block-downconverter system (LNB system), in accordance with an embodiment.

FIG. 2A is a schematic block diagram of an LNB system 216, in accordance with an embodiment.

Figure 2B:
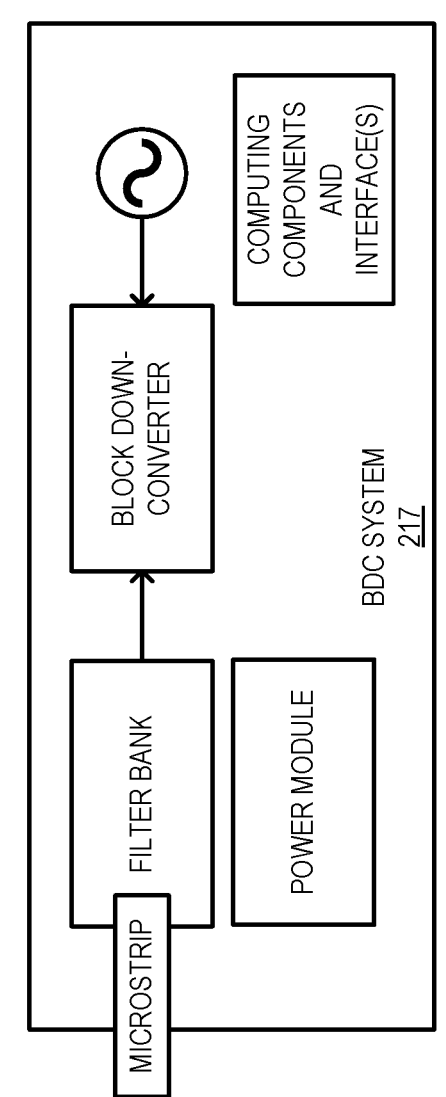
FIG. 2B is a schematic block diagram of a BDC system, in accordance with yet another embodiment.

FIG. 2B is a schematic block diagram of a BDC system 217, in accordance with yet another embodiment.

The LNB system 216 and the BDC system 217 may be examples of satellite communication systems.

In some embodiments, a satellite communication system comprises a low noise amplifier configured to increase signal strength. For example, the low noise amplifier may be coupled to an input port or signal receiving end of the downconverters.

In various embodiments, the low noise amplifier may comprise a FET amplifier (field-effect transistor amplifier, such as a MOSFET amplifier) and a MMIC amplifier (monolithic microwave integrated circuit amplifier) arranged in series. For example, the FET amplifier may have a gain of less than half that of the MMIC amplifier. In some embodiments, the FET amplifier may have a gain of about 10 dB and the MMIC amplifier may have a gain of about 24 dB.

For example, in some embodiments, the noise figure of the low noise amplifier may be below 2 dB or 1 dB. In some embodiments, the noise figure may be below 1.4 dB or may vary between 1.1 and 1.7 for input frequencies between 17 GHz and 22 GHz.

In some embodiments, the low noise amplifier may be external to the LNB system and may coupled thereto via a microstrip.

The low noise amplifier may be coupled to a filter bank.

In some embodiments, the microstrip may be coupled to the filter bank.

The filter bank may be configured to attenuate the signal except for waves with particular frequencies.

In some embodiments, the filter bank may comprise processing circuitry to adapt to the strength of the signal. For example, an X-band signal may have higher amplitude, significantly, than a Ka signal. Therefore, when filtering to retain waves with X-band frequency, the filter bank may attenuate the overall signal to achieve similar signal amplitude as when the filter bank filters to retain waves with frequencies in the Ka-band.

A block downconverter (also referred to as a downconverter or downconverter module, or converter module) may receive filtered, and potentially attenuated signals, from the filter bank. The block downconverter may shift the signal carrier frequency to a lower frequency (intermediate frequency or IF), including by using a mixer coupled to a local oscillator. In some embodiments, after down shifting the frequency, the block downconverter may amplify the signal. In various embodiments, the block downconverter may amplify waves in the intermediate frequency using one or more amplifiers (IF amplifiers).

In some embodiments, the total gain in the LNB system may be between 10-100 dB. For example, the low noise amplifier and the block downconverter may each gain the signal between 10-50 dB, while the filter bank may attenuate the signal by about 10 dB. For example, in an embodiment, the low noise amplifier gain may be about 33 dB, the filter bank loss may be about 10 dB, and the block downconverter gain may be about 42 dB, leading to a total gain in the LNB system of about 65 dB.

The low noise block may further include computing components, e.g. microprocessors, coupled to one or more of the components of the LNB system, and interface components such as a RS-232 module, a RS-485 module, and/or an ethernet module. Further components, such as side boards for interfacing with modules, may be provided.

The LNB system may further comprise a power module for supply low noise power to the LNB system.

The output of the LNB system and/or the block downconverter may be an intermediate frequency signal.

As described later, the LNB system and components thereof may be configured to flexibly operate in wideband, i.e. these may accommodate a variety of operating frequencies.

As referred to herein, "LNB" may refer to the low noise block-downconverter, "BDC" may refer to the block down-converter, "FB" may refer to the filter bank, and "LO" may refer to the local oscillator.

As referred to herein, "FB" may include a straight filter (single filter).

Figure 3:
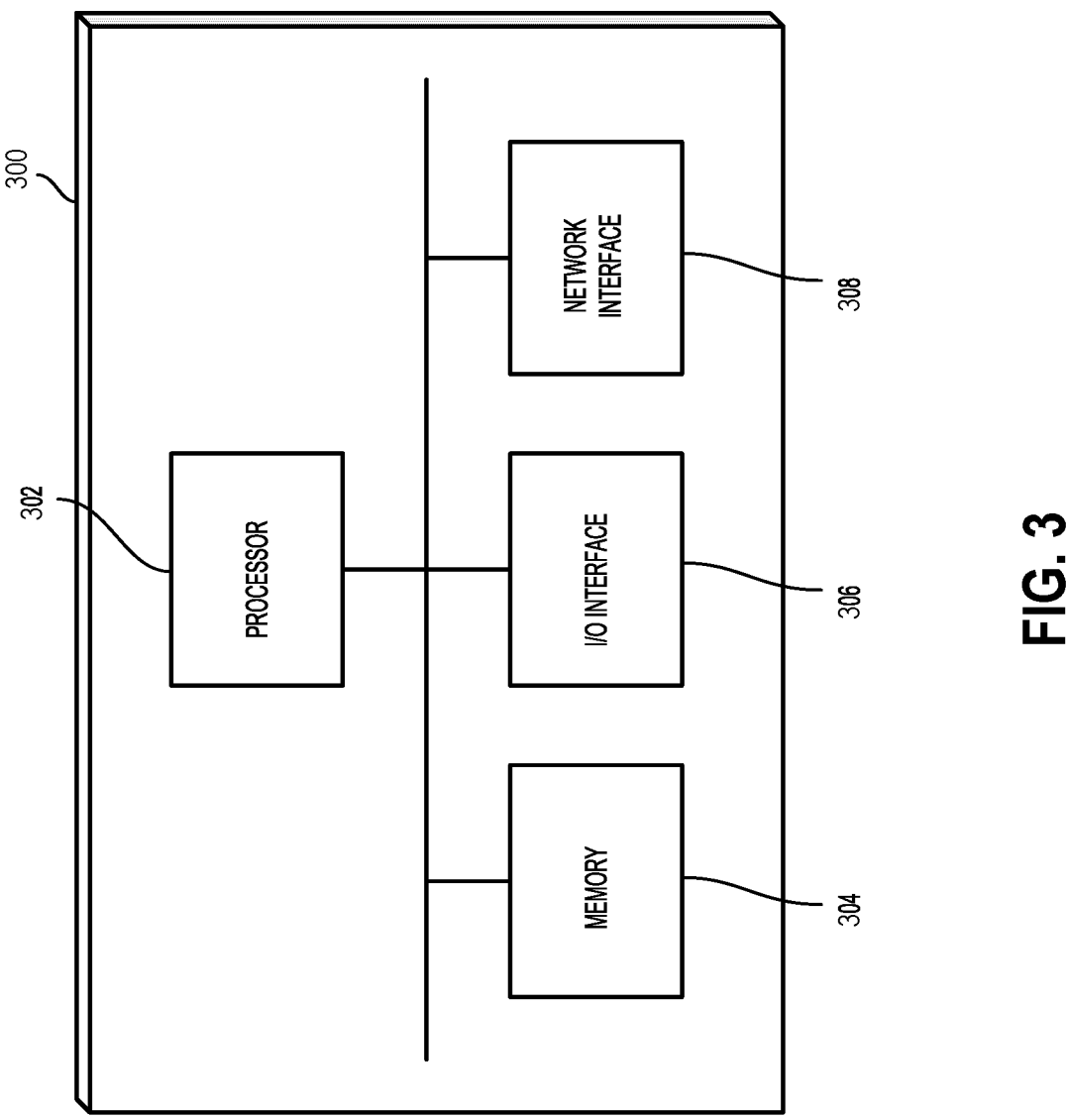
FIG. 3 is schematic block diagram of a module representing computing components and interface, in accordance with an embodiment.

FIG. 3 is schematic block diagram of a module 300 representing computing components and interface, in accordance with an embodiment. For example, the LNB processing circuitry may include the module 300.

The module 300 may include a processor 302, a memory 304, an I/O interface 306, and a network communication interface 308.

The processor 302 may be a microprocessor or micro-controller, a digital signal processing (DSP) processor, an integrated circuit, a field programmable gate array (FPGA), a reconfigurable processor, a programmable read-only memory (PROM), or combinations thereof.

The memory 304 may include a computer memory that is located either internally or externally such as, for example, random-access memory (RAM), read-only memory (ROM), compact disc read-only memory (CDROM), electro-optical memory, magneto-optical memory, erasable programmable read-only memory (EPROM), and electrically-erasable pro-grammable read-only memory (EEPROM), Ferroelectric RAM (FRAM).

The I/O interface 306 may enable the module 400 to interconnect with one or more input devices.

The networking interface 308 may be configured to receive and data, e.g. as data structures (such as vectors and arrays).

The term "connected" or "coupled to" may include both direct coupling (in which two elements that are coupled to each other contact each other) and indirect coupling (in which at least one additional element is located between the two elements).

Figure 4A:
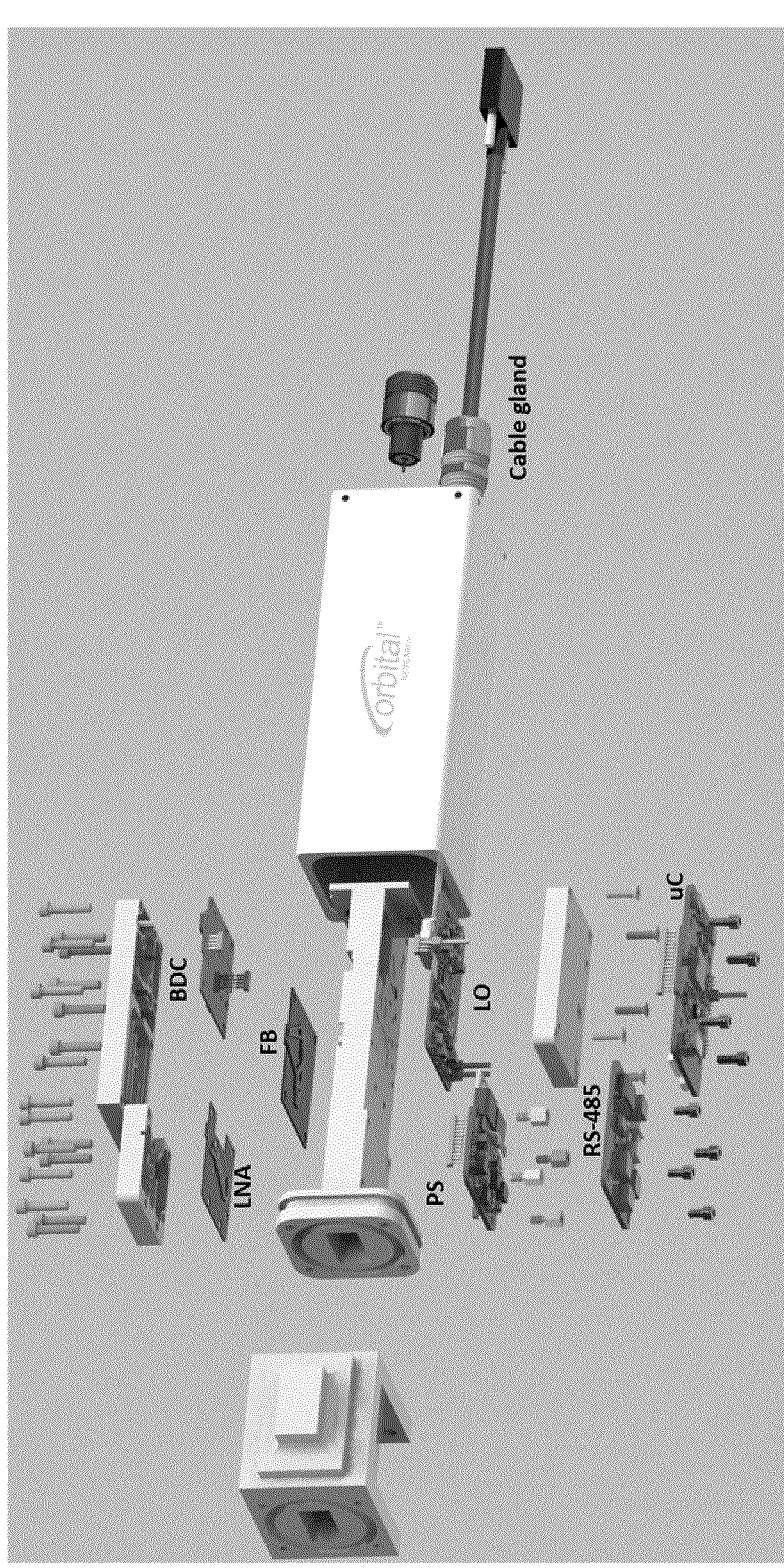
FIG. 4A is a perspective exploded view of an LNB system, in accordance with an embodiment.

FIG. 4A is a perspective exploded view of an LNB system (apparatus for downconverting the carrier frequency of a modulated signal), in accordance with an embodiment.

Figure 4B:
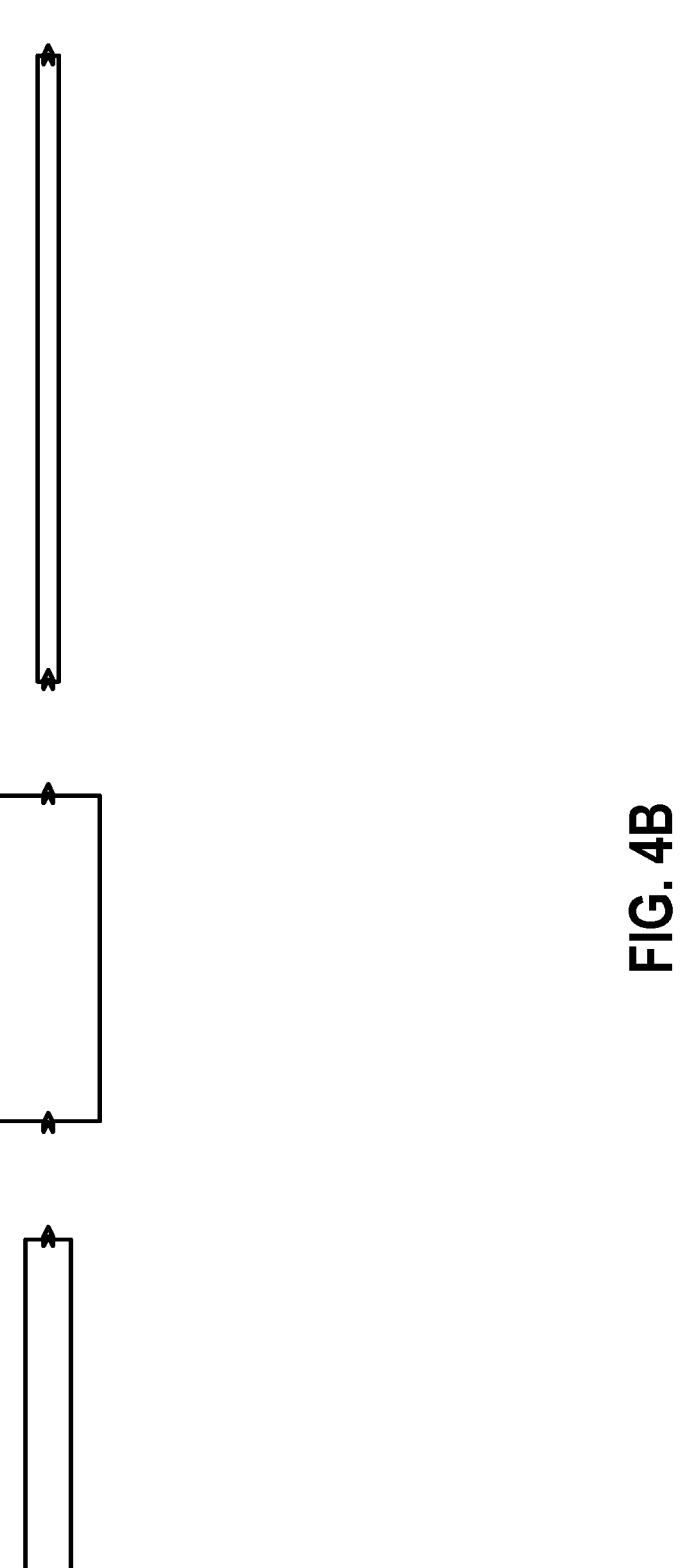
FIG. 4B is a schematic side view of an LNA, a FB, and an BDC of varying thickness and comprising input/output ports that are mutually complementary.

FIG. 4B is a schematic side view of an LNA, a FB, and an BDC of varying thickness and comprising input/output ports that are mutually complementary.

The LNB system may include a built-in LNA, as described earlier. In some embodiments, the LNA may be separate from the LNB system and may be coupled thereto via a microstrip.

The LNA, FB, BDC, power supply (PS), LO may at least partially be implemented via printing on a printed circuit board (PCB).

The LNB system components may be mounted on a chassis of the LNB system. In some embodiments, the chassis may be configured for quick release of the components mounted thereon.

In some embodiment, the FB may be printed on a PCB not integrally formed with and/or in unitary construction with a PCB of the LNA and/or the BDC. As such, the FB may be physically replaced in the chassis, e.g. in case the FB needs to be replaced due to failure.

In some embodiments, the FB may be configured to be replaced with another FB with a different filter arrangement. For example, each FB may be associated with one or more frequencies and/or attenuations. Replacing the FB in the LNB system may allow rapid and cost-effective repurposing of the LNB system to receive satellite signals in different frequency bands. The FB may be interchangeable.

For example, in some embodiments, a FB may be asso-ciated with frequencies in the Ka band while another FB may be associated with frequencies in the Ku band.

In order to prevent noise and signal reflection when the FB is constructed separately from (not in unity with) the LNA and BDC, each component may be configured to match impedance of the other components. FET input impedance matching for broadband performance may be provided.

For example, in some embodiments, the impendence of the LNA circuit may be matched to the impendence of the FB circuit, which may be matched to the impendence of the BDC circuit. In various embodiments, processing circuitry may be configured to match the impedances in such a manner. In some embodiments, the matched impedance may be 50 Ohm.

In some embodiments, each of the LNA, FB, and the BDC, may have separate shields, to allow replacement of a FB without replacing a shield of an LNA and/or a BDC.

In some embodiments, the LNA and the BDC may each be in non-unitary construction and/or non-integrally formed with each other and the FB. For example, these components may comprise output ports configured to removably coupled with input ports. For example, the FB may have an input port configured to removably couple with an output port of the LNA and/or microstrip, and the BDC may have an input port configured to removably couple with an output port of the FB.

For example, an FB may comprise four outer layers; two outermost layers on opposite ends being plating layers, and the layers next to these being the top and bottom layers made of copper. The thickness may be 25 mil.

A plurality of printed circuit boards (PCBs) may be provided that may be configured to removably couple with each other. Each of the PCBs may be constructed of different materials and may have different thicknesses. However, the PCBs may be impedance matched to allow efficient cou-pling.

It is found that using multiple PCBs increases costs but may lead to cost savings by allowing the LNB systems to be used in multiple configurations, i.e. there may be a reduced need for a separate device for each frequency band of interest.

Figures 5A, 5B, 5C, 5D, 5E:
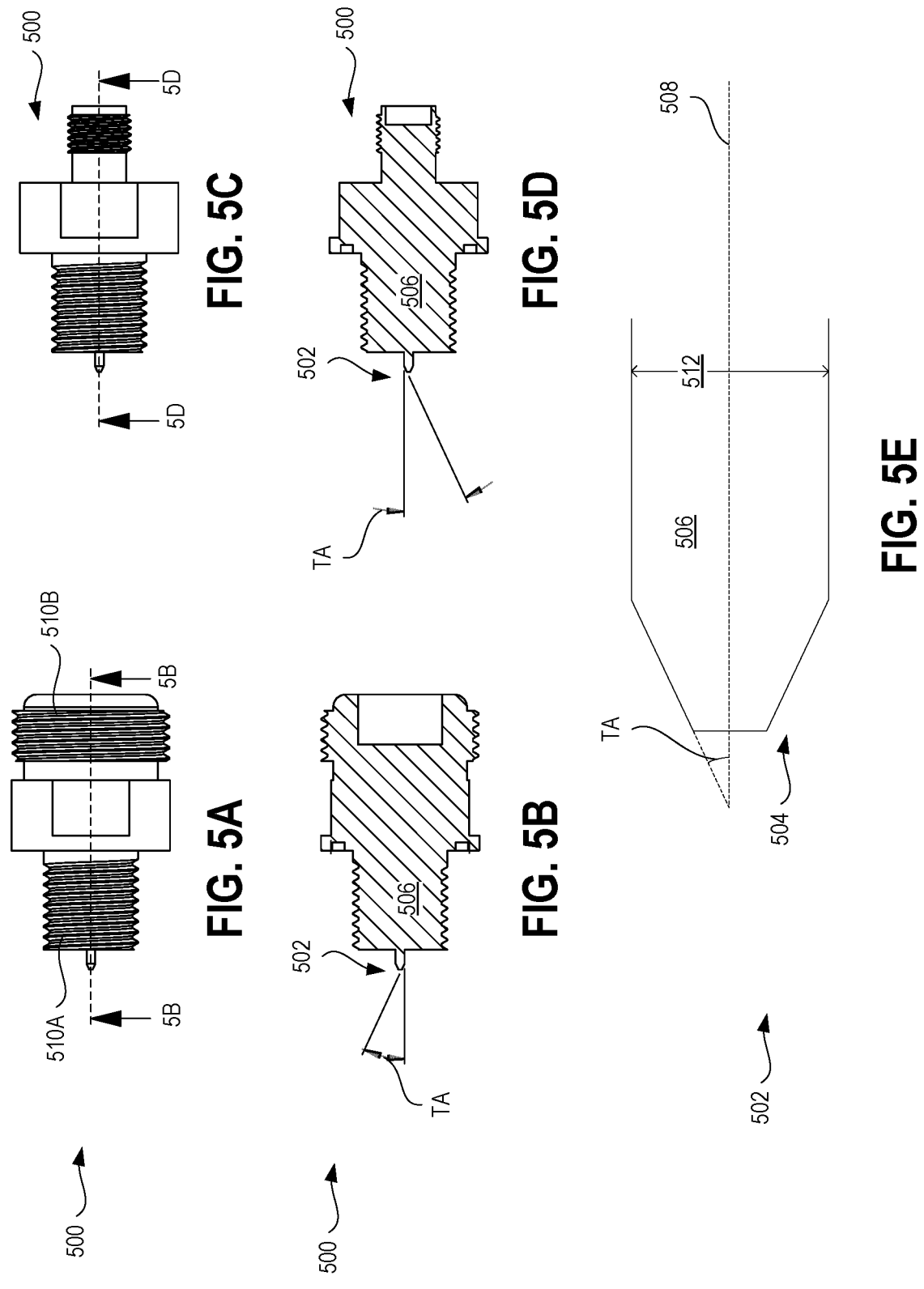
FIG. 5A and FIG. 5C are side elevation views of connectors used for interfacing the LNB system to other components.
FIGS. 5B and 5D are the respective cross-sectional views of the connectors.
FIG. 5E is an enlarged view of a pin of the connector, in accordance with an embodiment.

FIG. 5A and FIG. 5C are side elevation views of connec-tors 500 for a satellite communication system and used for interfacing the LNB system to other components. FIGS. 5B and 5D are the respective cross-sectional views of the connectors.

FIG. 5E is an enlarged view of a pin of the connector 500, in accordance with an embodiment.

In various embodiments, the connectors 500 may be adapted to match impedance of the circuits as mentioned above. For example, in some embodiments, the tip of the connector may be adapted to adjust an impedance of the connector 500. In some embodiments, an angle TA of the tip may be adjusted, e.g. the angle may be about 25 degrees, or between 20 and 30 degrees.

The connectors may be adapted to reduce parasitic induc-tance.

The connector may comprise a body 506 and a (center) pin 502 projecting from the body. In various embodiments, the pin 502 may have a diameter 512 between 0.03 inches and 0.04 inches, or about 0.035 inches. The diameter 512 may refer to the longest dimension along a section of the pin 502 parallel to a direction normal to a primary direction of elongation of the pin 502. Generally, the pin 502 may be cylindrical or tubular at a base thereof with a tip that may taper off, as explained below. The pin may extend outwardly from the body 506 between 0.07 to 0.09 inches to the pin tip 504 to allow engagement with a receptacle dimensioned to complementarily receive the pin 502. The pin tip 504 may be frustoconically shaped around a central axis 508 with an aperture angle (twice the angle TA, or angle between the generatrix lines of a cone, a frustum of which is associated with a shape of the pin tip 504) between 40 and 60 degrees about the central axis 508, e.g. 50 degrees as shown in FIG. 5E.

The pin 502 may be dimensioned for being attached to a printed circuit board (PCB) trace. The pin 502 may be attached to the PCB trace by soldering. The pin 502 may have a tip angle of 25 degrees. The pin 502 may have a tip angle in the range of 20 to 30 degrees.

The center pin may have a length of 0.079 inches. The center pin may have a length in the range of 0.070 to 0.090 inches. The length may be an externally exposed projecting-portion length. The connector may be a SMA-type connector. In various embodiments, the connector may be an SMA or N-type connector.

In various embodiments, the connector 500 may comprise a first threadable portion 510A and a second threadable portion 510B spaced apart from the first threadable portion 510A.

The first threadable portion 510A may be proximal to the pin 502 and suitable to engage with a corresponding threadable portion of a chassis of a low noise block downconverter system proximal to the receptacle to retain the pin 502 in the receptacle.

In various embodiments, the LNB system may have a modular architecture allowing for cost effective customization.

In some embodiments, the printed circuit boards may comprise a three-dimensionally modular interconnect system for various components of the LNB system.

In various embodiments, the module may be organized to allow changing of the LNB system specification. For example, changing an FB module from a straight filter to filter bank may convert the single LNB to 2, 3 or quad band LNB. Similarly, changing the LNA module may change the noise figure, IIP3, cost. For example, these may be undertaken to suit an application. Every other module may stay the same.

In various embodiments, each module may be provided with DC power and I/O ports. For example, in some embodiments, each module may be directly coupled to a DC power source. Each module may be separately coupled to coax inputs (coaxial cable inputs). For example, separate testing and operation of modules may thereby be achieved.

The above shortcomings may be addressed by providing, in accordance with one aspect of the invention, an apparatus for downconverting the carrier frequency of a modulated signal.

An apparatus for downconverting the carrier frequency of a modulated signal may include (a) a low-noise amplifier disposed on a first printed circuit board (PCB), (b) a filter disposed on a second PCB, (c) a block downconverter circuit disposed on a third PCB, and (d) an enclosure for housing the first, second, and third PCBs. The first PCB may be in electrical communication with the second PCB. The second PCB may be in electrical communication with the third PCB. The low-noise amplifier may be operable to receive the modulated signal. The low-noise amplifier may be operable to produce an amplified signal in response to the modulated signal. The filter may be operable to receive the amplified signal via an electrical connection between the first and second PCBs. The filter may be operable to produce a filtered signal in response to the amplified signal. The block downconverter circuit may be operable to receive the filtered signal via a second electrical connection between the second and third PCBs. The block downconverter circuit may be operable to produce an intermediate-frequency signal in response to the filtered signal. The first PCB may have a first thickness. The second PCB may have a second thickness. The third PCB may have a third thickness. Two or more of the first, second, and third thicknesses may be different from each other. The first PCB may be made of a first material. The second PCB may be made of a second material. The third PCB may be made of a third material. Two or more of the first, second, and third materials may be different from each other.

In various embodiments, the LNA, FB, and BDC may be the first, second, and third printed circuit boards, respectively. In some embodiments, the enclosure may be the housing in FIG. 4.

Figure 6:
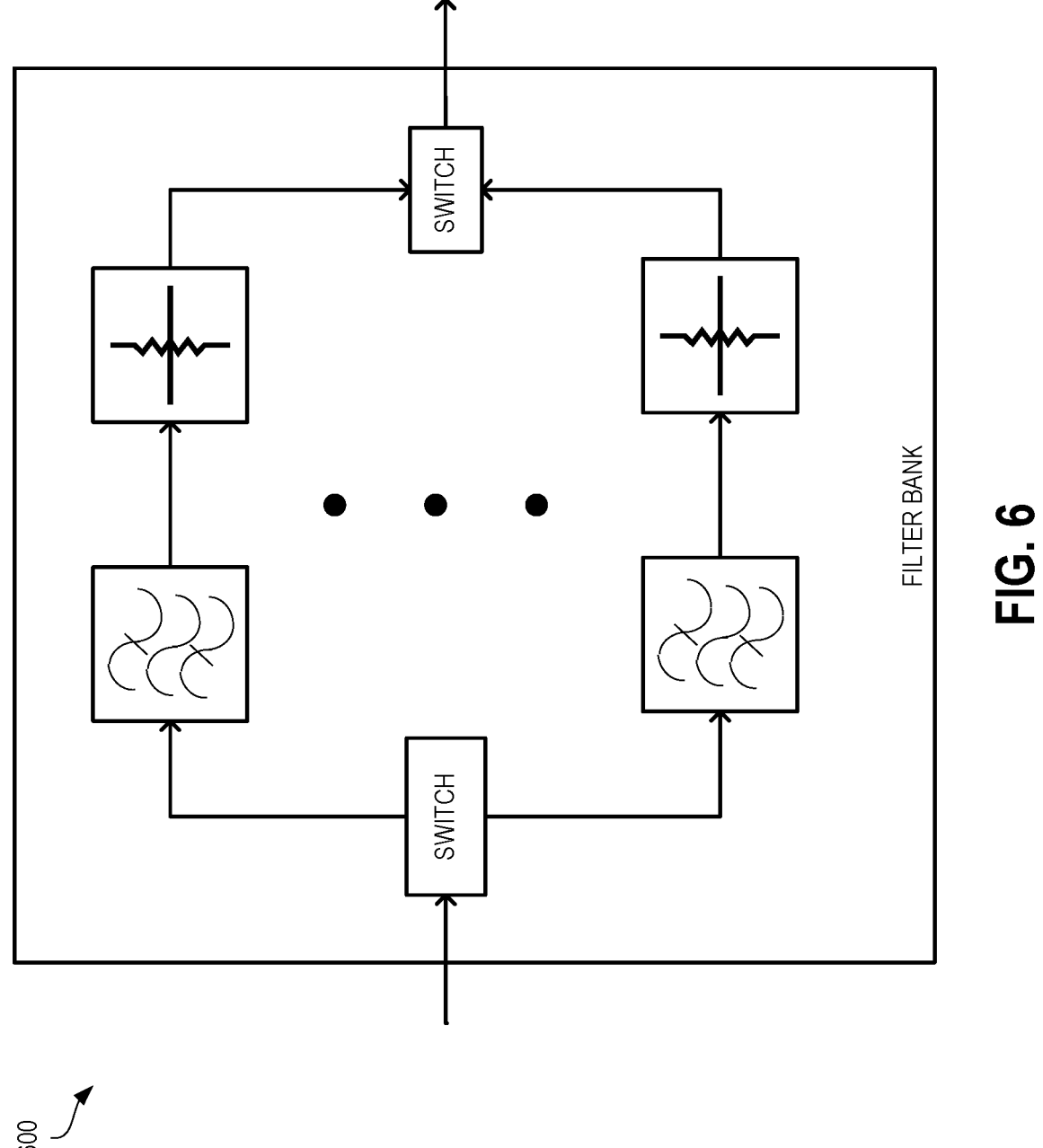
FIG. 6 is a schematic block diagram of a filter bank, in accordance with an embodiment. The filter bank may be a selectable filter bank of bank of selectable filters.

FIG. 6 is a schematic block diagram of a filter bank 600, in accordance with an embodiment.

The filter bank 600 defines a selectable filter for producing a processed signal in response to a received signal. The processed signal may be a filtered and/or attenuated signal. The selectable filter may be selectable from a plurality of filter-attenuator pairs, as shown in FIG. 6. Each filter-attenuator pair may comprise at least one bandpass filter electrically connected in series with a corresponding at least one attenuator.

The filter bank 600 may comprise a plurality of filters and attenuators that are selectable. Each (selectable) filter may be electrically connected in series with a corresponding (selectable) attenuator. Each filter may allow selection of a particular frequency by the filter bank 600. The attenuator may allow attenuation of signal strength. For example, filters may include bandpass filters, and attenuators may include fixed attenuators.

The filter bank 600 may define a plurality of filter-attenuator pairs. Each filter-attenuator pair may define a signal attenuation and a filter bandwidth, associated with, respectively, an attenuator and a filter that is coupled to the attenuator in series.

A switch may allow switching between one filter-attenuator pair to another filter-attenuator pair. The filter bandwidth and the attenuation level may be selected by varying the switch.

In various embodiments, two, three, four, or more filter-attenuator pairs may be defined in a single filter bank 600.

In various embodiments, the selectable filter may be selected by a user or operator (user-selectable) or may be automatically selectable, e.g. according to one or more rules. In some embodiments, circuitry may be provided for such purposes. In various embodiments, such circuitry may be configured to cause selection of the selectable filter based on a signal level of the signal received from the front-end module. For example, a signal level may be determined by a signal strength detector.

The filter may be selectable to achieve desired IP3 and/or desired amplification or attenuation of signals.

Figure 7:
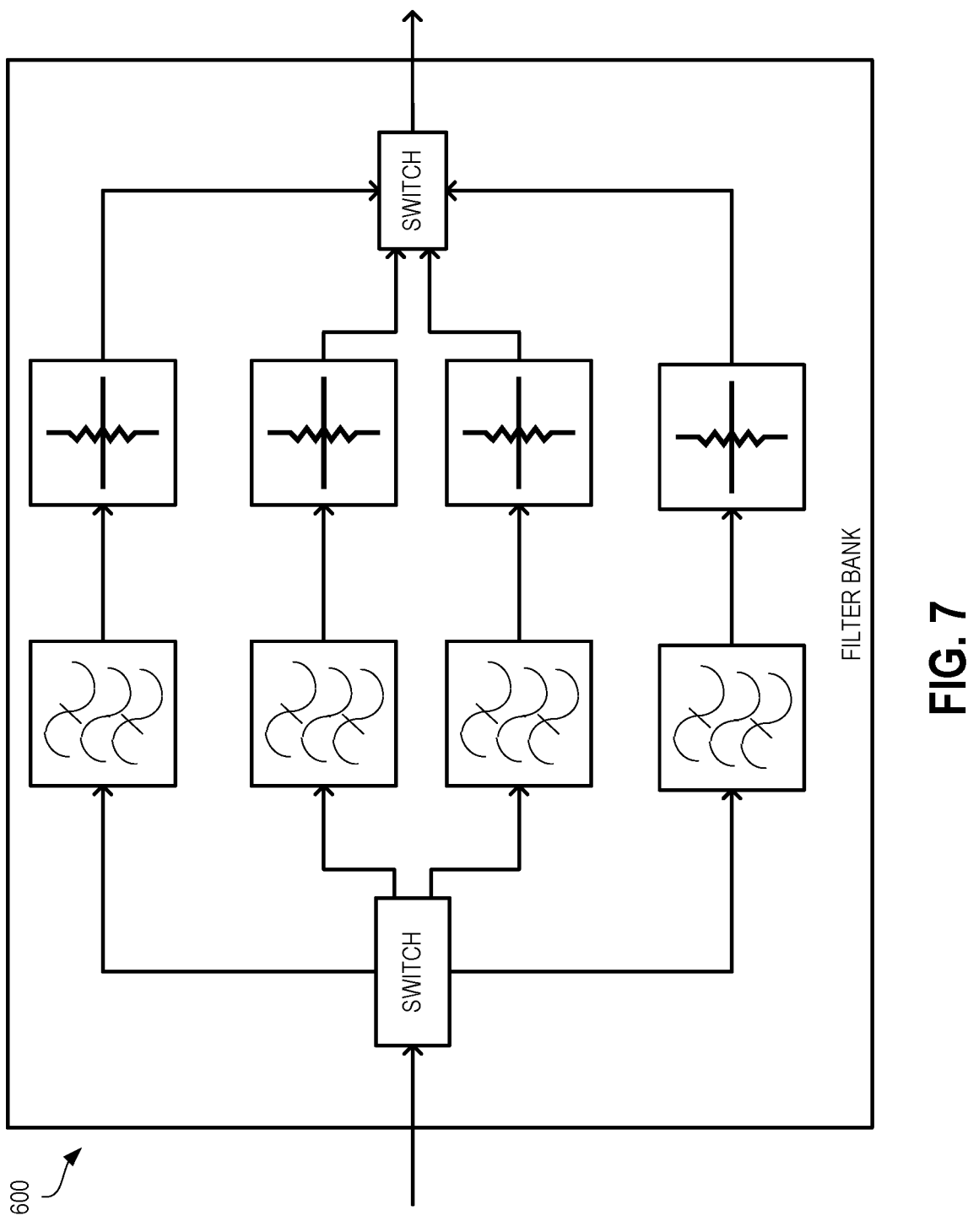
FIG. 7 is a schematic block diagram of a filter bank having four filter-attenuator pairs, in accordance with an embodiment.

FIG. 7 is a schematic block diagram of a filter bank 600 having four filter-attenuator pairs, in accordance with an embodiment.

For example, a single pole 4 throw switch may be used to choose between one filter-attenuator pair and another.

In some embodiments, the filters may be bandpass filters with frequency bands given by, respectively, 17.2-18.2 GHZ, 18.2-192. GHz, 19.2-20.2 GHZ, 20.2-21.2 GHz. The attenuators may be fixed attenuators configured to cause a −10 dB attenuation in the filter bank 600.

In some embodiments, a FB may be used to act as a limiter under high input signal conditions. For example, when changing to a different transponder, polarization, or if otherwise gain saturation is detected, the FB may be switched to the filter-attenuator pair with stronger attenuator to allow error-free operation (no signal interrupt).

Figure 8:
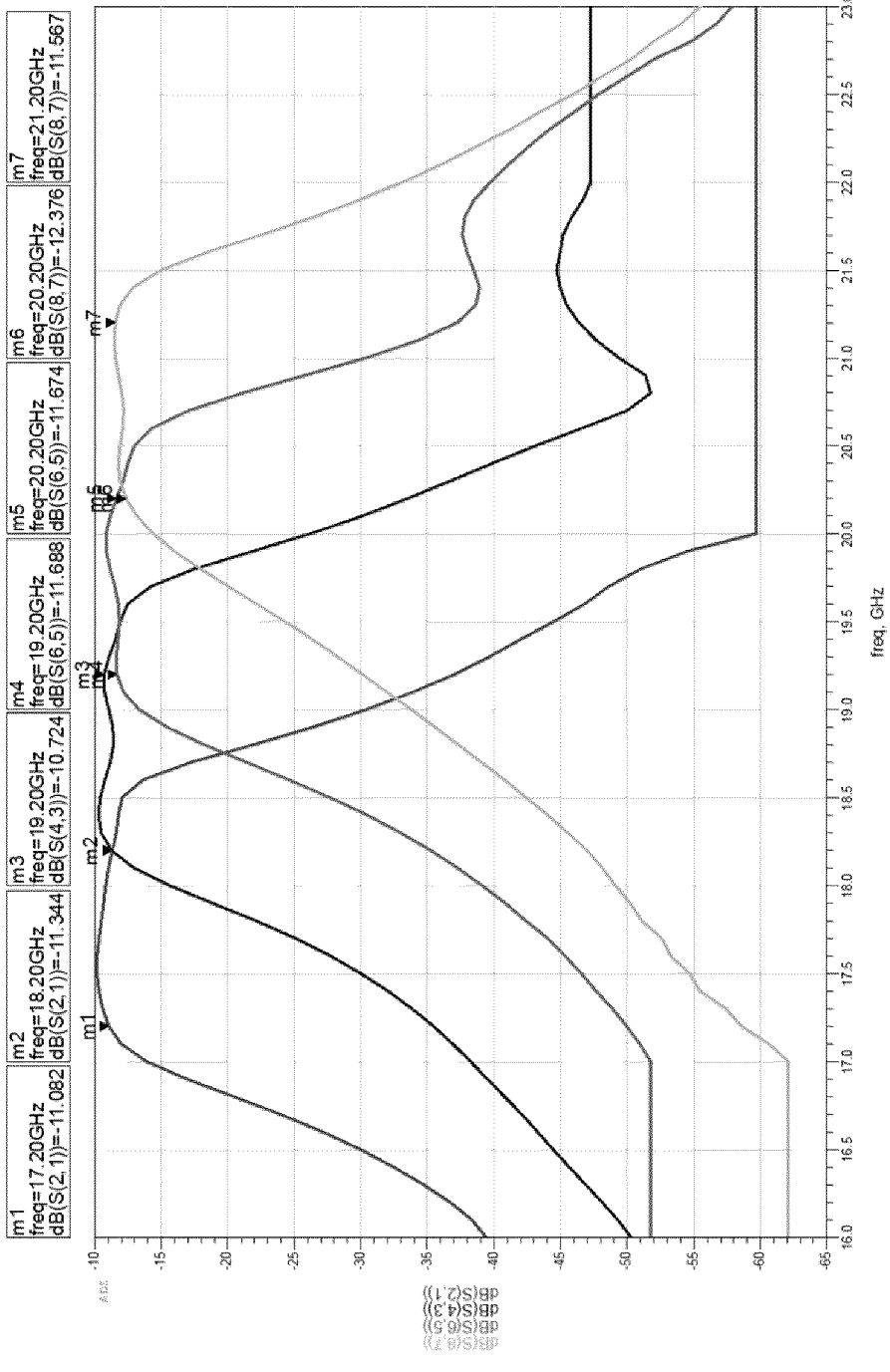
FIG. 8 is a plot of filter bank measurement results, showing filtration of out-of-band frequencies and a −10 dB attenuation, in accordance with an embodiment.

FIG. 8 is a plot of filter bank measurement results, showing filtration of out-of-band frequencies and a −10 dB attenuation, in accordance with an embodiment.

FIG. 9 is a plan view of FBs with varying numbers of filter-attenuator pairs, in accordance with an embodiment.

An apparatus for downconverting the carrier frequency of a modulated signal includes a selectable filter for producing a filtered signal in response to one of the modulated signal and an amplified signal produced in response to the modulated signal; and (b) a block downconverter circuit for downconverting the filtered signal. The selectable filter may comprise one or more selectable bandpass filters. The selectable filter may comprise one or more selectable attenuators. Each of the one or more selectable bandpass filters may be electrically connected in series with the one or more selectable attenuators, such that selecting one of the selectable bandpass filters selects a corresponding one of the one or more selectable attenuators.

Figure 10:
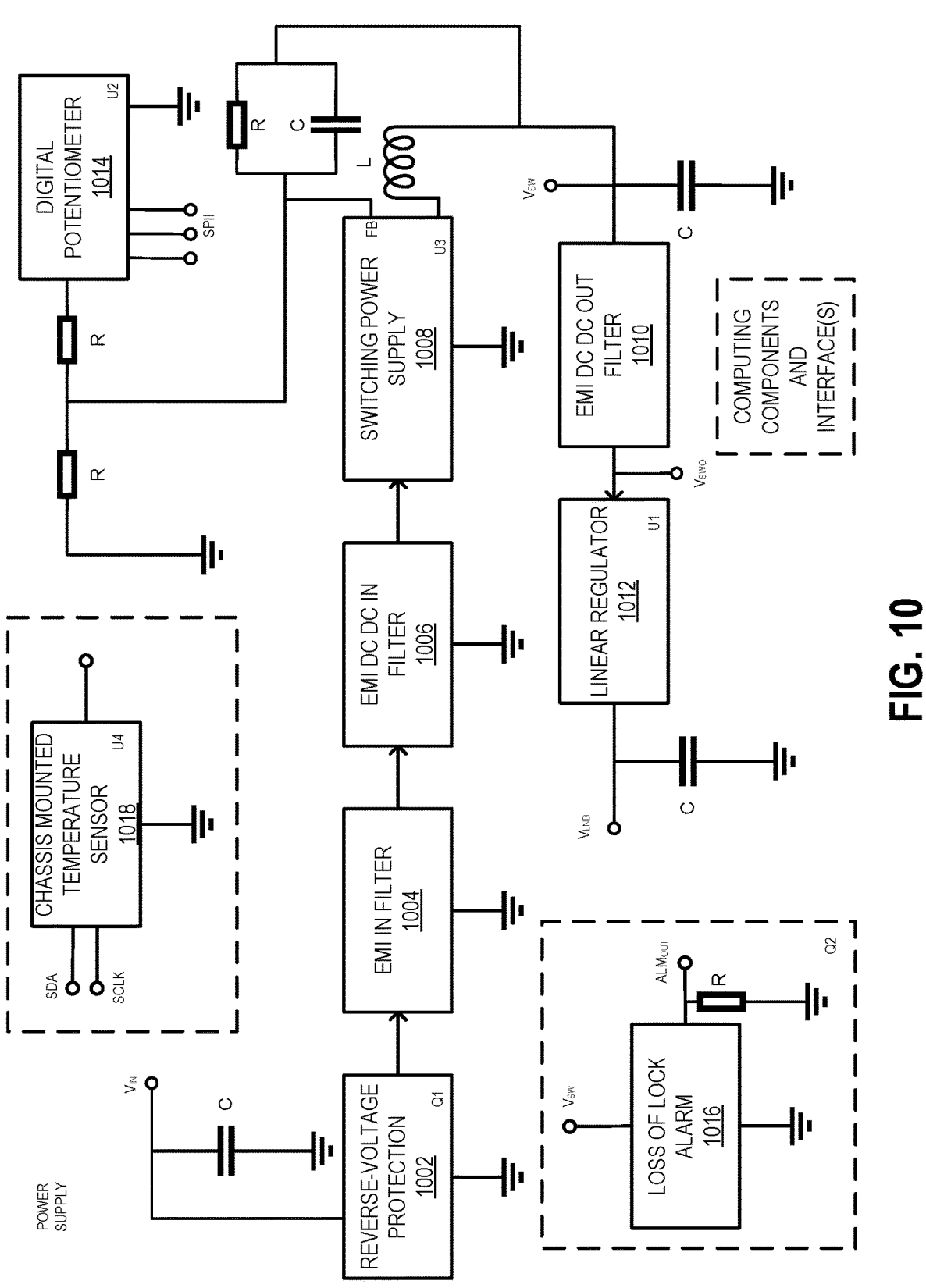
FIG. 10 is a schematic block diagram of a power module, in accordance with an embodiment.

FIG. 10 is a schematic block diagram of a power module or power supply, in accordance with an embodiment.

Shown in FIG. 10 is a module for reverse-voltage protection 1002, an EMI in filter 1004, an EMI DC DC in filter 1006, a switch power supply 1008 (or switching voltage regulator), an EMI DC DC out filter 1010, a linear regulator 1012, a digital potentiometer 1014, a loss of lock alarm 1016, and a chassis mounted temperature sensor 1018.

Figure 11:
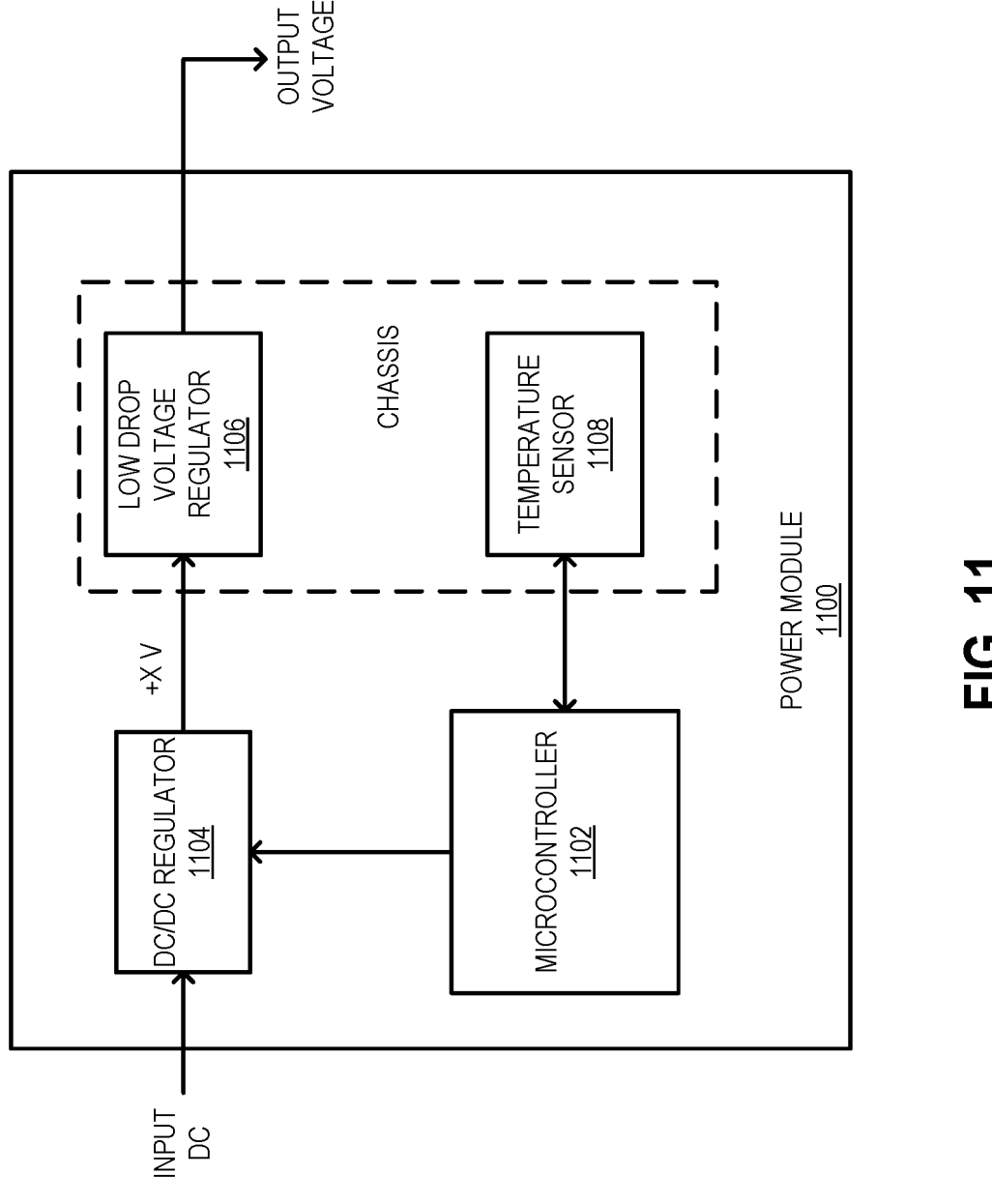
FIG. 11 is a simplified schematic block diagram of a power module, in accordance with an embodiment.

FIG. 11 is a simplified schematic block diagram of a power module 1100 (or power supply), in accordance with an embodiment.

Shown in FIG. 10 is a microcontroller 1102 (e.g. computing components and interface), a DC/DC regulator 1104 (e.g. a switching power supply), a low drop voltage regulator 1106, and a temperature sensor 1108. The temperature sensor 1108 and the low drop voltage regulator 1106 are mounted on the chassis.

The power module or supply may be configured to supply electrical power to components of the apparatus. The power module may be operable to receive an input supply voltage and to produce an output voltage in response to the input supply voltage.

The power module may comprise a switching power supply. The switching power supply may generate a "ripple" in the output voltage, which may act as detrimental noise in the downconverter apparatus.

A digital resistor, or potentiometer, may be coupled to the switching power supply to provide resistance to control voltage, e.g. in response to the level of ripple. For example, power supply to the LNB (output voltage) may be programmatically controlled at run-time and in real-time, e.g. based on the relationship between resistance the output voltage. An example table is shown below

| Resistance (kilo Ohm) | Output voltage |
| --- | --- |
| 150 | 5.93 |
| 160 | 5.6 |

-continued

| Resistance (kilo Ohm) | Output voltage |
| --- | --- |
| 159.2 | 5.63 |
| 180 | 5 |

The resistance may be varied based on the output voltage.

Empirical calculations may be used to determine appropriate resistance to be provided by the digital resistor to reduce output ripple from the switching power supply.

In various embodiments, output voltage may be adjusted to improve power supply rejection ratio (PSRR). Furthermore, in some embodiments, higher current through the output resistor may create heat to keep the LNB in a safe operating temperature range, e.g. to facilitate operation in extreme environments.

In some embodiments, the power module may comprise a potentiometer, e.g. a digital potentiometer, for adjusting a switching frequency of the switching power supply.

In various embodiments, the power module may be operable to communicate a digital command for adjusting the voltage value of the input supply voltage. For example, a microcontroller may be coupled to a switching power supply to control the switching power supply and/or the digital potentiometer.

The power module may include a temperature sensor for sensing a temperature of the power module, the chassis, and/or the ambient temperature. In various embodiments, the temperature sensor may be mounted on the chassis along with a low drop voltage regulator (e.g. a linear regulator).

The linear regulator may regulate the voltage value of the output voltage. The linear regulator may be operable to receive an output of the switching power supply and to produce the output voltage in response to the output. The linear regulator may be operable to produce the same output voltage in response to variations in the voltage value of the input supply voltage.

The power module may be operable to communicate the digital command in response to the temperature so as to increase the voltage value of the input supply voltage in response to a low ambient temperature, such that heat produced by the linear regulator is increased in response to the low temperature, thereby heating the apparatus in response to the low temperature.

For example, the heat power generated may be substantially equal to the current times the difference between the (fixed) output voltage of the linear regulator and the input supply voltage. The linear regulator may be chassis mounted to allow heat transfer to the chassis.

In some embodiments, a cooling element, e.g. a Peltier element may be provided, for cooling the power module, chassis, and/or the LNB.

Figure 12:
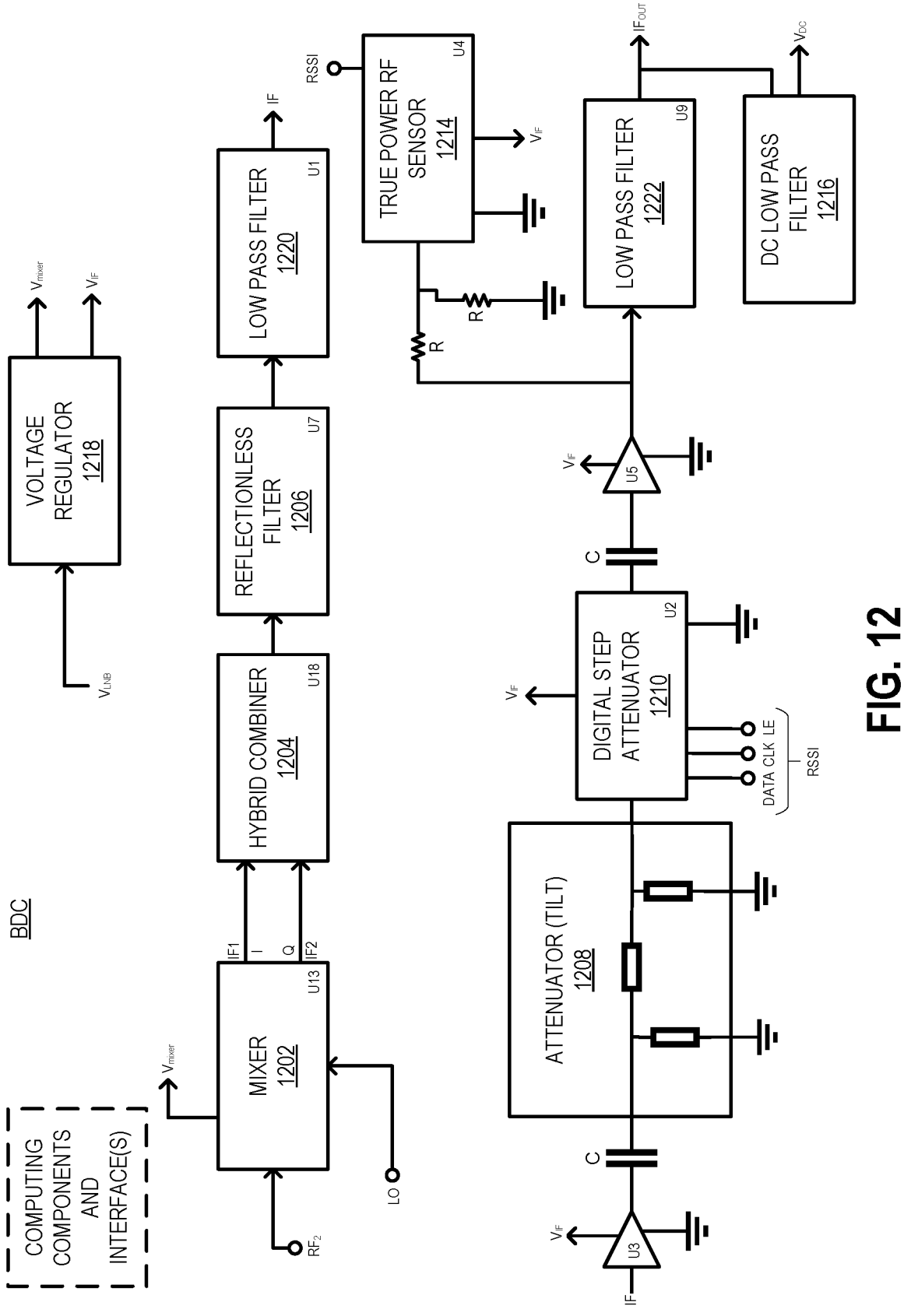
FIG. 12 is a schematic block diagram of the block downconverter of the LNB system, in accordance with an embodiment.

FIG. 12 is a schematic block diagram of the BDC of the LNB system, in accordance with an embodiment.

Shown in FIG. 12 is a mixer 1202, a hybrid combiner 1204, a reflectionless filter 1206, an attenuator (tilt) 1208, a digital step attenuator 1210, a true power sensor 1214, a DC low pass filter 1216, a voltage regulator 1218, and a low pass filter 1220. Amplifiers are shown in FIG. 12 and have labels U3 and U5.

A mixer circuit may be operable to receive a radio-frequency (RF) signal, to receive a local-oscillator (LO) signal, and to produce an intermediate-frequency (IF) signal in response to the RF and LO signals.

An attenuator may be operable to attenuate the IF signal to produce an attenuated signal. For example, the attenuator may be a digital step attenuator or fixed attenuator. The attenuator may be a digitally controlled attenuator. In various embodiments, the digital strength attenuator may be configured to receive a received signal strength indicator (RSSI).

A power sensor (true power RF sensor) may be operable to sense the electrical power of the attenuated signal, wherein the attenuator is operable to adjust attenuation of the IF signal in response to the electrical power. In some embodiments, the BDC may be operable to amplify the IF signal. The apparatus may be operable to amplify the attenuated signal prior to sensing the electrical power.

The power sensor may be operable to produce a digital representation of the electrical power. The apparatus may be operable to communicate the digital representation from the power sensor to the attenuator.

The LNB system may include computing components and interface(s) micro-processor operable to receive the digital representation and to communicate a processed digital representation of the electrical power to the attenuator.

In various embodiments, the attenuators may allow the BDC to provide auto-leveling of a signal. For example, in case of a sudden jump in signal strength, a satellite receiver may auto-level and adjust gains to avoid saturating amplifiers (feedback to the LNA). In some embodiments, the auto-leveling of the satellite receiver may take several milliseconds, which may be excessively long in practice. During this millisecond duration, the attenuators described above may attenuate the signal based on the RSSI and may thereby prevent saturation. For example, the auto-leveling of the LNB system may be significantly faster than that of a receiver device, and prevent components from going into error mode or otherwise being saturated.

In various embodiments, power may be tapped off after mixing and amplified for use in auto-leveling. Resistors may be used instead of couplers for auto-leveling (attenuation) since resistors may provide a flatter response, e.g. couplers may cause low-pass filtering.

In various embodiments, the auto-leveling control may be advantageous for tracking level from low-earth orbit satellites.

Figure 13:
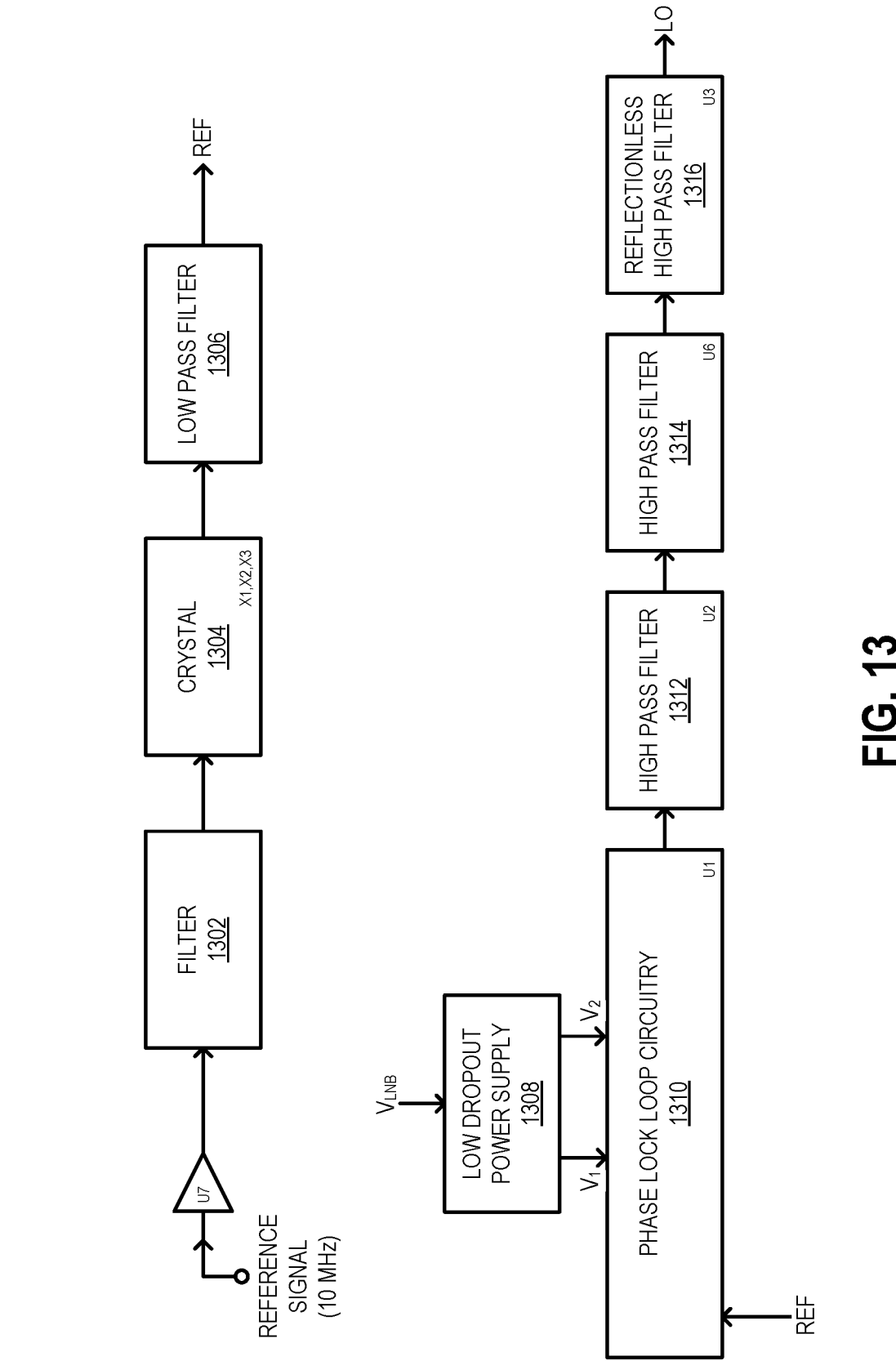
FIG. 13 is a schematic block diagram of a local oscillator, in accordance with an embodiment.

FIG. 13 is a schematic block diagram of a local oscillator, in accordance with an embodiment.

Shown in FIG. 13 is a filter 1302, a crystal 1304 for forming an oscillator, a low pass filter, a low dropout power supply 1308, phase lock loop circuitry 1310 (e.g. phase lock loop integrated circuit with internal voltage controlled oscillator), a high pass filter 1312, another high pass filter 1314, and a reflectionless high pass filter 1316. An amplifiers is shown in FIG. 13 and has the label U7.

Figure 14:
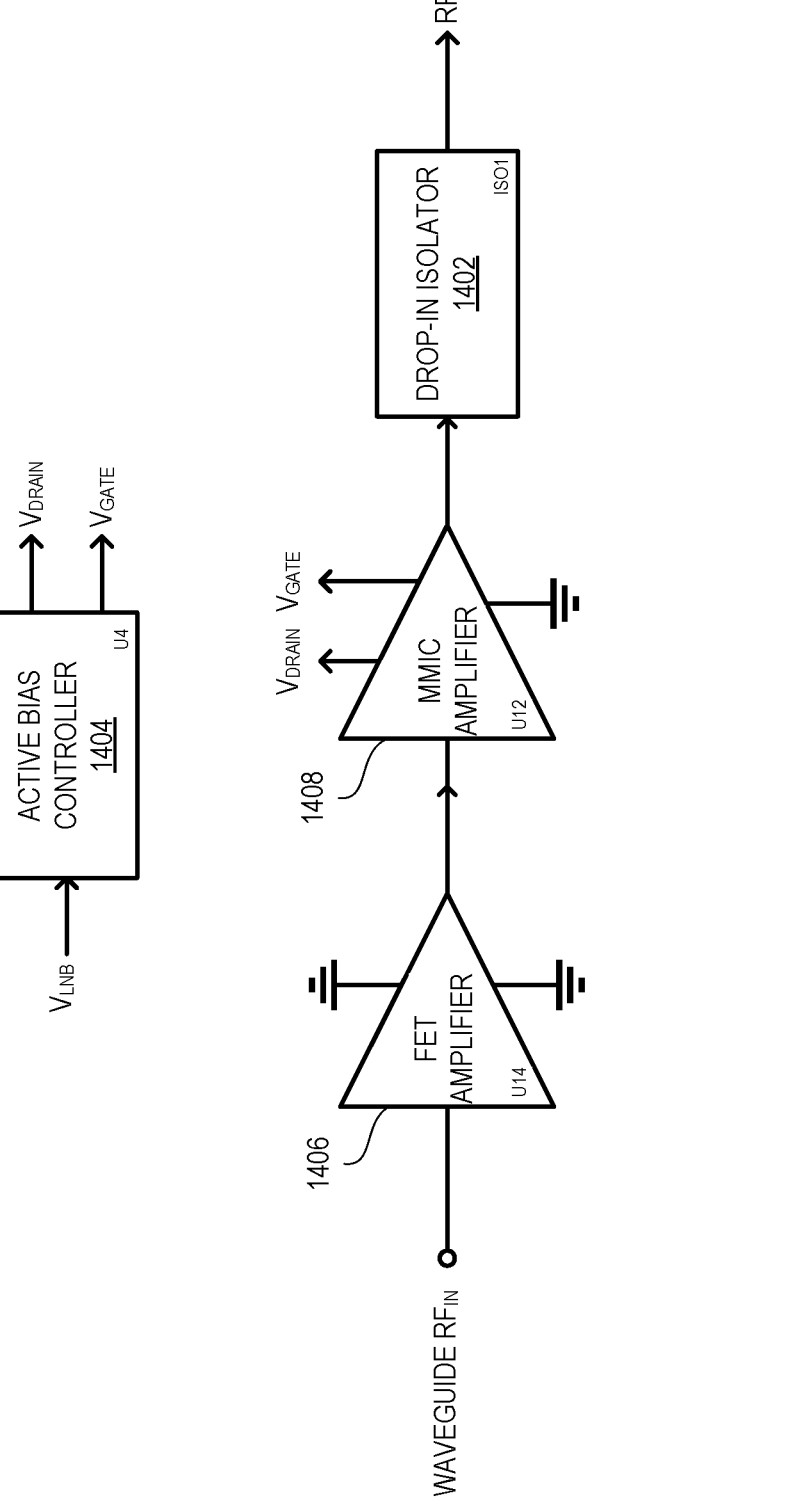
FIG. 14 is a schematic block diagram of a low noise amplifier, in accordance with an embodiment.

FIG. 14 is a schematic block diagram of a low noise amplifier, in accordance with an embodiment.

Shown in FIG. 14 is an active bias controller 1404, a drop-in isolator 1402, a FET amplifier 1406, and an MMIC amplifier 1408.

Figure 15:
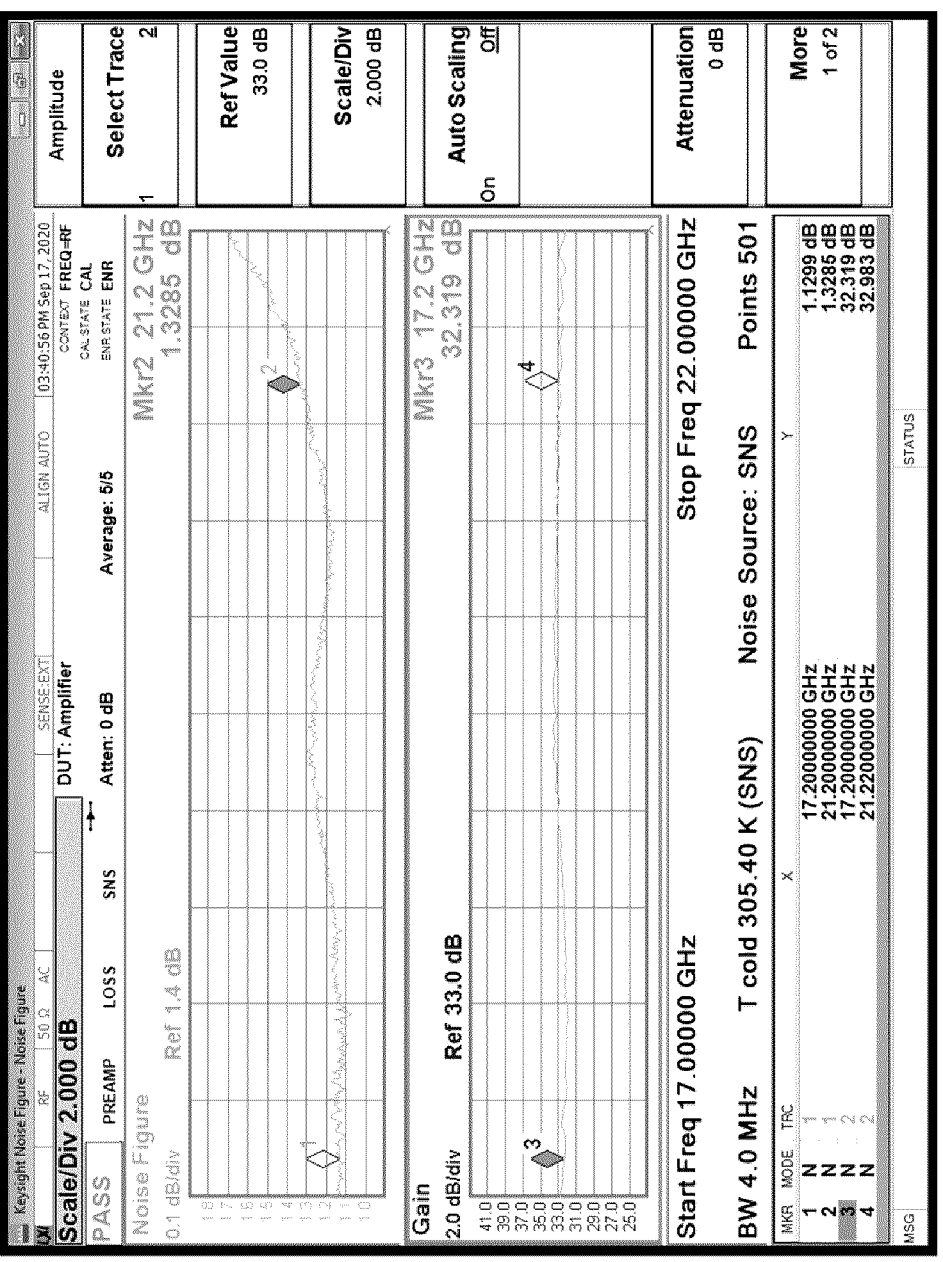
FIG. 15 is a plot of the noise figure of a low noise amplifier and gain thereof, in accordance with an embodiment.

FIG. 15 is a plot of the noise figure of a low noise amplifier and gain thereof, in accordance with an embodiment.

Figure 16:
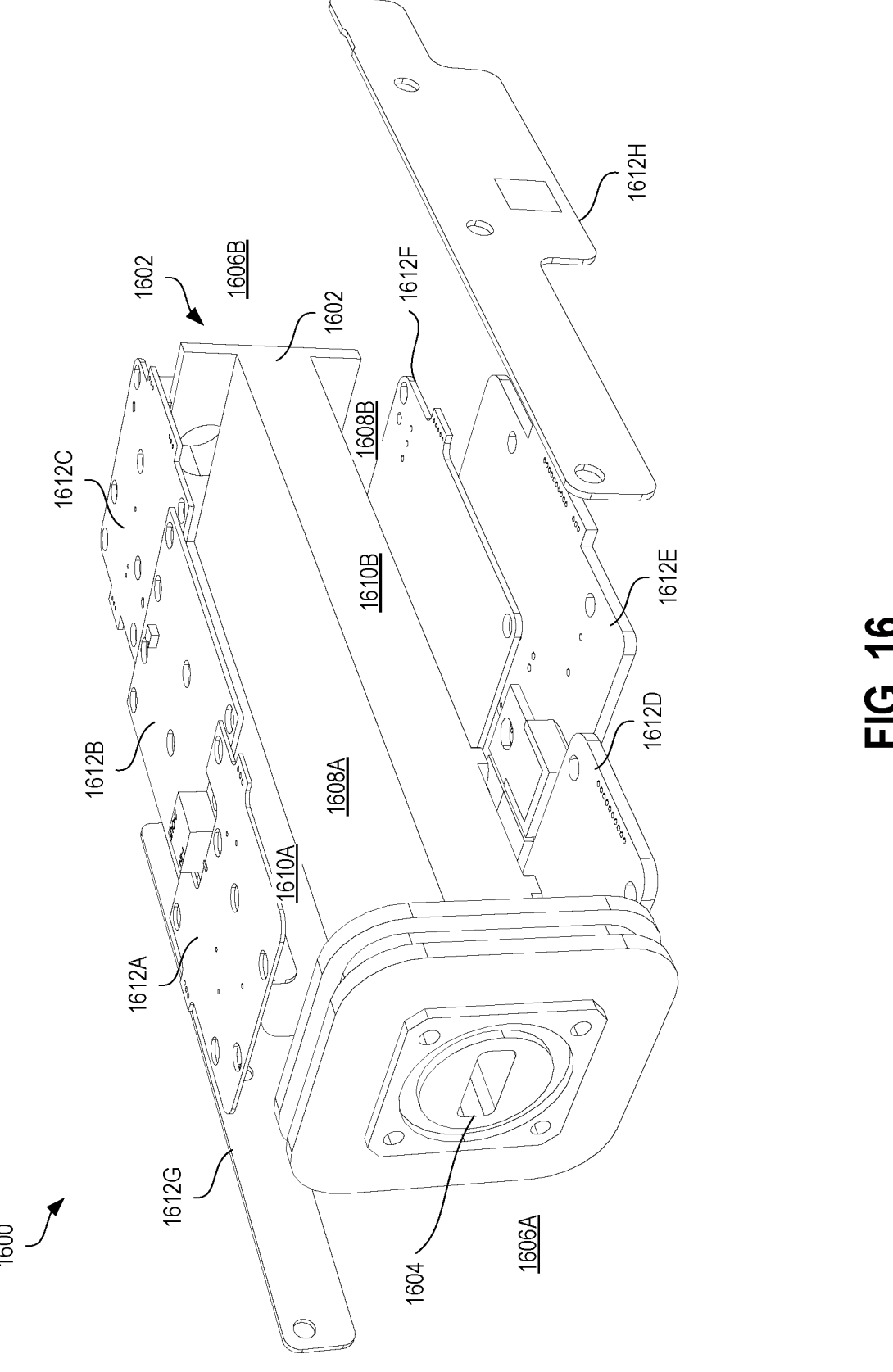
FIG. 16 is an exploded perspective view of an LNB system, in accordance with another embodiment.

FIG. 16 is an exploded perspective view of an LNB system 1600, in accordance with another embodiment. For example, the LNB system 1600 may be part of a satellite communication system.

The LNB system 1600 has a chassis 1602 forming a waveguide port 1604. The chassis 1602 extends between a front end 1606A and a rear end 1606B. In various embodiments, the waveguide port 1604 may be formed at one of these ends of the chassis 1602, e.g. it may be formed at the front end 1606A, shown in FIG. 16.

As shown in FIG. 16, the chassis 1602 defines top and bottom sides 1608A, 1608B that oppose each other and are opposite to each other relative to the chassis 1602. The chassis further defines right and left transverse sides 1610A, 1610B that extend between the sides 1608A, 1608B and are opposite to each other relative to the chassis 1602.

As shown in FIG. 16, a plurality of printed circuit board assemblies (plurality of PCB assemblies) 1612A, 1612B, 1612C, 1612D, 1612E, 1612F, 1612G, 1612H surround the chassis 1602. Each of these is supported by a corresponding printed circuit board (PCB), as discussed further below. Such PCBs may be each independently fastened to the chassis via fasteners, such as standoffs. The plurality of PCB assemblies are configured to process an electrical signal generated by a probe disposed in the waveguide port 1604. In various embodiments, the plurality of PCB assemblies define or support a corresponding module. For example, one or more PCB assemblies may define a local oscillator module.

The PCB assemblies 1612A, 1612B, 1612C, 1612D, 1612E, 1612F define PCBs that each extend along one of the top or bottom sides 1608A, 1608B.

The PCB assemblies 1612G, 1612H define transverse PCBs extending (transversely) across the chassis at the right and left transverse sides 1610A, 1610B. These transverse PCBs are transverse to the PCBs defined by the PCB assemblies 1612A, 1612B, 1612C, 1612D, 1612E, 1612F, and serve to connect such PCBs to each other at one or more of the transverse sides 1610A, 1610B. In various embodiments, the transverse PCBs may be perpendicular to the PCBs defined by the PCB assemblies 1612A, 1612B, 1612C, 1612D, 1612E, 1612F.

As such, the PCB assemblies 1612A, 1612B, 1612C, 1612D, 1612E, 1612F surround the chassis 1602 or a central shaft or backbone of the chassis 1602 between the front and rear ends 1606A, 1606B. In some embodiments, the chassis 1602 may not have a central shaft. For example, chassis 1602 may have formed there in the waveguide port 1604 without a central shaft extending beyond the waveguide port 1604. For example, in this case, the sides 1608A, 1608B, 1610A, 1610B may be defined relative to the chassis 1602 as defined by the waveguide port 1604.

In some embodiments, PCBs defining such PCB assembled are bolted down or otherwise attached, such as internally threaded standoffs, to chassis 1602 or to the backbone of the chassis 1602. For example, in various embodiments, the chassis 1602 may be made of thermally conductive material, e.g. metal, and at least one of the PCBs may be securely fastened to the chassis 1602 via a thermally conductive connector, e.g. a metallic conductor, to allow thermal communication between the chassis of the plurality of PCBs. The waveguide port 1604 extends into the chassis 1602 sufficiently so that it is at least partially surrounded by the plurality of PCB assemblies 1612A, 1612B, 1612C, 1612D, 1612E, 1612F.

The PCB assemblies 1612A, 1612B, 1612C are opposite to the PCB assemblies 1612D, 1612E, 1612F, relative to the chassis 1602, and may be parallel to each other. The chassis 1602 is sandwiched in-between a first set of PCBs defined by the PCBs of the PCB assemblies 1612A, 1612B, 1612C and a second set of PCBs defined by the PCBs of the PCB assemblies 1612D, 1612E, 1612F.

It is found that such a three-dimensional enveloping arrangement of PCBs provides a compact design that is cost-effective. For example, heating may be achieved more efficiently, as is discussed below.

Figure 17:
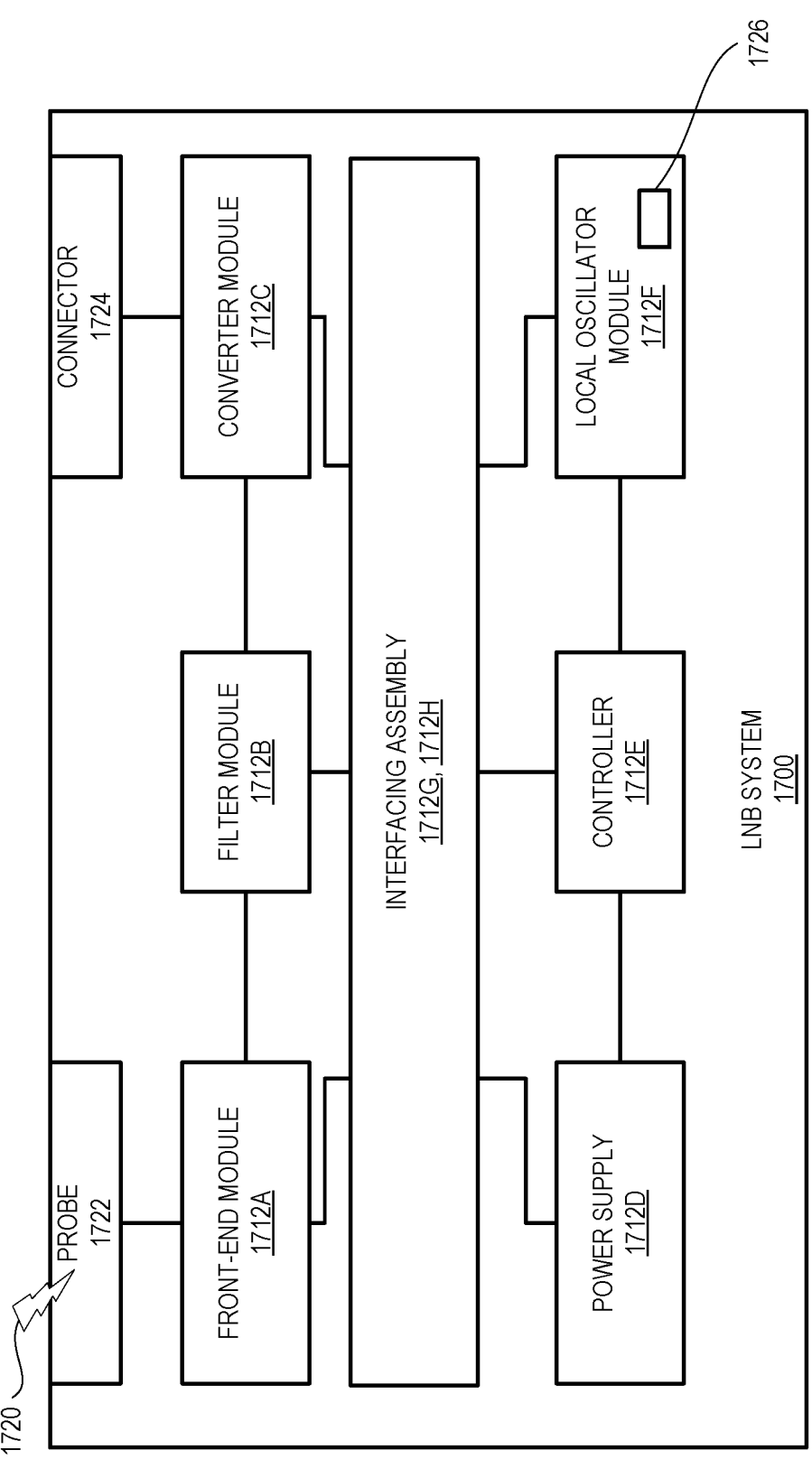
FIG. 17 is a schematic block diagram of an LNB system with a configuration similar to the LNB system of FIG. 16, in accordance with an embodiment.

FIG. 17 is a schematic block diagram of an LNB system 1700 with a configuration similar to the LNB system 1600 of FIG. 16, in accordance with an embodiment.

A probe 1722 in a waveguide port generates an electrical signal in response to a radio frequency signal 1720 in the waveguide port. A front-end module 1712A is configured to receive the electrical signal from the probe. In various embodiments, the front-end module 1712A includes circuitry such as low-noise amplifiers. The front-end module 1712A processing the electrical signal to generate a first processed electrical signal which is then transmitted to, and received by, a filter module 1712B. The filter module 1712B serves to filter and attenuate the received signal and to generate a second processed electrical signal, e.g. in various embodiments the filter module 1712B may include a filter bank. For example, a plurality of filter-attenuator pairs may be incorporated as circuitry in the filter module 1712B so as to provide automatic level control (ALC), to ensure sufficient signal strength, and prevent signal saturation. The second processed signal is transmitted to, and received by, a converter module 1712C. The filter module 1712B connected to the front-end module 1712A and the converter module 1712C. The converter module 1712C processes the second processed signal to generate a downconverted signal based on the second processed signal and a reference signal. The downconverted signal is then output from the LNB system 1700 via a connector 1724. In various embodiments, the converter module 1712C may change the signal frequency and/or demodulate the signal using the reference signal. The reference signal may be tuned to a carrier frequency and/or a lower frequency. The reference signal may be provided by a local oscillator module 1712F. In various embodiments, the local oscillator module 1712F includes an electronic oscillator 1726, such as a, voltage-controlled, crystal oscillator. In various embodiments, the electronic oscillator 1726 may be controllable, e.g. a voltage-controlled oscillator, to generate the reference signal. In various embodiments, the electronic oscillator 1726 may be a temperature-controlled oscillator or oven-controlled oscillator. A controller 1712E controls the local oscillator module 1712F. The controller 1712E connects the electronic oscillator to a power supply 1712D. As will be explained later, a dual phase lock loop (PLL) may be particularly advantageous for use in the local oscillator module 1712F. The power supply 1712D powers the LNB system 1700 by generating a power supply output that is supplied to the modules.

The modules are interconnected to each other at least partially by interfacing modules 1712G, 1712H.

In some embodiments, the modules 1712A, 1712B, 1712C, 1712D, 1712E, 1712F, 1712G, 1712H are defined by, or form, the respective PCB assemblies 1612A, 1612B, 1612C, 1612D, 1612E, 1612F, 1612G, 1612H. For example, the PCB assembly 1612B may define one or more filters for filtering received signals (the electrical signal generated by the probe 1720), and the PCB assembly 1612F may have the electronic oscillator 1726 mounted on the PCB assembly 1612F. For example, the front-end module 1712A, filter module 1712B, the converter module 1712C are opposite to the power supply 1712D, controller 1712E, local oscillator module 1712F, relative to the chassis 1602. For example, the interfacing assemblies 1712G, 1712H may include transverse PCBs as defined by the PCB assemblies 1612G, 1612H.

As described earlier, in some embodiments, filter module 1712B defines a selectable filter for producing a filtered signal in response to a signal received from the front-end module. The selectable filter comprising one or more bandpass filters and one or more attenuators. Such bandpass filters and attenuators may be selectable. In some embodiments, the LNB system includes circuitry configured to cause selection of the selectable filter based on a signal level of the signal received from the front-end module 1712A. In some embodiments, each selectable filter comprises an attenuator electrically connected in series with a corresponding attenuator-specific bandpass filter. In some cases, this is particularly advantageous because depending on satellite signal level the LNB system may require different IP3, which is a measure of saturation of the LNB and distortion of the RF signal. The higher input signal levels, the more IP3 value is relevant. At the same time higher input signal levels dictate the LNB gain reduction (attenuation) so that output signal level from the LNB system remains the same. The LNB IP3 strongly depends on signal level at various stages (specifically at the mixer input). By changing attenuation in the signal path (switching filters with different attenuation), the signal level at the mixer input is changed, which then changes overall LNB IP3. In some embodiments, instead of using a controlled attenuator, the filter bank is re-used since the filter bank made of 4 filters to create 2 band LNB with 2 different attenuation paths, or single band LNB with 2 to 4 different attenuation paths. The filters/filter banks may be used to improve image rejections, transmit signal rejection of the LNB, as well as improve IP3. In various embodiments, the attenuation paths may be switched by issuing a command over LNB communication interface or automatically based on detected signal level (e.g. based on detection by a signal strength detector). Switching 2, 3 or 4 paths may make the IP3 jump in steps. In various embodiments, fine tuning of the gain or level in the output then can be achieved by setting the DSA. In various embodiments, the LNB system may be designed for or optimized for the IP3 and NF performance at different input receiving RF signal level automatically.

In one example, four selectable bandpass filters may all have the same bandwidth, e.g. 19.2-30.2 GHz but may each have differing selectable attenuators, 8 dB, 8 dB, 12 dB, 15 dB, and so on.

Figure 18A:
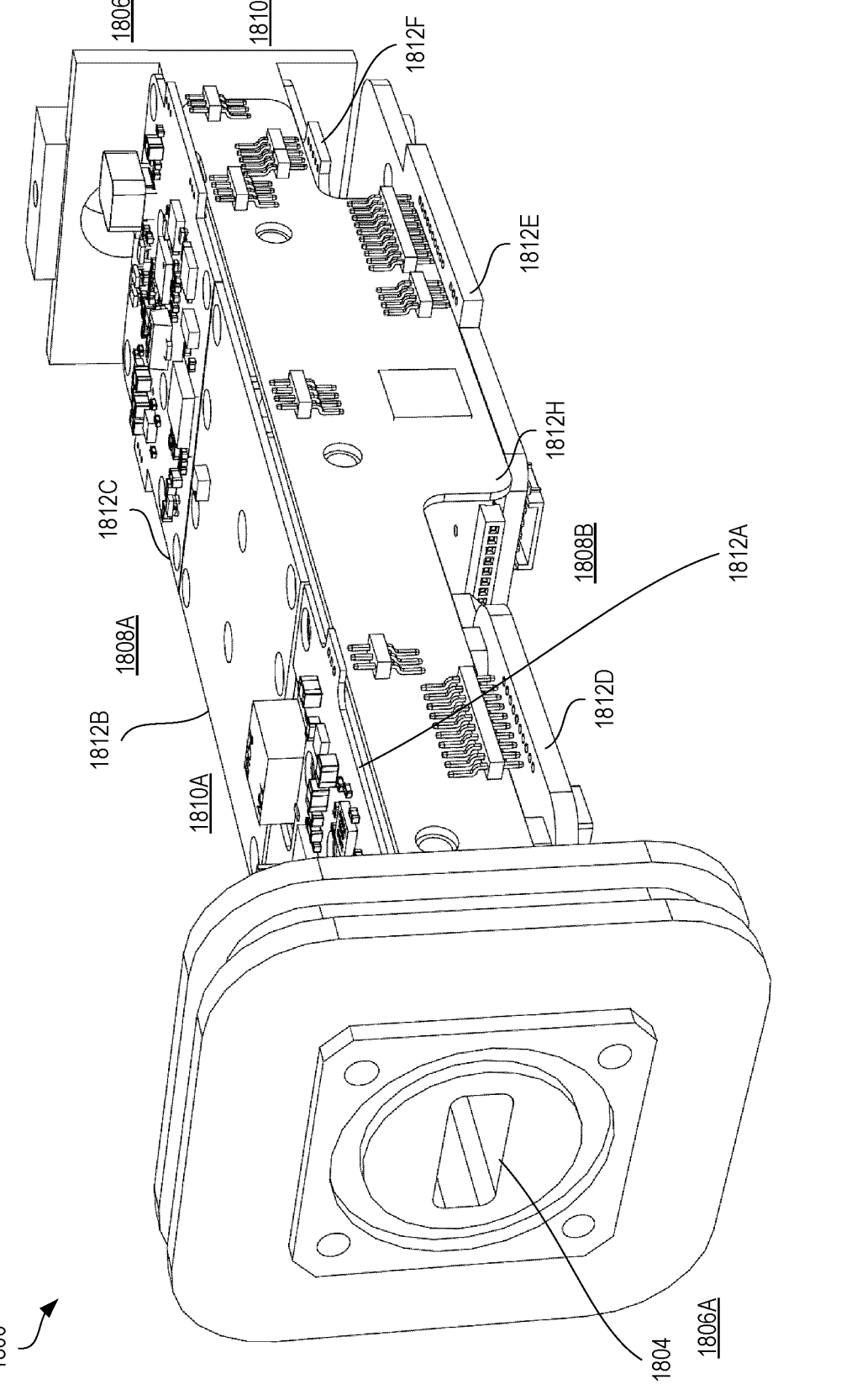
FIG. 18A is a partially exploded perspective view of an LNB system, in accordance with another embodiment.

FIG. 18A is a partially exploded perspective view of an LNB system 1800, in accordance with an embodiment. Components of the LNB system 1800 are not connected to each other but are positioned adjacent to their connected positions.

Figures 18B, 18C:
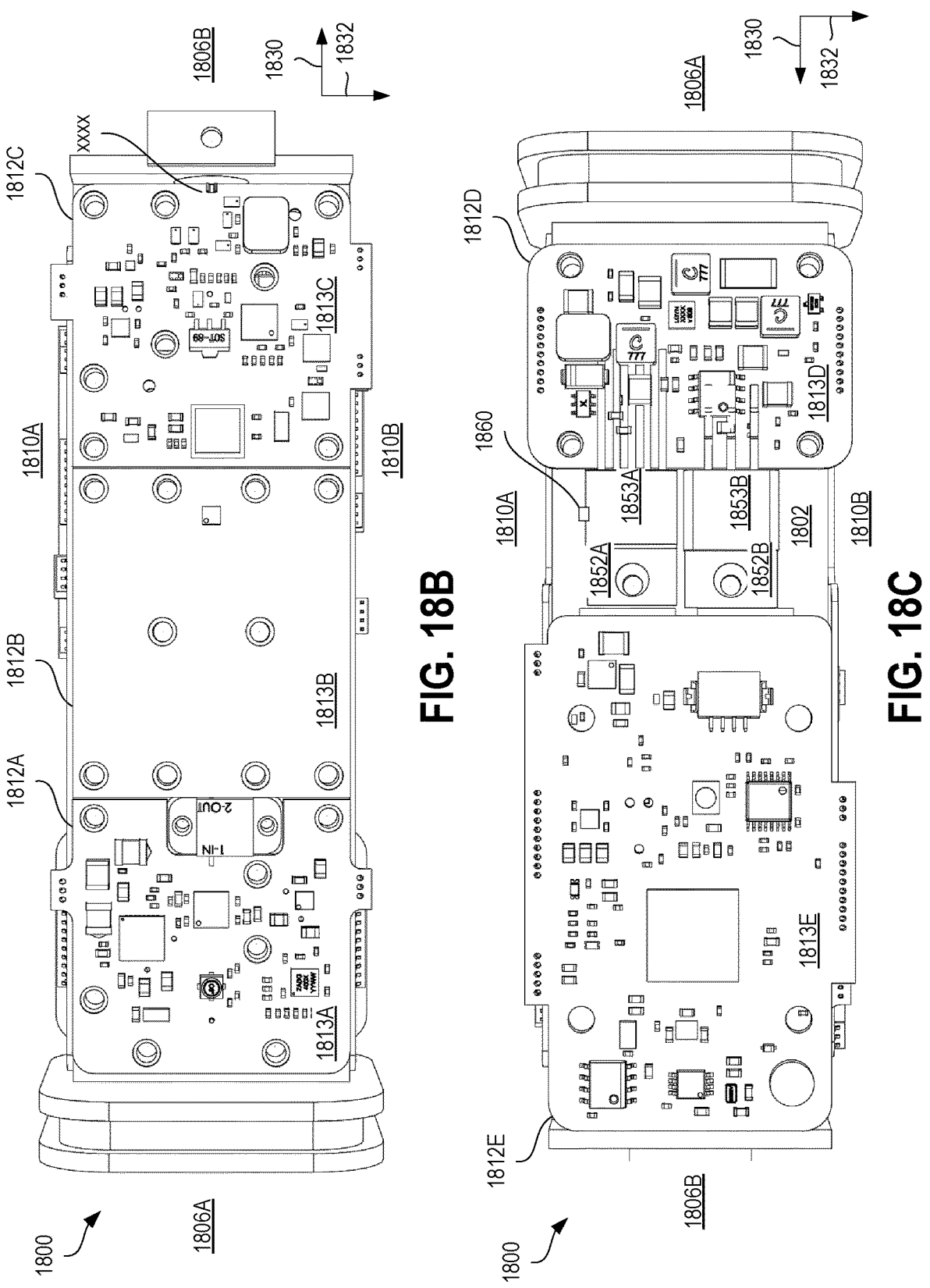
FIG. 18B is a top plan view of the LNB system of FIG. 18A, in accordance with an embodiment.
FIG. 18C is a bottom plan view of the LNB system of FIG. 18A, in accordance with an embodiment.

FIG. 18B is a top plan view of the LNB system 1800 of FIG. 18A, in accordance with an embodiment.

FIG. 18C is a bottom plan view of the LNB system 1800 of FIG. 18A, in accordance with an embodiment.

Figures 18D, 18E:
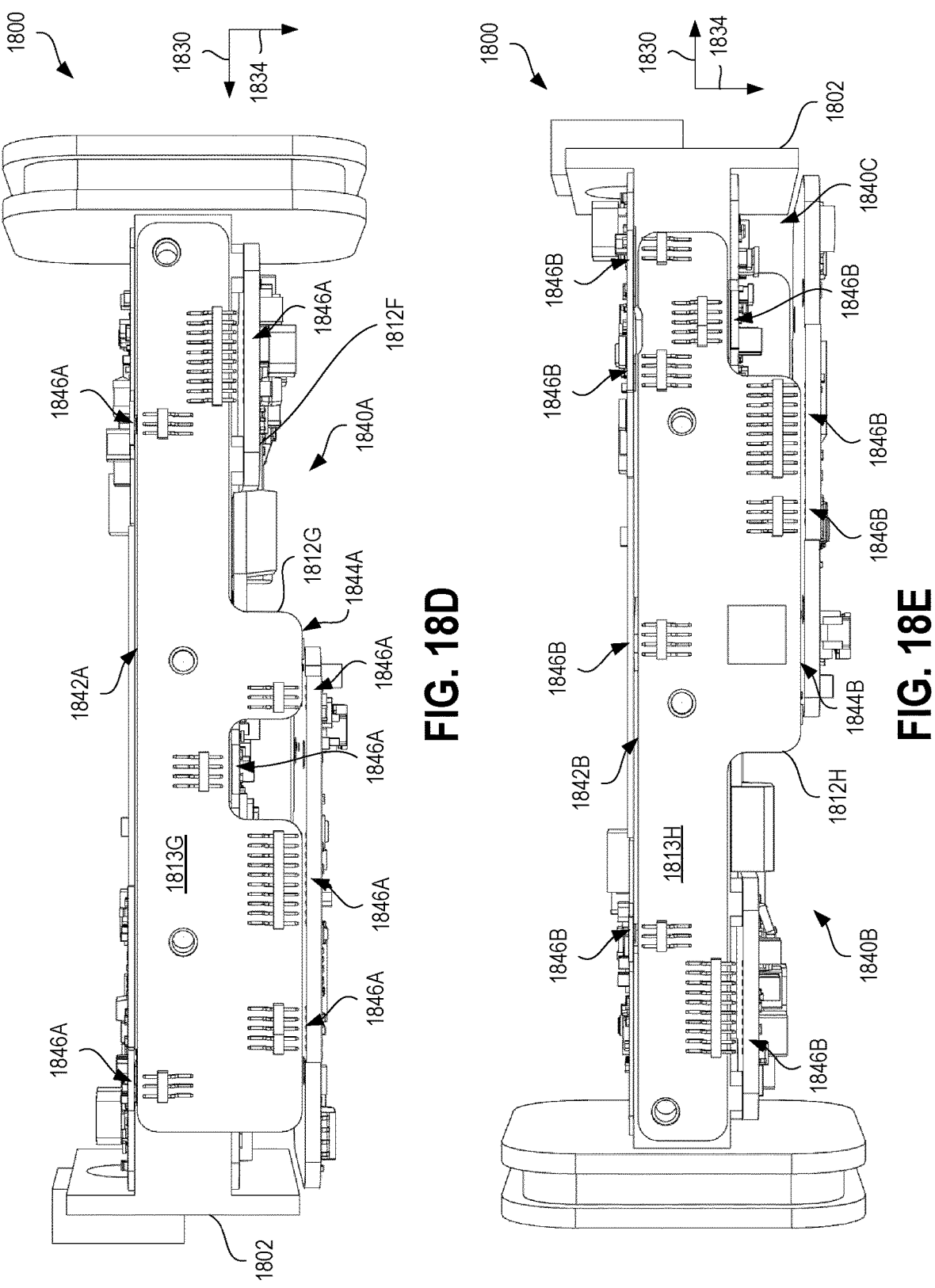
FIG. 18D is a right elevation view of the LNB system of FIG. 18A, in accordance with an embodiment.
FIG. 18E is a left elevation view of the LNB system of FIG. 18A, in accordance with an embodiment.

FIG. 18D is a right elevation view of the LNB system 1800 of FIG. 18A, in accordance with an embodiment.

FIG. 18E is a left elevation view of the LNB system 1800 of FIG. 18A, in accordance with an embodiment.

Figures 18F, 18G:
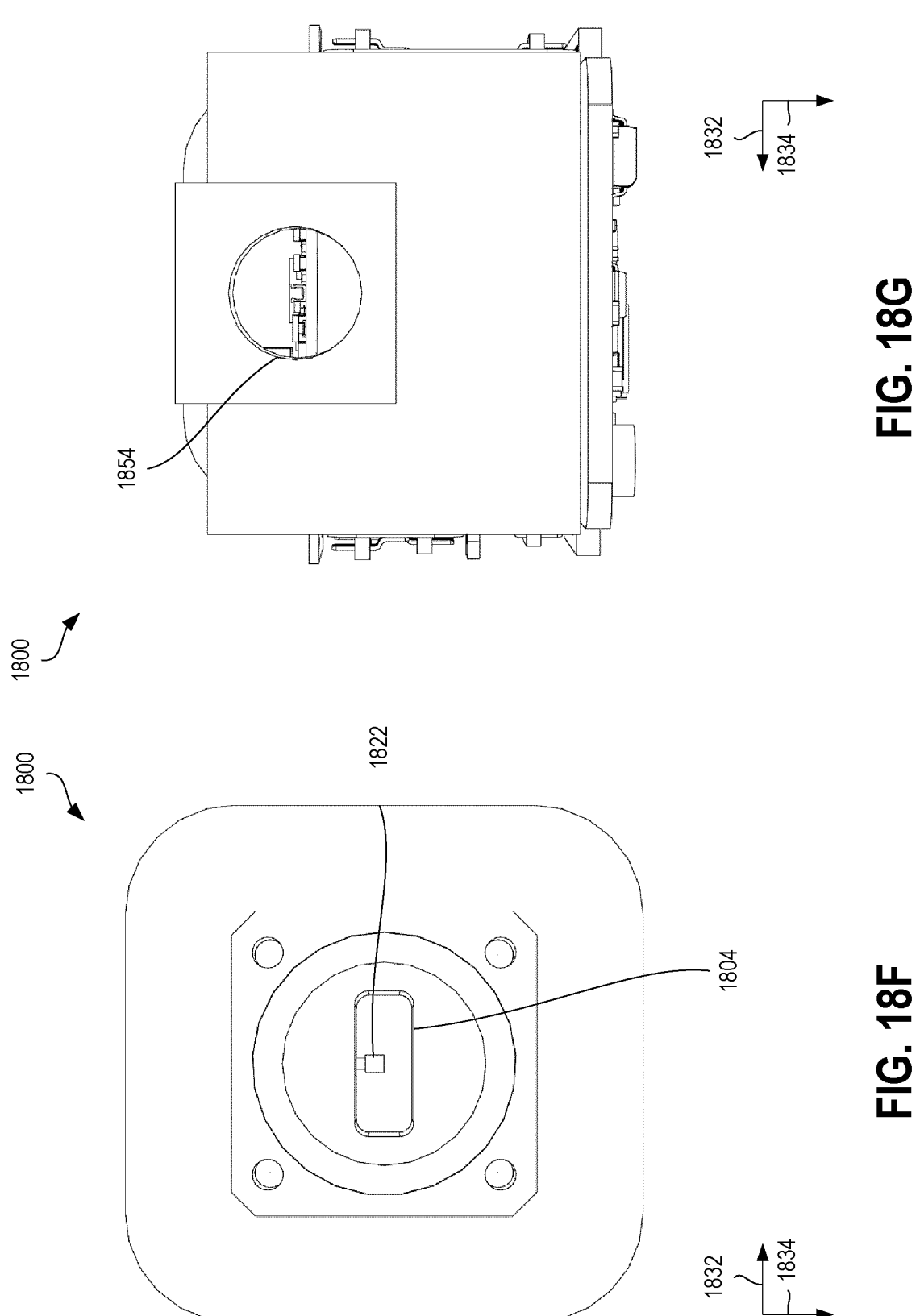
FIG. 18F is a front elevation view of the LNB system of FIG. 18A, in accordance with an embodiment.
FIG. 18G is a rear elevation view of the LNB system of FIG. 18A, in accordance with an embodiment.

FIG. 18F is a front elevation view of the LNB system 1800 of FIG. 18A, in accordance with an embodiment.

FIG. 18G is a rear elevation view of the LNB system 1800 of FIG. 18A, in accordance with an embodiment.

Figure 18H:
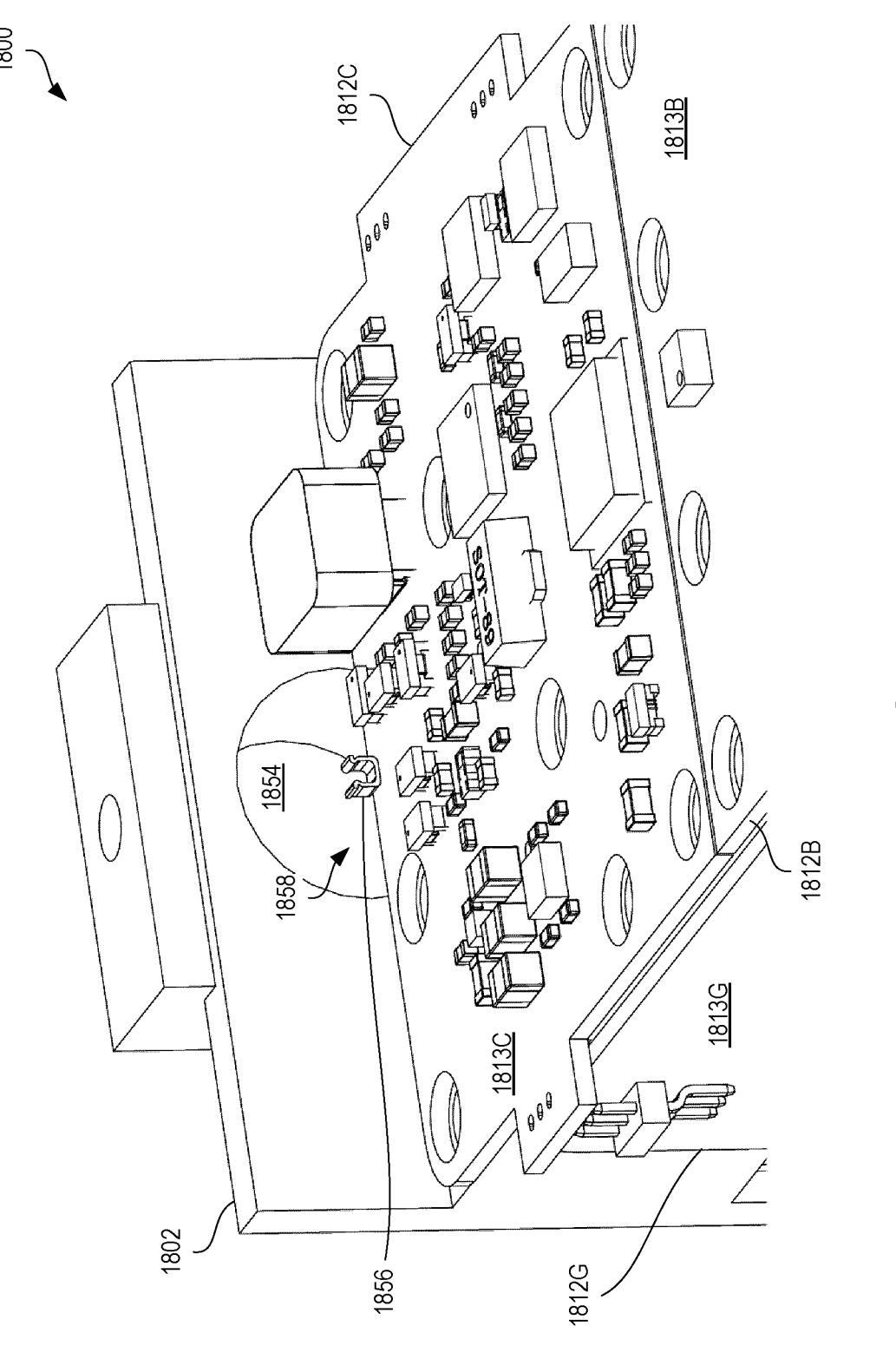
FIG. 18H is an enlarged perspective view of a rear portion of the LNB system of FIG. 18A, in accordance with an embodiment.

FIG. 18H is an enlarged perspective view of a rear portion of the LNB system 1800 of FIG. 18A, in accordance with an embodiment.

The views in FIGS. 18B-18H are partially exploded views, as the view in FIG. 18A.

Figure 19:
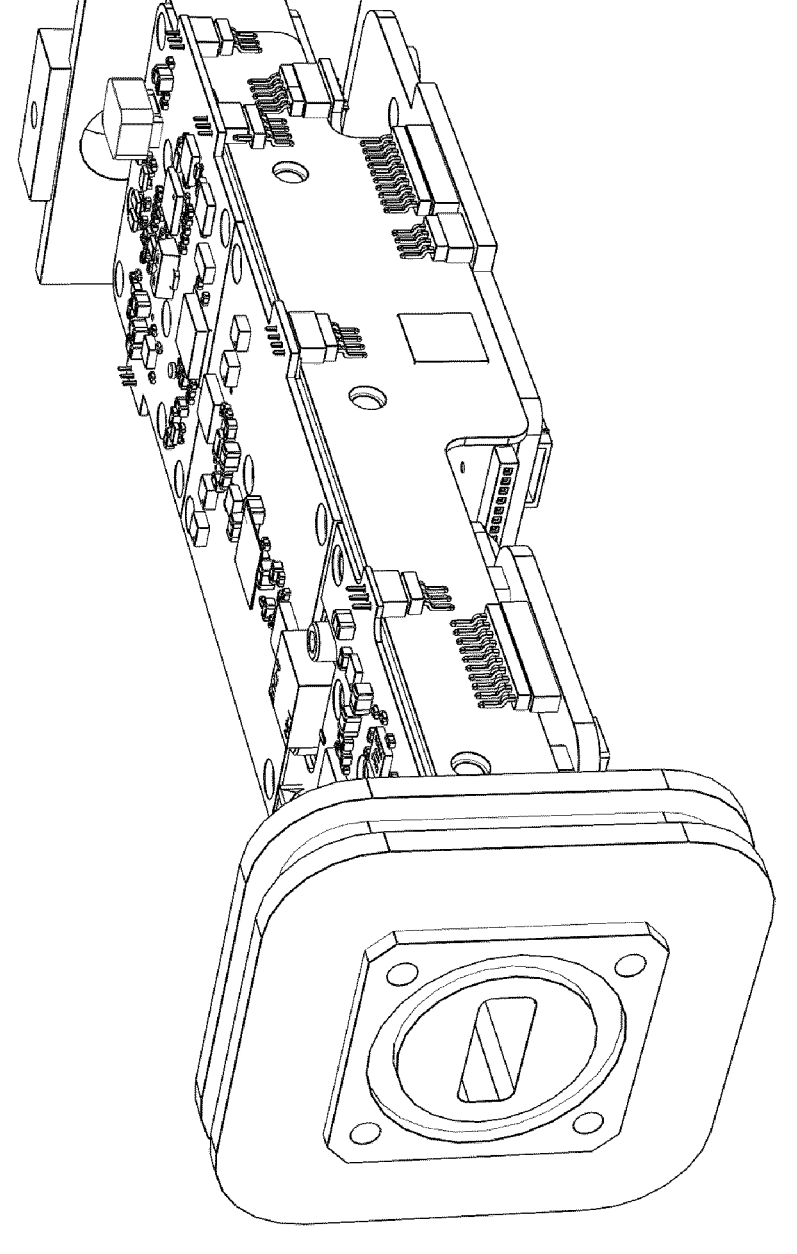
FIG. 19 is a perspective view of the LNB system of FIG. 18A with components connected, in accordance with an embodiment.

FIG. 19 is a perspective view of an LNB system 1800 with components connected, in accordance with an embodiment.

Where correspondence is possible, parts with references numerals in FIGS. 18A-18H may be mapped to corresponding parts with reference numerals in FIGS. 16-17 by matching the last two digits of the reference numerals.

The LNB system shown in FIGS. 18A-18H defines a chassis 1802 that has opposing front and rear sides 1806A, 1806B opposing top and bottom sides 1808A, 1808B, and opposing right and left sides 1810A, 1810B. The LNB system, and/or the chassis 1802, defines a longitudinal direction 1830, a lateral direction 1832, and a transverse direction 1834, which may be mutually perpendicular.

The LNB system defines a plurality of PCB assemblies 1812A, 1812B, 1812C, 1812D, 1812E, 1812F supported by a corresponding plurality of PCBs 1813A, 1813B, 1813C, 1813D, 1813E, 1813F.

In FIGS. 18A-18H, the PCB assembly 1812A defines a front-end module connected to the probe to receive and process an electrical signal generated by a probe 1822 in a waveguide port 1804 of the chassis 1802 to generate a processed signal, the PCB assembly 1812B defines a filter module, the PCB assembly 1812C defines a converter module, the PCB assembly 1812D defines a power supply fastened to the chassis 1802 for thermal communication with the chassis 1802, the PCB assembly 1812E is a controller, and the PCB assembly 1812F is a local oscillator module.

The PCBs 1813A, 1813B, 1813C extend along the top side 1808A of the chassis 1802, and the PCBs 1813D, 1813E, 1813F extend along the bottom side 1808B of the chassis 1802. The PCB 1813B is sandwiched between the PCB 1813A and the PCB 1813C, and is parallel to the PCBs 1813A, 1813C. The PCB 1813F is sandwiched between the PCB 1813E and the PCBs 1813B, 1813C, i.e. sandwiched in a transverse direction or disposed transversely in-between the PCB 1813E and the PCBs 1813B, 1813C.

The probe is operatively connected to at least one PCB 1813A of the plurality of PCB assemblies. As indicated by FIG. 18F, the probe 1822 extends rigidly away from the PCB 1813A through the chassis 1802 into the waveguide port 1804 via a probe opening formed in the chassis 1802. The PCB 1813A extends over this probe opening.

The PCBs 1813A, 1813B, 1813C, 1813D, 1813E, 1813F may be secured to the chassis 1802.

The PCBs 1813H, 1813G may be part of interfacing modules for interfacing the PCBs 1813A, 1813B, 1813C, 1813D, 1813E, 1813F to each other.

In various embodiments, a plurality of PCBs may be stacked on one or more of the bottom or top sides 1808A, 1808B and may be connected to each other via interfacing PCBs similar to the PCBs 1813H, 1813G. In various embodiments, one or more PCBs may be parallel to each other and arranged adjacent to each other. In various embodiments, one or more PCBs may be spaced apart in the longitudinal and/or the transverse direction. In some embodiments, one or more PCBs may be spaced apart in the lateral direction.

The PCBs 1813G, 1813H define openings 1840A, 1840B, 1840C in-between the PCBs on the top and bottom sides 1808A, 1808B. As shown in FIGS. 18D-18E, the openings 1840A, 1840B, 1840C are notches. The notch 1840A extend transversely from edge 1842A, or alternatively the edge 1844A. The notches 1840B, 1840C extend transversely from edge 1842B, or alternatively the edge 1844B.

Connectors 1846A, 1846B may be formed on the PCB 1813G, 1813H, respectively. The connectors 1846A, 1846B may extend transversely to receive and transversely connect to the PCBs. For example, the connectors 1846A, 1846B may be formed in the openings.

The power supply module, and the PCB assembly 1812. May be fastened to the chassis 1802 via connection portions 1852A, 1852B that may be thermally conductive to transfer heat to the chassis 1802, e.g. heat generated by linear voltage regulators 1853A, 1853B connected to the PCB 1813B of the power supply module via pins extending on to the PCB 1813B as shown in FIG. 18C, and act has heat sinks. In various embodiments, the connection portions 1852A, 1852B may be flanges that may be bolted to the chassis and may be integrally formed with the linear voltage regulators 1853A, 1853B (constructed as monolithic unit). In various embodiments, the linear voltage regulators 1853A, 1853B may be power dissipating elements, e.g. the power dissipating by the linear voltage regulators 1853A, 1853B may significantly higher than power dissipated elsewhere in the PCB assembly 1813D. In some embodiments, the linear voltage regulators 1853A, 1853B and the connection portions 1852A, 1852B may be defined by TO-220 packages in order to dissipate the heat form voltage regulator circuitry for cooling the linear voltage regulators 1853A, 1853B. The connection portions 1852A, 1852B may be heatsink portions connected to the linear voltage regulators 1853A, 1853B configured to cool the linear voltage regulators 1853A, 1853B by heating the chassis 1802. In FIGS. 18A-18H, two connection portions 1852A, 1852B and two linear voltage regulators 1853A, 1853B are shown. However, it is understood that any number of connection portions and voltage regulators may be provided.

A first connector 1856 defining a receptacle may be disposed or formed at an end of the chassis 1802. A connection portion 1858 of the chassis 1802 may define an output connector opening 1854 in the chassis 1802 suitable to receive a second connector, e.g. such as the connector in FIGS. 5A-5D, in the receptacle extending transversely from the PCB 1813C. The output connector opening 1854 opening may allow access to the receptacle by a pin of such a second connector extending rigidly through the output connector opening 1854 to the converter module. The connection portion 1858 may be configured to output the down-converted signal by establishing an external connection to the converter module (defined by the PCB assembly 1813C) via coupling of the second connector to the receptacle of the first connector 1856. The receptacle may extend between 0.07 and 0.09 inches and may dimensioned complementarily to the second connector. For example, the receptacle may be suitable to frictionally engage with the pin of the second connector.

The LNB system 1800 may be equipped with a system for mitigating underheating and overheating of the LNB.

The LNB system 1800 may include a temperature sensor 1860 positioned to generate an indicator of chassis temperature. The chassis temperature may refer to a temperature of the body of chassis 1802, waveguide port 1804, and/or components in thermal communication therewith. For example, a temperature of the linear voltage regulators 1853A, 1853B may be indicative of the chassis temperature. In some embodiments, the temperature sensor 1860 may be positioned close to, adjacent to, upon, or integrated with (e.g. as part of an integrated circuit) one or more of linear voltage regulators 1853A, 1853B or one or more of the connection portions 1852A, 1852B to facilitate timely and accurate measurement of temperature. For example, time lags may be prevented by such positioning.

The power supply is connected to the PCB assemblies 1812A, 1812B, 1812C, 1812D, 1812E, 1812F to generate a power supply output that powers these PCB assemblies to process the electrical signal. The power supply may be a two-stage power supply.

Figure 20:
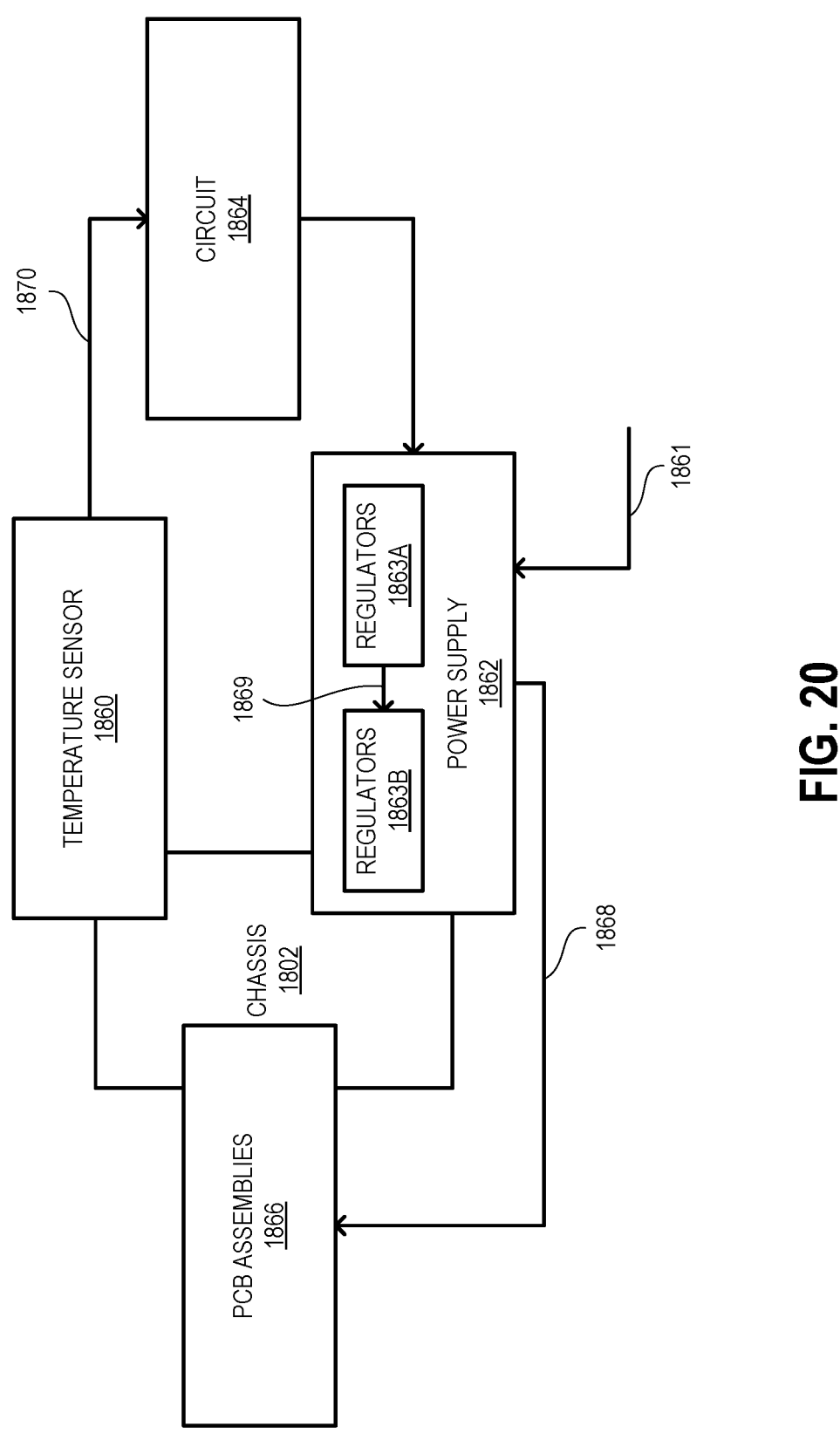
FIG. 20 is a schematic block diagram showing an implementation of an underheating and overheating mitigating system for the LNB system, in accordance with an embodiment.

FIG. 20 is a schematic block diagram showing an implementation of an underheating and overheating mitigating system for the LNB system, in accordance with an embodiment.

In FIG. 20, the power supply is referred to as power supply 1862 and may include a PCB assembly, such as the PCB assembly 1813D. The power supply may include a first set of regulators 1863A and a second set of regulators 1863B. As referred to here, a set of regulators may include a single regulator. For example, the power supply 1862 may include the linear voltage regulators 1853A, 1853B and the connection portions 1852A, 1852B. The power supply 1862 generates a power supply output 1868 that powers PCB assemblies 1866 using a power input 1861. The PCB assemblies 1866 may include the PCB assemblies 1812A, 1812B, 1812C, 1812E, 1812F, 1812G, 1812H. The power supply 1862 is fastened to the chassis 1802 for thermal communication with the chassis 1802, e.g. via the connection portions 1852A, 1852B. The first set of regulators 1863A receive a power input 1861 and generate an intermediate power level 1869. This intermediate power level 1869 is supplied to the second set of regulators 1864B as input thereto. An output of the power supply 1862 is generated using output from the second set of regulators 1864B.

The power supply 1862 is operable to variably dissipate heat to the chassis 1802 while independently regulating the power supply output 1868. As referred to herein, independently regulating the power supply output 1868 can include keep the power supply output 1868 constant, or only dependent on energy drawn by the PCB assemblies 1812A, 1812B, 1812C, 1812E, 1812F, 1812G, 1812H, while varying the power input 1861 to vary thermal energy dissipation via the power supply 1862.

In the embodiments of FIGS. 18A-H, 19, 29, the first set of regulators 1853A are defined by a switching regulator (or switching voltage regulator) and the second set of regulators 1853B are defined by two linear regulators (or linear voltage regulators). However, it is understood that in some embodiments, the first set of regulators 1853A may be a defined by one or more linear regulators and the second set of regulators 1853B may be defined by one or more switching regulators.

The LNB system 1800 may include a circuit 1864 (or circuitry) connected to the temperature sensor 1860 and the power supply 1862. The circuit 1864 is configured to control the power supply 1862 based on the indicator (indicator 1870) to vary thermal energy dissipated by the power supply 1862 to control the chassis temperature while (independently) regulating the power supply output. For example, the circuit 1864 may implement a PID controller or other type of feedback control system to vary the power supply output 1868 based on the indicator of chassis temperature generated by the sensor 1860.

The circuit 1864 may be configured to control the switching regulator 1863A so as to vary or control the intermediate power level 1869 (between the linear regulator 1863B and the switching regulator 1863A) based on the indicator to vary thermal energy dissipated by the linear regulators 1863B while independently regulating the power supply output 1868 to power the PCB assemblies 1866.

For example, in some embodiments, the LNB system 1800 may be heated by applying abnormal or elevated voltage drops on a voltage regulator of the power supply 1862 and a TO-220 package of the voltage regulator may be used as a heater. In many instances of operations of the LNB system 1800, the ambient temperature may be sufficient to avoid a thermal runaway situation and maintain safe operation of the voltage regulator.

For example, in some embodiments, the LNB system 1800 may be prevented from overheating by applying abnormally low voltage dropouts. This may increase a slight risk to componentry and/or may sacrifice the performance of LNB circuitry as regulation in low dropouts may not occur effectively. However, the heat dissipation also becomes lower than usual and thus the chassis temperature may go down, may stabilize, or may not increase when the ambient is above 60° C. For example, in some embodiments, such measures may extend the standard industrial operating range from (−40° C. to +60° C.) to (−60° C. to +70° C.).

The filter module defining the PCB assembly 1812B may comprise filter circuitry defining a plurality of filters. By varying power supplied via the linear voltage regulators 1853A, 1853B to control the chassis temperature, thermal energy dissipated by the power supply increases. Such thermal energy dissipation ensures that power provided to the filter circuitry remains well-regulated despite an increase in power, e.g. in the form of increased voltage, provided to the power supply. Similarly, circuitry in other parts of the LNB system 1800 may be regulated.

Figure 21:
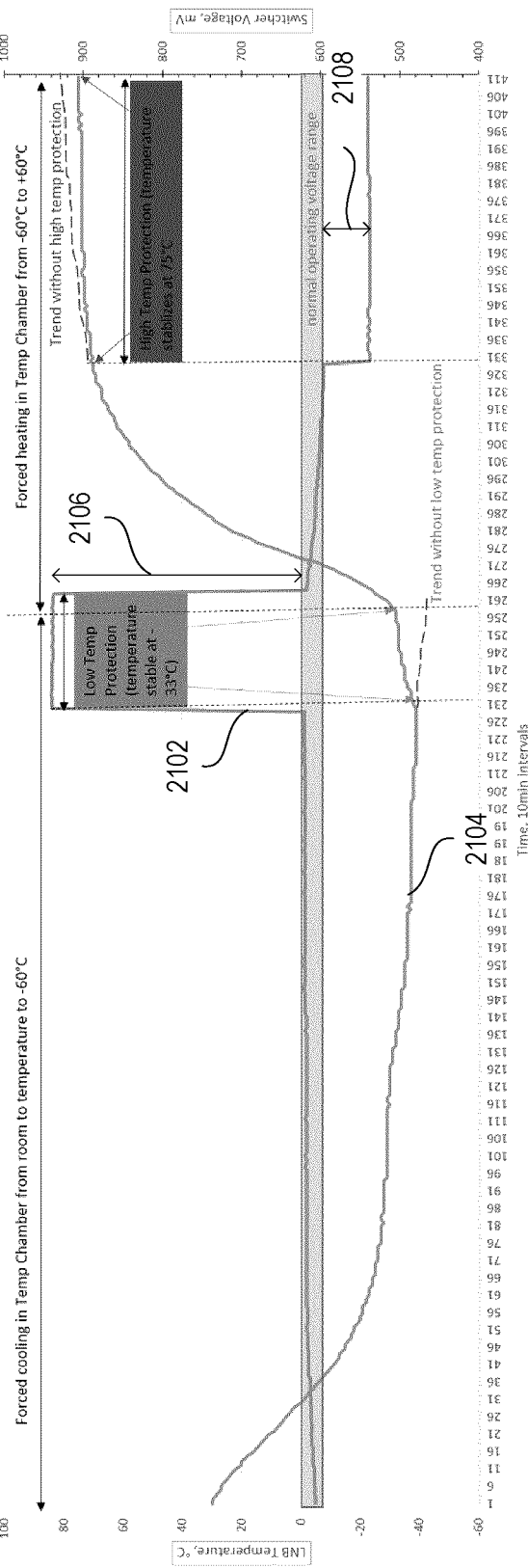
FIG. 21 is a schematic chart showing the controlled variation of a voltage associated with the power supply output, in accordance with an embodiment.

FIG. 21 is a schematic chart showing the controlled variation of a voltage 2102 associated with the intermediate power level 1869, also referred to as switcher voltage in response to a chassis temperature 2104 (or a measure of an indication thereof), also referred to as LNB temperature, in accordance with an embodiment.

The circuit 1864 may be configured to increase heating or decrease heating provided to the chassis 1802 based on one or more predetermined temperatures. For example, circuit 1864 may be configured to operate the power supply to dissipate heat via the linear voltage regulators based on such temperatures.

In some embodiments, the circuit 1864 may be configured to vary the voltage 2102 in proportion to deviation of the chassis temperature from the predetermined temperature so as to draw or urge the chassis temperature towards the predetermined temperature, or within a range at least defined by the predetermined temperature. For example, the predetermined temperature may be a nominal operating temperature (around which a range may be defined), a maximum allowable operating temperature, or a minimum allowable operating temperature. For example, the nominal operating temperature may be a mid-point (arithmetic or geometric midpoint) between a predetermined high temperature and a predetermined low temperature, e.g. as may be defined by a normal, acceptable, or maximal ranges of chassis temperature during operation.

In the embodiments in FIG. 21, the circuit 1864 is configured to facilitate operation of the LNB system 1800 between the predetermined high temperature and the predetermined low temperature by operating the power supply to overcome underheating or overheating. For example, in FIG. 21, the predetermined low temperature may be −40° C. and the predetermined high temperature may be +70° C. The power supply may be operable when the chassis temperature is between the predetermined low temperature and the predetermined high temperature to provide substantially linear power.

In various embodiments, the switching regulators of the power supply may allow the power supply 1862 to increase the voltage 2102 during, and in response to, a fall of the chassis temperature below the predetermined low temperature. The switching regulators of the power supply 1862 may be able to decrease the voltage 2102 during, and in response to, a rise of the chassis temperature above the predetermined high temperature.

In various embodiments, the controlled response of the voltage 2102 may be asymmetric relative to chassis temperature. For example, the circuit 1864 may be configured to increase the voltage 2102 by a first predetermined amount 2106 in response to a fall in the chassis temperature below the predetermined low temperature, and to decrease the voltage 2102 by a second predetermined amount 2108 in response to a rise of the chassis temperature above the predetermined high temperature, wherein the first predetermined amount is larger than the second predetermined amount. For example, the first predetermined amount 2106 may be 5 times larger than the second predetermined amount 2108. It is understood the first and second predetermined amounts may correspond to predetermined thermal dissipation levels (or rates thereof), intermediate power levels, and/or power supplied to the power supply.

It is understood that, in some embodiments, current may be varied instead of, or in addition to, varying of voltage.

Figure 22:
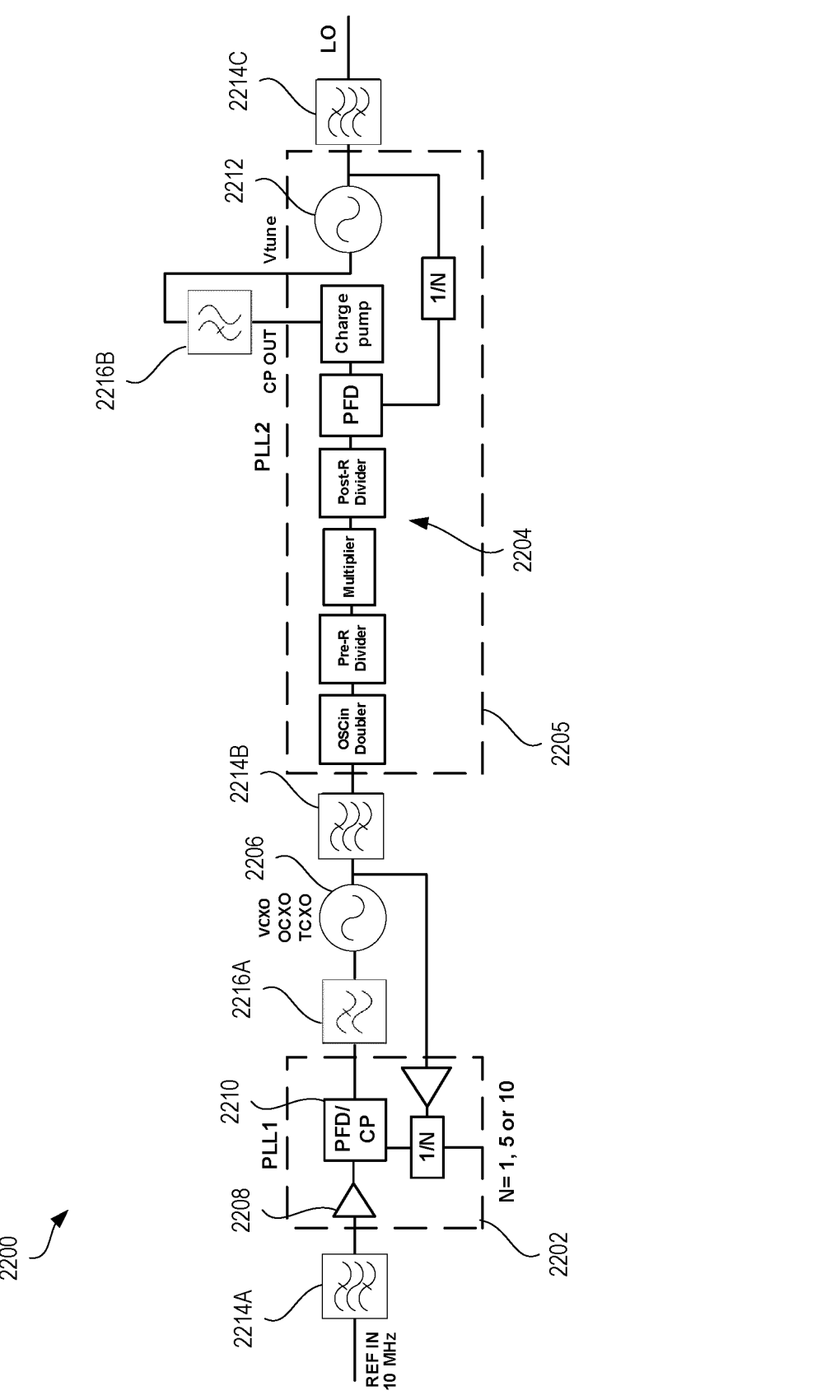
FIG. 22 is a schematic block diagram of a portion of a local oscillator module of an LNB system, in accordance with an embodiment.

FIG. 22 is a schematic block diagram of a portion of a local oscillator module 2200 of an LNB system, in accordance with an embodiment.

For example, the local oscillator module 2200 may be used for image rejection during downconversion in the converter module. For example, the output of the local oscillator module 2200 after filtering may pump the subharmonic image rejection mixer.

The local oscillator module 2200 may be defined by one or more PCB assemblies and may be configured to generate a high-frequency signal for downconversion.

The local oscillator module 2200 may be connected to the PCB assemblies 1812A, 1812B, 1812C (the front-end module, the filter module, the converter module), which may be referred to as low noise processing circuitry. The low noise processing circuitry may be configured to receive the electrical signal generated by the probe in response to a radio frequency signal and to amplify the electrical signal. The low noise processing circuitry may be further configured to process the electrical signal using the high-frequency signal provided by the local oscillator module 2200 to generate a downconverted signal suitable for output from the LNB system. The local oscillator module and the low noise processing circuitry may be disposed on opposing sides of the chassis 1802.

The local oscillator module may include two cascaded phase locked loop circuits. This may be advantageous for increasing signal dynamic range of the overall system, as well as increasing the output frequency range.

The local oscillator module 2200 includes first phase locked loop circuitry (first PLL circuitry 2202) configured to receive a low-frequency reference signal. The first PLL circuitry 2202 may be connected in feedback to an intermediate-frequency oscillator 2206. The first PLL circuitry 2202 controls the intermediate-frequency oscillator 2206 to generate an intermediate-frequency signal based on the low-frequency reference signal, i.e. the first PLL circuitry "phase-locks" the low-frequency reference signal to the intermediate-frequency signal.

The first PLL circuitry may be encapsulated in an integrated circuit. In various embodiments, the intermediate-frequency oscillator 2206 may be externally connected to this integrated circuit. In some embodiments, the integrated circuit may define a low phase noise amplifier 2208 suitable for enhancing signal dynamic range of the first PLL circuitry 2202. The low phase noise amplifier 2208 may be configured to process the low-frequency reference signal to generate an amplified signal for a phase detector 2210 of the first PLL circuitry. In some embodiments, additional low noise amplifiers may be provided to improve the signal dynamic range.

In various embodiments, the low-frequency is suitable for oscillating at at least one low frequency below 10 MHz, and the intermediate-frequency oscillator is suitable for oscillating at at least one intermediate frequency between 10 MHz and 100 MHz In various embodiments, the intermediate-frequency oscillator 2206 is a crystal oscillator. The oscillator may be disposed in a cavity to provide shielding. In various embodiments, the intermediate-frequency oscillator may be an oven-controlled crystal oscillator or a temperature-controlled crystal oscillator.

The local oscillator module 200 includes second phase locked loop circuitry (second PLL circuitry 2204) configured to receive the intermediate-frequency signal from the first PLL circuitry 2202.

The second PLL circuitry 2204 may be connected in feedback to a high-frequency oscillator 2212. The second PLL circuitry 2204 controls the high-frequency oscillator 2212 to generate the high-frequency signal based on the intermediate-frequency reference signal.

The second PLL circuitry 2204 may be defined by an integrated circuit. The integrated circuit define, in combination, the second PLL circuitry 2204 and the high-frequency oscillator 2212, e.g. as defined by circuitry 2205 in FIG. 22.

It is noted that the high-frequency oscillator 2212 is separate from the intermediate-frequency oscillator 2206.

The signal dynamic range of the first PLL circuitry 2202 may be higher than the signal dynamic range of the second PLL circuitry 2204. As such, an overall signal dynamic range may be increased. Since the first PLL circuitry 2202 operates at a lower operating midpoint frequency than the second PLL circuitry 2204, achieving a high signal dynamic range for this part of the circuit may be easier and less costly. As such, a desired overall signal dynamic range may be achieved more easily and more cost-effectively than would be by deploying a single phase lock loop with a comparable output frequency range (and a higher operating midpoint frequency).

A circuit connected to the temperature sensor and the power supply, the circuit being configured to control the power supply to vary power supplied to the local oscillator module based on the indicator to vary thermal energy dissipated by the first PLL circuitry and the second PLL circuitry to control the chassis temperature and to provide heating around the crystal oscillator.

The first PLL circuitry 2202 may be externally connected to a low-pass filter 2216A, which may be externally connected to the intermediate-frequency oscillator 2206. Similarly, a low-pass filter 2216B may be used to externally connect the second PLL circuitry 2204 to the high-frequency oscillator 2212. Band-pass filters 2214A, 2214B, 2214B may be used to filter frequencies, as shown in FIG. 22.

As shown in FIG. 22, additional components such as phase-frequency detectors (PFDs), charge pumps (CPs), multipliers, frequency dividers (1/N, pre-divider, post-divider), oscillators (OSC), and/or doublers may be provided.

The arrangement of multiple cascaded PLLs, where one PLL provides a reference signal for a following (serially successive) PLL, shown in FIG. 22 is found to be particularly advantageous for KA LNB applications.

In some embodiments, complexity at the PCB level may be avoided and a compact solution may be implemented by using a PLL for the first stage (the PLL circuitry 2202) that does not require clock (CLK or SCL), data (SI or DATA) and latch enable (LE, SEN, or SS) serial ports or lines for programming. It is found that frequency division (1/N) may be achieved efficiently, for ratios of 1, 5 and 10, via external hardware pins, with a requirement for serial ports. In some embodiments, voltage-controlled crystal oscillators (e.g. a 100 MHz crystal oscillator) are found to be preferable for the intermediate-frequency oscillator due to size and power consumption advantages relative to oven-controlled crystal oscillator. However, the latter types of oscillators may provide improved performance in certain circumstances. For example, the XO5085-044R from MtronPTI® is found to provide improved overall phase noise performance of the architecture especially at low frequency offset.

In some embodiments, such an architecture is found to improve intermediate frequency phase noise at high frequency offset (1 kHz, 10 KHz and 100 kHz), improve the dynamic range, improve overall spurious performance due to reference clean up properties of the architecture, decrease the sensitivity of the architecture to reference phase noise issues by attenuating the incoming jitter and providing a clean reference to the second PLL circuitry 2204, flexibility by allowing a choice of architecture between 10, 50, 100 reference frequency for the second PLL circuitry 2204 and allowing use of higher PFD (by using a doubler or a multiplier, as shown in FIG. 22) based on the application, and relaxation of phase noise and spurious requirements.

The effect of the architecture is to change the reference level for the PLL circuitry 2204. In an example, the LNB Gain is set to be about 60 dB and the impact of the 10 MHz reference level on intermediate-frequency output phase noise is measured at the following conditions: RF Frequency is 17.75 GHz (@−60 dBm, LO Frequency: 16.75 GHZ, IF Frequency: 1 GHz, REF: 10 MHZ, PFD of the second PLL: 50 MHz It is found that the main impact of the reference level change is in the 10 Hz to 100 Hz region, which is inside the loop bandwidth of the first PLL and still well below the 164C phase noise mask requirement. It is found that the impact of the level change on the phase noise at 1 kHz offset and above is insignificant.

FIG. 23 is a flowchart of a method of manufacturing a low noise block-downconverter system (LNB system), in accordance with an embodiment.

Step 2302 of the method includes disposing a first printed circuit board (first PCB) along a first side of a chassis of the LNB system.

Step 2304 of the method includes disposing a second printed circuit board (second PCB) along a second side of the chassis opposite to the first side, relative to the chassis.

Step 2306 of the method includes connecting the first PCB to the second PCB using a transverse printed circuit board (transverse PCB) disposed across the chassis transverse to the first and second PCBs.

In some embodiments of the method 2300, the first PCB, second PCB, and transverse PCB form part of a plurality of printed circuit board assemblies (plurality of PCB assemblies) surrounding a waveguide port formed at an end of the chassis Some embodiments of the method 2300 further comprise admitting a probe operatively connected to the plurality of PCB assemblies into the waveguide port via a probe opening that is formed in the chassis and that extends underneath the first PCB.

Some embodiments of the method 2300 further comprise disposing a third printed circuit board (third PCB) along the second side before disposing the second PCB along the second side.

Some embodiments of the method 2300 further comprise connecting the first PCB to the third PCB via a connector of the transverse PCB by receiving a connector portion of the third PCB into an opening, associated with the connector and in-between the first and second PCBs, of the transverse PCB.

In some embodiments of the method 2300, disposing the second PCB along the second side causes the third PCB to be disposed transversely in-between the first and second PCBs.

In some embodiments of the method 2300, the first PCB supports a front-end module for receiving an electrical signal generated by a probe disposed in a waveguide port in response to a radio frequency signal in the waveguide port to generate a first processed signal, Some embodiments of the method 2300 further comprise disposing a third printed circuit board (third PCB), supporting a converter module, along the first side of the chassis, the converter module being configured to generate a downconverted signal based on a second processed signal and a reference signal.

Some embodiments of the method 2300 further comprise connecting the front-end module to the converter module by sandwiching a fourth printed circuit board (fourth PCB), supporting a filter module, along the first side of the chassis between the first PCB and the third PCB, the filter module configured to filter the first processed signal to generate the second processed signal.

In some embodiments of the method 2300, the first PCB, the second PCB, the third PCB, and the fourth PCB form part of a plurality of printed circuit assemblies (plurality of PCB assemblies) surrounding the waveguide port, and the second PCB supports a power supply for supplying power to the plurality of PCB assemblies.

Some embodiments of the method 2300 further comprise connecting a fifth printed circuit board (fifth PCB), supporting a local oscillator module, to the transverse PCB by disposing the fifth PCB along the second side of the chassis, an electronic oscillator being mounted on the fifth PCB and controllable, by a controller connecting the electronic oscillator to the power supply, to generate the reference signal.

FIG. 24 is a flowchart of a method 2400 of operating an LNB system, in accordance with an embodiment.

Step 2402 of the method 2400 includes generating an electrical signal by a probe disposed in a waveguide port formed in a chassis of the LNB system in response to a radio frequency signal in the waveguide port.

Step 2404 of the method 2400 includes receiving the electrical signal into a first printed circuit board (first PCB) extending along a first side of the chassis to generate a first processed signal.

Step 2406 of the method 2400 includes supplying power to a second printed circuit board (second PCB) extending along a second side of the chassis opposite to the first side, relative to the chassis.

Step 2408 of the method 2400 includes receiving the first processed signal into a third printed circuit board (third PCB) extending along the first side of the chassis adjacent to the first PCB to filter the first processed signal to generate a second processed signal.

Step 2410 of the method 2400 includes receiving the second processed signal into a fourth printed circuit board (fourth PCB) extending along the first side of the chassis adjacent to the third PCB to generate a downconverted signal based on the second processed signal and a reference signal.

Step 2412 of the method 2400 includes supplying power to the first, third, and fourth PCBs from the second PCB via a transverse printed circuit board (transverse PCB) being disposed across the chassis transverse to the first, third, and fourth PCBs and connecting the second PCB to the first, third, and fourth PCBs, the first, second, third, and fourth PCBs part forming a plurality of printed circuit board assemblies (plurality of PCB assemblies) surrounding the chassis and the waveguide port.

Some embodiments of the method 2400 include generating the reference signal using a local oscillator module supported by a fifth printed circuit board (fifth PCB) of the plurality of PCB assemblies, the fifth PCB extending along the second side of the chassis and being connected to the transverse PCB, an electronic oscillator being mounted on the fifth PCB and controllable, by a controller connecting the electronic oscillator to the second PCB, to generate the reference signal.

Some embodiments of the method 2400 include receiving the downconverted signal into a connector rigidly extending through a connector opening in the chassis to the fourth PCB to output the downconverted signal from the LNB system.

FIG. 25 is a flowchart of a method 2500 of operating an LNB system, in accordance with an embodiment.

Step 2502 of the method 2500 includes receiving a low-frequency reference signal in first phase locked loop circuitry (first PLL circuitry) defining a first signal dynamic range and being connected in feedback to an intermediate-frequency oscillator.

Step 2504 of the method 2500 includes controlling the intermediate-frequency oscillator, using the first PLL circuitry, based on the low-frequency reference signal to generate an intermediate-frequency signal.

Step 2506 of the method 2500 includes receiving the intermediate-frequency signal in second phase locked loop circuitry (second PLL circuitry) defining a second signal dynamic range smaller than the first signal dynamic range and being connected in feedback to a high-frequency oscillator.

Step 2508 of the method 2500 includes controlling the high-frequency oscillator, using the second PLL circuitry, based on the intermediate-frequency signal to generate a high-frequency signal.

Step 2510 of the method 2500 includes generating an electrical signal in response to a radio frequency signal.

Step 2512 of the method 2500 includes processing the electrical signal using the high-frequency signal to generate a downconverted signal suitable for output from the LNB system.

Some embodiments of the method 2500 include amplifying the low-frequency reference signal using a low phase noise amplifier of the first PLL circuitry to generate an amplified signal for a phase detector of the first PLL circuitry.

In some embodiments of the method 2500, the first PLL circuitry is a first integrated circuit externally connected to the intermediate-frequency oscillator, and a second integrated circuit defines, in combination, the second PLL circuitry and the high-frequency oscillator.

In some embodiments of the method 2500, the intermediate-frequency oscillator is an oven-controlled crystal oscillator or a temperature-controlled crystal oscillator.

FIG. 26 is a flowchart of a method 2600 of operating an LNB system, in accordance with an embodiment. The LNB system defines a chassis.

Step 2602 of the method 2600 includes generating an indicator of a chassis temperature.

Step 2604 of the method 2600 includes varying thermal energy dissipated by a power supply in thermal communication with the chassis based on the indicator to control the chassis temperature, while independently regulating a power supply output generated by the power supply.

Step 2606 of the method 2600 includes using the power supply output to power a plurality of printed circuit board assemblies (plurality of PCB assemblies) in thermal communication with the chassis.

In some embodiments of the method 2600, varying thermal energy dissipated by the power supply based on the indicator includes varying thermal energy dissipated by a linear voltage regulator of the power supply in response to deviation of the chassis temperature from a predetermined temperature so as to urge the chassis temperature towards the predetermined temperature.

In some embodiments of the method 2600, varying thermal energy dissipated by the power supply based on the indicator includes increasing an intermediate power level generated by a switching regulator of the power supply in response to a fall of the chassis temperature below a predetermined low temperature.

Some embodiments of the method 2600 include generating the power supply output using a linear voltage regulator of the power supply, the linear voltage regulator being in thermal communication with the chassis and connected to the switching regulator to receive the intermediate power level from the switching regulator.

In some embodiments of the method 2600, varying thermal energy dissipated by the power supply based on the indicator includes decreasing an intermediate power level generated by a switching regulator of the power supply in response to a rise of the chassis temperature above a predetermined high temperature.

Some embodiments of the method 2600 include generating the power supply output using a linear voltage regulator of the power supply, the linear voltage regulator being in thermal communication with the chassis and connected to the switching regulator to receive the intermediate power level from the switching regulator.

Some embodiments of the method 2600 include heating filter circuitry, defining a plurality of filters for processing a signal indicative of the electrical signal, by heating the chassis using the power supply.

Some embodiments of the method 2600 include heating a PCB supporting a local oscillator module by heating the chassis using the power supply, the PCB and the filter circuitry being disposed on opposing sides of the chassis.

Some embodiments of the method 2600 include causing increase of a rate of thermal energy dissipation by a first predetermined amount in response to a fall in the chassis temperature below a predetermined low temperature.

Some embodiments of the method 2600 include causing decrease of a rate of thermal energy dissipation by a second predetermined amount in response to a rise of the chassis temperature above a predetermined high temperature, the first predetermined amount being larger than the second predetermined amount.

Figure 27B:
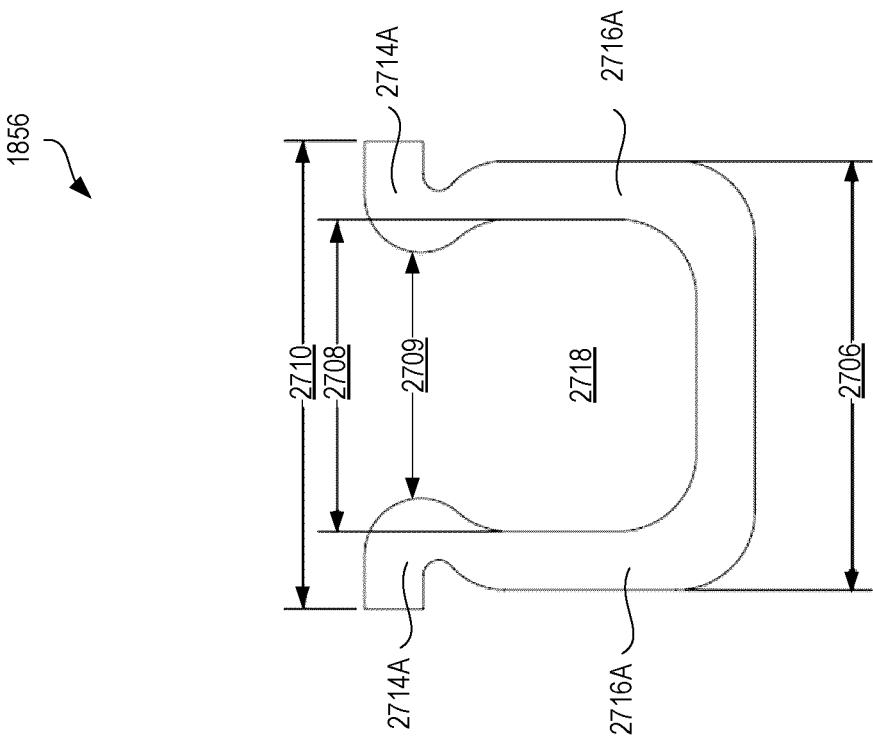
FIG. 27B is a front elevation view of the connector shown in FIG. 18H, in accordance with an embodiment.
Figure 27A:
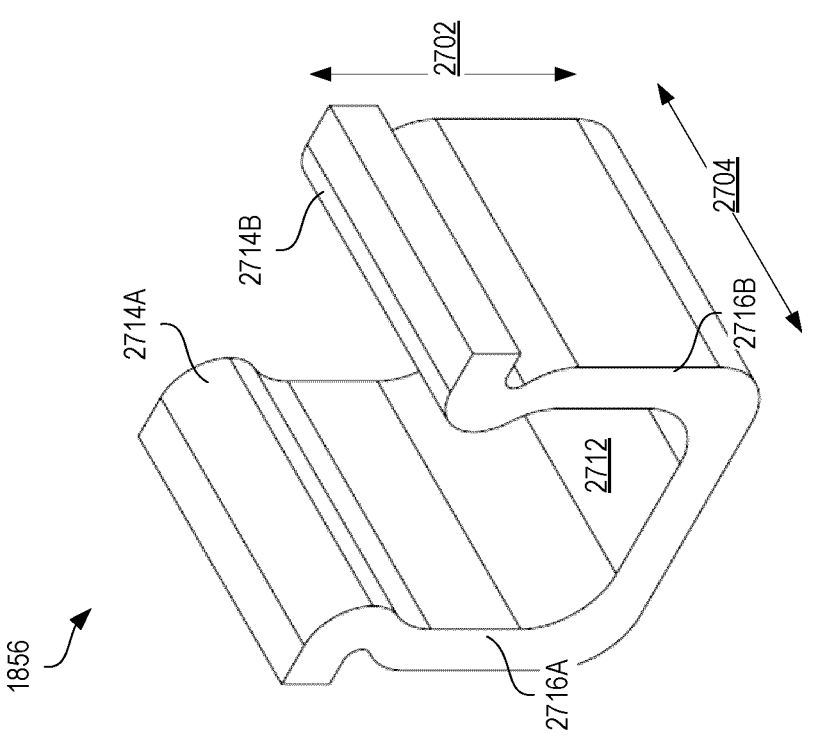
FIG. 27A is a perspective view of the connector shown in FIG. 18H, in accordance with an embodiment.

FIG. 27A is a perspective view of the connector 1856 shown in FIG. 18H, in accordance with an embodiment.

FIG. 27B is a front elevation view of the connector 1856 shown in FIG. 18H, in accordance with an embodiment.

The connector 1856 defines a base 2712 that is suitable for attaching to a printed circuit board (PCB) for connecting to a trace thereof. In various embodiments, the base 2712 may be composed of an electrically conductive material, may have a fastening portion, and/or may be complementary to a diameter or other dimension of a pin connector.

The connector 1856 may further define sidewalls 2716A, 2716B spaced apart from each other extending at least partially laterally or transversely away from the base 2712 to define a receptacle 2718 (or socket) therebetween for receiving a pin connector, e.g. the pin 502 of the connector 500 shown in FIGS. 5A-5E. The sidewalls 2716A, 2716B may be composed of an electrically conductive material. The receptacle 2718 may be open-ended.

The connector 1856 may further define detents 2714A, 2714B made of resilient material and that are disposed or formed at an end of the sidewalls 2716A, 2716B distal from the base 2712. The detents 2714A, 2714B narrow an opening to the receptacle 2718 so as to retain a pin connector in the receptacle 2718. For example, the detents 2714A, 2714B may form a neck of the receptacle 2718. In various embodiments, once received in the receptacle 2718, such a pin connector may extend between the sidewalls 2716A, 2716B greater the distance of an internal inter-sidewall spacing 2708 so as force open the neck by deformably deflecting the detents 2714A, 2714B away from each other to promote frictional engagement between the connector 1856 and a pin connector, e.g. by increasing normal contact force, and/or mitigating gaps or clearances forming between the pin connector and electrically conductive portions of the connector 1856. In various embodiments, the internal inter-sidewall spacing 2708 may be about 0.80 mm (or about 0.03 inches), and an external inter-detent spacing 2710 may be about 1.20 mm (or about 0.05 inches). For example, the internal inter-sidewall spacing 2708 may be between 80-90% of a diameter of a pin connector.

A minimum internal inter-detent spacing 2709 (or neck width) may be about 0.63 mm (or about 0.025 inches), about 78% of the inter-sidewall spacing 2708, or between 75-80% of the inter-sidewall spacing 2708. In various embodiments, a height 2702 of the connector 1856 may be about 1 mm (or about 0.04 inches), and a length 2704 of the connector 1856 may be about 0.9 mm (or about 0.035 mm). The receptacle 2718 may be then approximately 0.9 mm long in a first direction, approximately less than 1 mm long in a second direction perpendicular to the first direction, and approximately 0.80 mm in a third direction perpendicular to a first direction. It is found by testing and experimentation that such dimensions are particularly advantageous to improve phase noise performance when coupled to a complementary connector, such as the connector 500.

In various embodiments, the base 2712, sidewalls 2716A, 2716B, and the detents 2714A, 2714B may in unitary construction and form a common body extending between the detent 2714A to 2714B substantially as shown. The common body may be substantially U-shaped between such endpoints in a cross-section parallel to the plane shown in FIG. 27B. In some embodiments, such a common body may be made of a metal, e.g. it may be made of a sheet metal that is deformed into shape. In some embodiments, the connector 1856 may be open-ended at an extremity of the connector 1856 that is spaced apart laterally from the base 2712 and adjacent to the detents 2714A, 2714B. Allowing the connector 1856 to be open-ended in such a manner may improve manufacturability. For example, the receptacle 2718 is expected to lead to superior phase noise performance compared to a similarly sized closed-ended receptacle.

In various embodiments, the connector 500 in FIGS. 5A-5E and the connector 1856 may define a pair of mating connectors for a satellite communication system.

It is understood that detents may take other forms and may be removable in some cases.

The embodiments described in this document provide non-limiting examples of possible implementations of the present technology. Upon review of the present disclosure, a person of ordinary skill in the art will recognize that changes may be made to the embodiments described herein without departing from the scope of the present technology. For example, various filter types may be used, and a variety of PCB substrates may be used. Yet further modifications could be implemented by a person of ordinary skill in the art in view of the present disclosure, which modifications would be within the scope of the present technology.

What is claimed is:

1. A low noise block-downconverter system (LNB system), comprising:
   a local oscillator module configured to generate a high-frequency signal for downconversion, and including
   first phase locked loop circuitry (first PLL circuitry) configured to receive a low-frequency reference signal and connected in feedback to an intermediate-frequency oscillator so as to control the intermediate-frequency oscillator to generate an intermediate-frequency signal based on the low-frequency reference signal,
   second phase locked loop circuitry (second PLL circuitry) configured to receive the intermediate-frequency signal and connected in feedback to a high-frequency oscillator, separate from the intermediate-frequency oscillator, so as to control the high-frequency oscillator to generate the high-frequency signal based on the intermediate-frequency signal, a signal dynamic range of the first PLL circuitry being higher than the signal dynamic range of the second PLL circuitry; and
   low noise processing circuitry configured to receive an electrical signal generated by a probe in response to a radio frequency signal, the low noise processing circuitry configured to process the electrical signal using the high-frequency signal to generate a downconverted signal suitable for output from the LNB system.

2. The LNB system of claim 1, wherein the first PLL circuitry is an integrated circuit defining at least one low noise amplifier suitable for enhancing signal dynamic range of the first PLL circuitry.

3. The LNB system of claim 2, wherein the at least one low noise amplifier includes a low phase noise amplifier configured to process the low-frequency reference signal to generate an amplified signal for a phase detector of the first PLL circuitry.

4. The LNB system of claim 1, wherein an integrated circuit defines, in combination, the second PLL circuitry and the high-frequency oscillator.

5. The LNB system of claim 4, wherein the integrated circuit is a second integrated circuit, and the first PLL circuitry is a first integrated circuit defining at least one low phase noise amplifier suitable for enhancing signal dynamic range of the first PLL circuitry, the intermediate-frequency oscillator being externally connected to the first integrated circuit.

6. The LNB system of claim 4, wherein the intermediate-frequency oscillator is a crystal oscillator.

7. The LNB system of claim 6, wherein the intermediate-frequency oscillator is an oven-controlled crystal oscillator or a temperature-controlled crystal oscillator.

8. The LNB system of claim 6, further comprising:

a chassis for mounting the local oscillator module and the low noise processing circuitry in the LNB system;

a temperature sensor positioned to generate an indicator of chassis temperature;

a power supply connected to the local oscillator module and the low noise processing circuitry to power the local oscillator module to generate the high-frequency signal and to power the low noise processing circuitry to generate the downconverted signal; and a circuit connected to the temperature sensor and the power supply, the circuit being configured to control the power supply to vary power supplied to the local oscillator module based on the indicator to vary thermal energy dissipated by the first PLL circuitry and the second PLL circuitry to control the chassis temperature and to provide heating around the crystal oscillator.

9. The LNB system of claim 1, wherein the intermediate-frequency oscillator is suitable for oscillating at at least one intermediate frequency between 10 MHz and 100 MHz and the low-frequency reference signal is suitable for oscillating at at least one low frequency below 10 MHz.

10. The LNB system of claim 1, wherein the first PLL circuitry is an integrated circuit externally connected to a low-pass filter, the low-pass filter connected to the intermediate-frequency oscillator.

11. The LNB system of claim 1, wherein an integrated circuit defines, in combination, the second PLL circuitry and the high-frequency oscillator, the integrated circuit externally connected to a low-pass filter.

12. The LNB system of claim 1, further comprising:

a chassis for mounting the local oscillator module and the low noise processing circuitry in the LNB system, the local oscillator module and the low noise processing circuitry disposed on opposing sides of the chassis; and a transverse printed circuit board (transverse PCB) extending across the chassis between the opposing sides to connect the local oscillator module to the low noise processing circuitry.

13. A method of operating a low noise block-downconverter system (LNB system), comprising:

receiving a low-frequency reference signal in first phase locked loop circuitry (first PLL circuitry) defining a first signal dynamic range and being connected in feedback to an intermediate-frequency oscillator;

controlling the intermediate-frequency oscillator, using the first PLL circuitry, based on the low-frequency reference signal to generate an intermediate-frequency signal;

receiving the intermediate-frequency signal in second phase locked loop circuitry (second PLL circuitry) defining a second signal dynamic range smaller than the first signal dynamic range and being connected in feedback to a high-frequency oscillator;

controlling the high-frequency oscillator, using the second PLL circuitry, based on the intermediate-frequency signal to generate a high-frequency signal;

generating an electrical signal in response to a radio frequency signal; and processing the electrical signal using the high-frequency signal to generate a downconverted signal suitable for output from the LNB system.

14. The method of claim 13, further comprising:

amplifying the low-frequency reference signal using a low phase noise amplifier of the first PLL circuitry to generate an amplified signal for a phase detector of the first PLL circuitry.

15. The method of claim 13, wherein the first PLL circuitry is a first integrated circuit externally connected to the intermediate-frequency oscillator, and a second integrated circuit defines, in combination, the second PLL circuitry and the high-frequency oscillator.

16. The method of claim 15, wherein the intermediate-frequency oscillator is an oven-controlled crystal oscillator or a temperature-controlled crystal oscillator.

17. A printed circuit board assembly (PCB assembly) defining a local oscillator module for a low noise block-downconverter system (LNB system), comprising:

first phase locked loop circuitry (first PLL circuitry) configured to receive a low-frequency reference signal and connected in feedback to an intermediate-frequency oscillator so as to control the intermediate-frequency oscillator to generate an intermediate-frequency signal based on the low-frequency reference signal; and second phase locked loop circuitry (second PLL circuitry) configured to receive the intermediate-frequency signal and connected in feedback to a high-frequency oscillator, separate from the intermediate-frequency oscillator, so as to control the high-frequency oscillator to generate a high-frequency signal based on the intermediate-frequency signal, a signal dynamic range of the first PLL circuitry being higher than the signal dynamic range of the second PLL circuitry, the high-frequency signal being suitable for use in low noise processing circuitry of the LNB system to downconvert an electrical signal indicative of a radio frequency signal to generate a downconverted signal.

18. The PCB assembly of claim 17, wherein the first PLL circuitry is a first integrated circuit defining at least one low phase noise amplifier suitable for enhancing signal dynamic range of the first PLL circuitry, and a second integrated circuit defines, in combination, the second PLL circuitry and the high-frequency oscillator.

19. The PCB assembly of claim 18, wherein the intermediate-frequency oscillator is an oven-controlled crystal oscillator or a temperature-controlled crystal oscillator.

* * * * *